(12) United States Patent
Eichenholz et al.

(10) Patent No.: US 11,367,990 B2
(45) Date of Patent: Jun. 21, 2022

(54) LIDAR SYSTEM OPERATING AT 1200-1400 NM

(71) Applicant: Luminar, LLC, Orlando, FL (US)

(72) Inventors: Jason M. Eichenholz, Orlando, FL (US); Laurance S. Lingvay, Pasadena, CA (US); David Welford, Danvers, MA (US)

(73) Assignee: Luminar, LLC, Orlando, FL (US)

( * ) Notice: Subject to any disclaimer, the term of this patent is extended or adjusted under 35 U.S.C. 154(b) by 483 days.

(21) Appl. No.: 16/555,304

(22) Filed: Aug. 29, 2019

(65) Prior Publication Data

US 2020/0076152 A1 Mar. 5, 2020

Related U.S. Application Data

(60) Provisional application No. 62/724,264, filed on Aug. 29, 2018.

(51) Int. Cl.
*G01C 3/08* (2006.01)
*H01S 3/0941* (2006.01)
(Continued)

(52) U.S. Cl.
CPC ............ *H01S 3/0941* (2013.01); *G01S 7/484* (2013.01); *G01S 7/4814* (2013.01); *G01S 7/4817* (2013.01); *G01S 17/10* (2013.01); *G01S 17/32* (2013.01); *G01S 17/88* (2013.01); *G02B 5/208* (2013.01); *G02B 26/0816* (2013.01); *G02B 26/101* (2013.01); *G02B 26/125* (2013.01); *H01S 3/0912* (2013.01); *H01S 3/094096* (2013.01); *H01S 3/113* (2013.01); *H01S 3/1115* (2013.01); *H01S 3/1611* (2013.01);
(Continued)

(58) Field of Classification Search
None
See application file for complete search history.

(56) References Cited

U.S. PATENT DOCUMENTS 7,324,568 B2 1/2008 Spariosu et al.
8,446,925 B2 * 5/2013 Goldberg .................. H01S 3/11
372/10
(Continued)

FOREIGN PATENT DOCUMENTS

CN 106646501 A * 5/2017 ............. G01S 17/08
WO WO 2018088991 A1 * 5/2018 ............. G01S 17/89

OTHER PUBLICATIONS

Arvidsson et al., "A combined actively and passively Q-switched microchip laser," Proc. SPIE, 3265, 106, (1998).
(Continued)

*Primary Examiner* — Mark Hellner

(57) ABSTRACT

In one embodiment, a lidar system includes a light source configured to emit light at one or more wavelengths between 1200 nm and 1400 nm. The lidar system also includes a scanner configured to scan the emitted light across a field of regard of the lidar system and a receiver configured to detect a portion of the emitted light scattered by a target located a distance from the lidar system. The lidar system further includes a processor configured to determine the distance from the lidar system to the target based at least in part on a round-trip time for the portion of the emitted light to travel from the lidar system to the target and back to the lidar system.

32 Claims, 11 Drawing Sheets

(51) Int. Cl.

| | |
|---|---|
| *G02B 5/20* | (2006.01) |
| *H01S 3/16* | (2006.01) |
| *H01S 3/11* | (2006.01) |
| *G01S 7/484* | (2006.01) |
| *G01S 17/10* | (2020.01) |
| *H01S 3/113* | (2006.01) |
| *G01S 7/481* | (2006.01) |
| *H01S 3/094* | (2006.01) |
| *H01S 3/091* | (2006.01) |
| *H01S 5/068* | (2006.01) |
| *H01S 5/125* | (2006.01) |
| *H01S 5/024* | (2006.01) |
| *G01S 17/88* | (2006.01) |
| *G01S 17/32* | (2020.01) |
| *G02B 26/10* | (2006.01) |
| *G02B 26/08* | (2006.01) |
| *G02B 26/12* | (2006.01) |

(52) U.S. Cl.
CPC .......... *H01S 3/1643* (2013.01); *H01S 3/1673* (2013.01); *H01S 5/02407* (2013.01); *H01S 5/068* (2013.01); *H01S 5/125* (2013.01)

(56) References Cited

U.S. PATENT DOCUMENTS

| | | | | |
|---|---|---|---|---|
| 9,121,703 | B1* | 9/2015 | Droz | G01S 17/04 |
| 9,905,992 | B1* | 2/2018 | Welford | H01S 3/0627 |
| 9,989,629 | B1* | 6/2018 | LaChapelle | G01S 7/484 |
| 2008/0095210 | A1* | 4/2008 | Murdoch | H01S 3/094084 372/71 |
| 2011/0150012 | A1* | 6/2011 | Li | H01S 3/0606 372/75 |
| 2012/0051376 | A1* | 3/2012 | Baker | B23K 26/0626 372/38.02 |
| 2012/0140782 | A1 | 6/2012 | Sotelo et al. | |
| 2014/0063261 | A1* | 3/2014 | Betensky | G02B 23/145 348/158 |
| 2017/0155225 | A1* | 6/2017 | Villeneuve | H01S 3/06758 |
| 2017/0222395 | A1* | 8/2017 | Guo | H01S 5/02212 |

OTHER PUBLICATIONS

Cole et al., "Reduction of Timing Jitter in a Q-Switched Nd:YAG Laser by Direct Bleaching of a $Cr^{4+}$:YAG Saturable Absorber," Optics Express Feb. 2, 2009;17(3):1766-71.

Cole et al., "Optical Triggering of a Q-Switched Nd:YAG Laser via Transverse Bleaching of a Cr:YAG Saturable Absorber," Appl Optics Nov. 1, 2009;48(31):6008-14.

Dascalu et al., "Investigation of passively Q-switched, externally controlled, quasi continuous and continuous pumped Nd:YAG laser," Opt. Eng., 35, 1247, (1996).

Degnan, "Optimization of passively Q-switched lasers," IEEE. Journ. Quant. Electron., 31, 1890 (1995).

Degnan et al., "Effects of thermalization on Q-switched laser properties," IEEE. Journ. Quant. Electron., 34, 887 (1998).

Druon et al., "High-repetition-rate 300-ps pulsed ultraviolet source with a passively Q-switched microchip laser and a multipass amplifier," Opt. Letts., 24, 499, (1999).

Eagle Yard Photonics, Data Sheet—EYP-RWL-0808-00800-4000-BFW42-0000.

Eagle Yard Photonics, Data Sheet—EYP-TPA-0808-02000-4006-CMT04-0000.

Haung et al., "High-power slab coupled optical waveguide laser (SCOWL) arrays," QELS Conference, 2005.

Haung et al., "High brightness slab-coupled optical waveguide laser," Proc. SPIE, 6485, 64850F, (2007).

Jaspan et al., "Passively Q-switched microlaser performance in the presence of pump-induced bleaching of the saturable absorber," Appl. Optics, 43, 2555, (2004).

Kracht, et al., "Core-doped ceramic Nd:YAG laser," Opt. Express, 14, 2690, (2006).

Mackenzie et al., "End-pumped, passively Q-switched Yb:YAG double-clad waveguide laser," Opt. Letts., 27, 2161, (2002).

Maxwell et al., "Advances in Single-crystal fibers and thin rods grown by laser heated pedestal growth," Crystals, 7, 12, (2017).

Miah et al., "Astigmatism-free high-brightness 1060 nm edge-emitting lasers with narrow circular beam profile," Optics Express, vol. 24, No. 26, Dec. 26, 2016.

Ostendorf et al., "10 W high-brightness tapered diode lasers at 976 nm," Proc. SPIE. 6876, 68760H, (2008).

Steinmetz et al., "Reduction of timing jitter in passively Q-switched microchip lasers using self-injection seeding," Opt. Letts., 35, 2885, (2010).

Volodin et al., "Holographic Volume Bragg Gratings Stabilize Laser Diode Performance," Photonics Spectra, Nov. 2003, pp. 68-73.

Xiao et al., "A generalized model for passively Q-switched lasers including excited state absorption in the saturable absorber," IEEE. Journ. Quant. Electron., 33, 41 (1997).

Zhang et al., "Direct Bleaching of a $Cr^{4+}$:YAG Saturable Absorber in a Passively Q-Switched Nd:YAG Laser," Appl Optics Jun. 1, 2018;57(16):4595-4600. (Abstract).

Zhang et al., "Highly efficient waveguided laser performance of diode pumped unclad Yb:YAG ciystalline fiber," Laser Phys. Letts., 13, 075101, (2016).

Zhou et al., "Progress on high-power, high-brightness VCSELs and applications," Proc. SPIE, 9381, 93810B, (2016).

\* cited by examiner

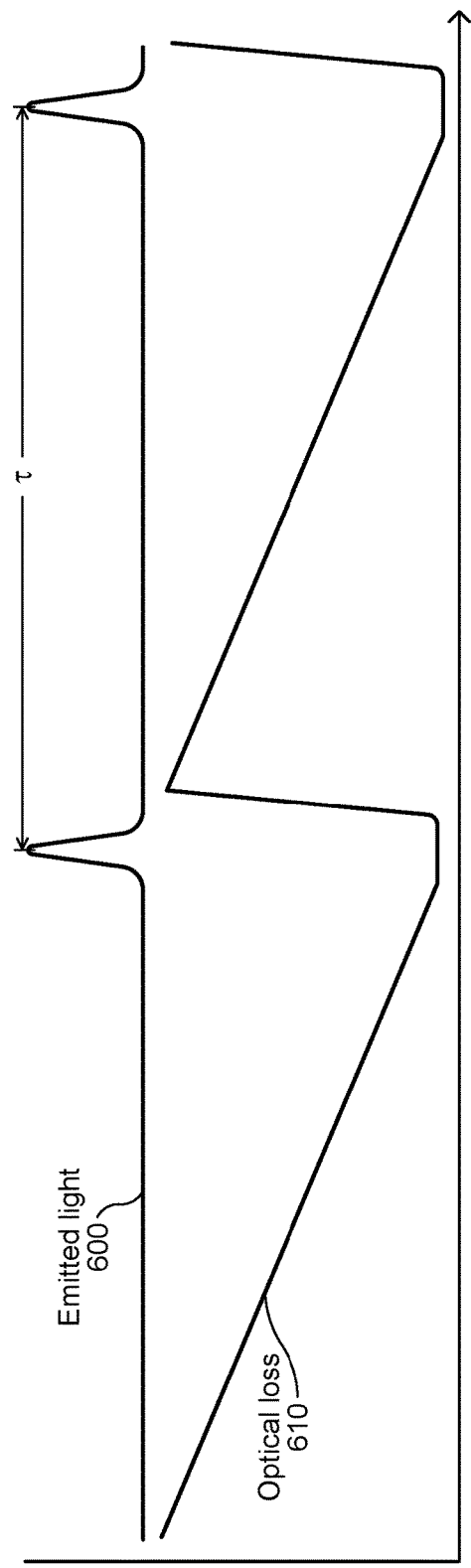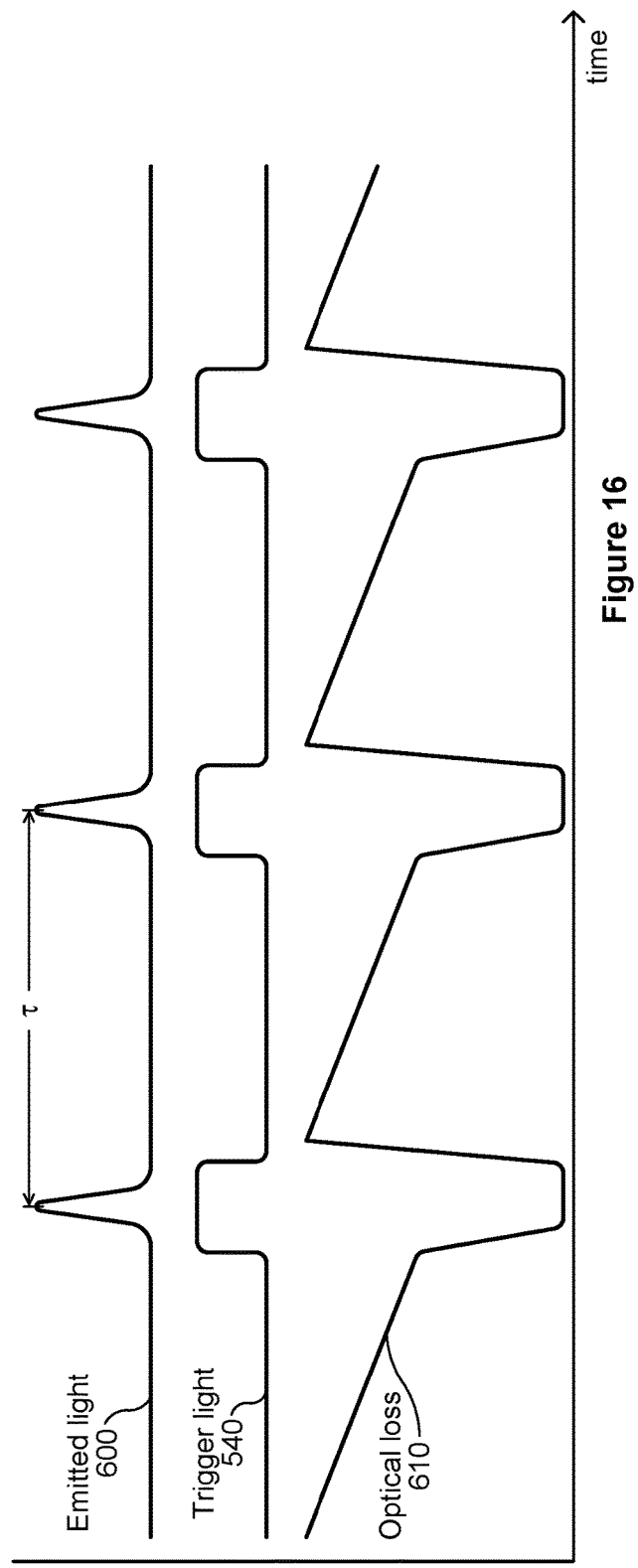

LIDAR SYSTEM OPERATING AT 1200-1400 NM

PRIORITY

This application claims the benefit, under 35 U.S.C. § 119(e), of U.S. Provisional Patent Application No. 62/724,264, filed 29 Aug. 2018, which is incorporated herein by reference.

TECHNICAL FIELD

This disclosure generally relates to lidar systems and diode-pumped solid-state lasers.

BACKGROUND

Light detection and ranging (lidar) is a technology that can be used to measure distances to remote targets. Typically, a lidar system includes a light source and an optical receiver. The light source can include, for example, a laser which emits light having a particular operating wavelength. The operating wavelength of a lidar system may lie, for example, in the infrared, visible, or ultraviolet portions of the electromagnetic spectrum. The light source emits light toward a target which scatters the light, and some of the scattered light is received back at the receiver. The system determines the distance to the target based on one or more characteristics associated with the received light. For example, the lidar system may determine the distance to the target based on the time of flight for a pulse of light emitted by the light source to travel to the target and back to the lidar system.

BRIEF DESCRIPTION OF THE DRAWINGS

FIG. 15 illustrates an example optical-loss curve for a DPSS laser.

FIG. 16 illustrates an example optical-loss curve for a DPSS laser that includes a trigger light source.

DESCRIPTION OF EXAMPLE EMBODIMENTS

Figure 1:
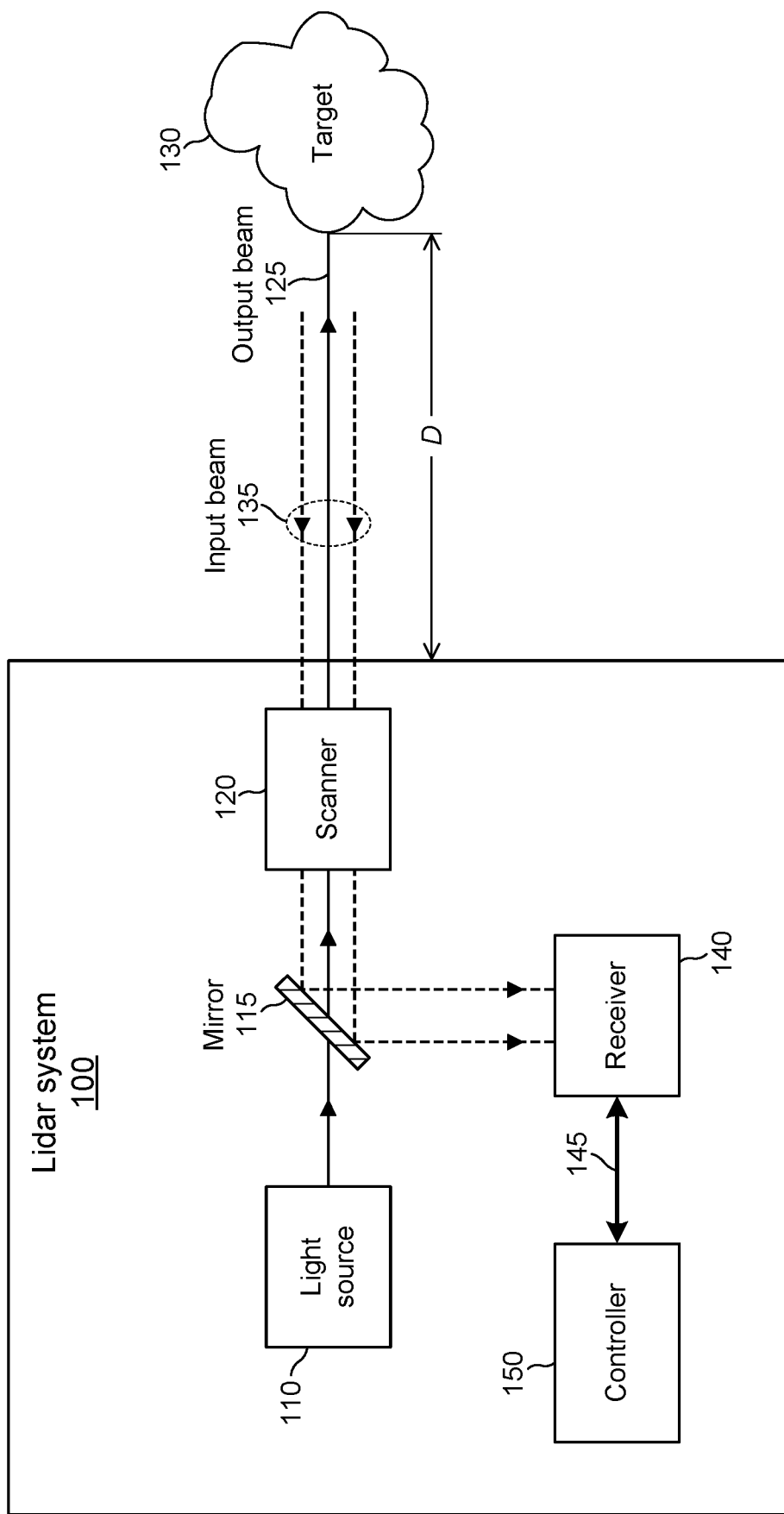
FIG. 1 illustrates an example light detection and ranging (lidar) system.

FIG. 1 illustrates an example light detection and ranging (lidar) system 100. In particular embodiments, a lidar system 100 may be referred to as a laser ranging system, a laser radar system, a LIDAR system, a lidar sensor, or a laser detection and ranging (LADAR or ladar) system. In particular embodiments, a lidar system 100 may include a light source 110, mirror 115, scanner 120, receiver 140, or controller 150. The light source 110 may include, for example, a laser which emits light having a particular operating wavelength in the infrared, visible, or ultraviolet portions of the electromagnetic spectrum. As an example, light source 110 may include a laser with an operating wavelength between approximately 900 nanometers (nm) and 2000 nm. The light source 110 emits an output beam of light 125 which may be continuous wave (CW), pulsed, or modulated in any suitable manner for a given application. The output beam of light 125 is directed downrange toward a remote target 130. As an example, the remote target 130 may be located a distance D of approximately 1 m to 1 km from the lidar system 100.

Once the output beam 125 reaches the downrange target 130, the target may scatter or reflect at least a portion of light from the output beam 125, and some of the scattered or reflected light may return toward the lidar system 100. In the example of FIG. 1, the scattered or reflected light is represented by input beam 135, which passes through scanner 120 and is reflected by mirror 115 and directed to receiver 140. In particular embodiments, a relatively small fraction of the light from output beam 125 may return to the lidar system 100 as input beam 135. As an example, the ratio of input beam 135 average power, peak power, or pulse energy to output beam 125 average power, peak power, or pulse energy may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of output beam 125 has a pulse energy of 1 microjoule (µJ), then the pulse energy of a corresponding pulse of input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, 1 aJ, or 0.1 aJ. In particular embodiments, output beam 125 may be referred to as a laser beam, light beam, optical beam, emitted beam, or beam. In particular embodiments, input beam 135 may be referred to as a return beam, received beam, return light, received light, input light, scattered light, or reflected light. As used herein, scattered light may refer to light that is scattered or reflected by a target 130. As an example, an input beam 135 may include: light from the output beam 125 that is scattered by target 130; light from the output beam 125 that is reflected by target 130; or a combination of scattered and reflected light from target 130.

In particular embodiments, receiver 140 may receive or detect photons from input beam 135 and generate one or more representative signals. For example, the receiver 140 may generate an output electrical signal 145 that is representative of the input beam 135, and the electrical signal 145 may be sent to controller 150. In particular embodiments, receiver 140 or controller 150 may include a processor, computing system (e.g., an ASIC or FPGA), or other suitable circuitry. A controller 150 may be configured to analyze one or more characteristics of the electrical signal 145 from the receiver 140 to determine one or more characteristics of the target 130, such as its distance downrange from the lidar system 100. This can be done, for example, by analyzing the time of flight or phase modulation for a beam of light 125 transmitted by the light source 110. If lidar system 100 measures a time of flight of T (e.g., T represents a round-trip time of flight for an emitted pulse of light to travel from the lidar system 100 to the target 130 and back to the lidar system 100), then the distance D from the target 130 to the lidar system 100 may be expressed as D=c·T/2, where c is the speed of light (approximately $3.0 \times 10^8$ m/s). As an example, if a time of flight is measured to be T=300 ns, then the distance from the target 130 to the lidar system 100 may be determined to be approximately D=45.0 m. As another example, if a time of flight is measured to be T=1.33 μs, then the distance from the target 130 to the lidar system 100 may be determined to be approximately D=199.5 m. In particular embodiments, a distance D from lidar system 100 to a target 130 may be referred to as a distance, depth, or range of target 130. As used herein, the speed of light c refers to the speed of light in any suitable medium, such as for example in air, water, or vacuum. As an example, the speed of light in vacuum is approximately $2.9979 \times 10^8$ m/s, and the speed of light in air (which has a refractive index of approximately 1.0003) is approximately $2.9970 \times 10^8$ m/s.

In particular embodiments, light source 110 may include a pulsed laser. As an example, light source 110 may be a pulsed laser configured to produce or emit pulses of light with a pulse duration or pulse width of approximately 10 picoseconds (ps) to 100 nanoseconds (ns). The pulses may have a pulse duration of approximately 100 ps, 200 ps, 400 ps, 1 ns, 2 ns, 5 ns, 10 ns, 20 ns, 50 ns, 100 ns, or any other suitable pulse duration. As another example, light source 110 may be a pulsed laser that produces pulses with a pulse duration of approximately 1-5 ns. As another example, light source 110 may be a pulsed laser that produces pulses at a pulse repetition frequency of approximately 80 kHz to 10 MHz or a pulse period (e.g., a time between consecutive pulses) of approximately 100 ns to 12.5 μs. In particular embodiments, light source 110 may have a substantially constant pulse repetition frequency, or light source 110 may have a variable or adjustable pulse repetition frequency. As an example, light source 110 may be a pulsed laser that produces pulses at a substantially constant pulse repetition frequency of approximately 640 kHz (e.g., 640,000 pulses per second), corresponding to a pulse period of approximately 1.56 μs. As another example, light source 110 may have a pulse repetition frequency (which may be referred to as a repetition rate) that can be varied from approximately 200 kHz to 2 MHz. As used herein, a pulse of light may be referred to as an optical pulse, a light pulse, or a pulse.

In particular embodiments, light source 110 may produce a free-space output beam 125 having any suitable average optical power. As an example, output beam 125 may have an average power of approximately 1 milliwatt (mW), 10 mW, 100 mW, 1 watt (W), 10 W, or any other suitable average power. In particular embodiments, output beam 125 may include optical pulses with any suitable pulse energy or peak optical power. As an example, output beam 125 may include pulses with a pulse energy of approximately 0.01 μJ, 0.1 μJ, 1 μJ, 10 μJ, 100 μJ, 1 mJ or any other suitable pulse energy. As another example, output beam 125 may include pulses with a peak power of approximately 10 W, 100 W, 1 kW, 5 kW, 10 kW, or any other suitable peak power. The peak power ($P_{peak}$) of a pulse of light can be related to the pulse energy (E) by the expression $E = P_{peak} \cdot \Delta t$, where $\Delta t$ is the duration of the pulse, and the duration of a pulse may be defined as the full width at half maximum duration of the pulse. For example, an optical pulse with a duration of 1 ns and a pulse energy of 1 μJ has a peak power of approximately 1 kW. The average power ($P_{av}$) of an output beam 125 can be related to the pulse repetition frequency (PRF) and pulse energy by the expression $P_{av} = PRF \cdot E$. For example, if the pulse repetition frequency is 500 kHz, then the average power of an output beam 125 with 1-μJ pulses is approximately 0.5 W.

In particular embodiments, light source 110 may include a laser diode, such as for example, a Fabry-Perot laser diode, a quantum well laser, a distributed Bragg reflector (DBR) laser, a distributed feedback (DFB) laser, or a vertical-cavity surface-emitting laser (VCSEL). As an example, light source 110 may include an aluminum-gallium-arsenide (AlGaAs) laser diode, an indium-gallium-arsenide (InGaAs) laser diode, an indium-gallium-arsenide-phosphide (InGaAsP) laser diode, or a laser diode that includes any suitable combination of aluminum (Al), indium (In), gallium (Ga), arsenic (As), phosphorous (P), or any other suitable material. In particular embodiments, light source 110 may include a pulsed laser diode with a peak emission wavelength between 1400 nm and 1600 nm. As an example, light source 110 may include a current-modulated InGaAsP DFB laser diode that produces optical pulses at a wavelength of approximately 1550 nm.

In particular embodiments, light source 110 may include a pulsed or CW laser diode followed by one or more optical-amplification stages. A pulsed laser diode may produce relatively low-power optical seed pulses which are amplified by an optical amplifier. As an example, light source 110 may be a fiber-laser module that includes a current-modulated laser diode with an operating wavelength of approximately 1550 nm followed by a single-stage or a multi-stage erbium-doped fiber amplifier (EDFA) that amplifies the seed pulses from the laser diode. As another example, light source 110 may include a continuous-wave (CW) or quasi-CW laser diode followed by an external optical modulator (e.g., an electro-optic amplitude modulator). The optical modulator may modulate the CW light from the laser diode to produce optical pulses which are sent to an optical amplifier. As another example, light source 110 may include a pulsed or CW laser diode followed by a semiconductor optical amplifier (SOA). The SOA may include an active optical waveguide configured to receive light from the laser diode and amplify the light as it propagates through the waveguide. The SOA may be integrated on the same chip as the laser diode, or the SOA may be a separate device with an anti-reflection coating on its input facet or output facet. In particular embodiments, light source 110 may include a laser diode which produces optical pulses that are not amplified by an optical amplifier. As an example, a direct-emitter laser diode (which may be referred to as a direct emitter) may emit optical pulses that form an output beam 125 that is directed downrange from a lidar system 100. A light source 110 that includes a direct-emitter laser diode may not include an optical amplifier, and the optical pulses produced by a direct emitter may not be amplified. A direct-emitter laser diode may be driven by an electrical power source that supplies current pulses to the laser diode, and each current pulse may result in the emission of an output optical pulse.

In particular embodiments, an output beam of light 125 emitted by light source 110 may be a collimated optical beam having any suitable beam divergence, such as for example, a full-angle beam divergence of approximately 0.5 to 10 milliradians (mrad). A divergence of output beam 125 may refer to an angular measure of an increase in beam size (e.g., a beam radius or beam diameter) as output beam 125 travels away from light source 110 or lidar system 100. In particular embodiments, output beam 125 may have a substantially circular cross section with a beam divergence characterized by a single divergence value. As an example, an output beam 125 with a circular cross section and a full-angle beam divergence of 2 mrad may have a beam diameter or spot size of approximately 20 cm at a distance of 100 m from lidar system 100. In particular embodiments, output beam 125 may have a substantially elliptical cross section characterized by two divergence values. As an example, output beam 125 may have a fast axis and a slow axis, where the fast-axis divergence is greater than the slow-axis divergence. As another example, output beam 125 may be an elliptical beam with a fast-axis divergence of 4 mrad and a slow-axis divergence of 2 mrad.

In particular embodiments, an output beam of light 125 emitted by light source 110 may be unpolarized or randomly polarized, may have no specific or fixed polarization (e.g., the polarization may vary with time), or may have a particular polarization (e.g., output beam 125 may be linearly polarized, elliptically polarized, or circularly polarized). As an example, light source 110 may produce light with no specific polarization or may produce light that is linearly polarized.

In particular embodiments, lidar system 100 may include one or more optical components configured to reflect, focus, filter, shape, modify, steer, or direct light within the lidar system 100 or light produced or received by the lidar system 100 (e.g., output beam 125 or input beam 135). As an example, lidar system 100 may include one or more lenses, mirrors, filters (e.g., bandpass or interference filters), beam splitters, polarizers, polarizing beam splitters, wave plates (e.g., half-wave or quarter-wave plates), diffractive elements, holographic elements, isolators, couplers, detectors, beam combiners, or collimators. The optical components in a lidar system 100 may be free-space optical components, fiber-coupled optical components, or a combination of free-space and fiber-coupled optical components.

In particular embodiments, lidar system 100 may include a telescope, one or more lenses, or one or more mirrors configured to expand, focus, or collimate the output beam 125 or the input beam 135 to a desired beam diameter or divergence. As an example, the lidar system 100 may include one or more lenses to focus the input beam 135 onto a photodetector of receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto a photodetector of receiver 140. As illustrated in FIG. 1, the lidar system 100 may include mirror 115 (which may be a metallic or dielectric mirror), and mirror 115 may be configured so that light beam 125 passes through the mirror 115 or passes along an edge or side of the mirror 115 and input beam 135 is reflected toward the receiver 140. As an example, mirror 115 (which may be referred to as an overlap mirror, superposition mirror, or beam-combiner mirror) may include a hole, slot, or aperture which output light beam 125 passes through. As another example, rather than passing through the mirror 115, the output beam 125 may be directed to pass alongside the mirror 115 with a gap (e.g., a gap of width approximately 0.1 mm, 0.5 mm, 1 mm, 2 mm, 5 mm, or 10 mm) between the output beam 125 and an edge of the mirror 115.

In particular embodiments, mirror 115 may provide for output beam 125 and input beam 135 to be substantially coaxial so that the two beams travel along approximately the same optical path (albeit in opposite directions). The input and output beams being substantially coaxial may refer to the beams being at least partially overlapped or sharing a common propagation axis so that input beam 135 and output beam 125 travel along substantially the same optical path (albeit in opposite directions). As an example, output beam 125 and input beam 135 may be parallel to each other to within less than 10 mrad, 5 mrad, 2 mrad, 1 mrad, 0.5 mrad, or 0.1 mrad. As output beam 125 is scanned across a field of regard, the input beam 135 may follow along with the output beam 125 so that the coaxial relationship between the two beams is maintained.

In particular embodiments, lidar system 100 may include a scanner 120 configured to scan an output beam 125 across a field of regard of the lidar system 100. As an example, scanner 120 may include one or more scanning mirrors configured to pivot, rotate, oscillate, or move in an angular manner about one or more rotation axes. The output beam 125 may be reflected by a scanning mirror, and as the scanning mirror pivots or rotates, the reflected output beam 125 may be scanned in a corresponding angular manner. As an example, a scanning mirror may be configured to periodically pivot back and forth over a 30-degree range, which results in the output beam 125 scanning back and forth across a 60-degree range (e.g., a 0-degree rotation by a scanning mirror results in a 20-degree angular scan of output beam 125).

In particular embodiments, a scanning mirror may be attached to or mechanically driven by a scanner actuator or mechanism which pivots or rotates the mirror over a particular angular range (e.g., over a 5° angular range, 30° angular range, 60° angular range, 120° angular range, 360° angular range, or any other suitable angular range). A scanner actuator or mechanism configured to pivot or rotate a mirror may include a galvanometer scanner, a resonant scanner, a piezoelectric actuator, a voice coil motor, an electric motor (e.g., a DC motor, a brushless DC motor, a synchronous electric motor, or a stepper motor), a microelectromechanical systems (MEMS) device, or any other suitable actuator or mechanism. As an example, a scanner 120 may include a scanning mirror attached to a galvanometer scanner configured to pivot back and forth over a 30° angular range. As another example, a scanner 120 may include a polygon mirror configured to rotate continuously in the same direction (e.g., rather than pivoting back and forth, the polygon mirror continuously rotates 360 degrees in a clockwise or counterclockwise direction). The polygon mirror may be coupled or attached to a synchronous motor configured to rotate the polygon mirror at a substantially fixed rotational frequency (e.g., a rotational frequency of approximately 1 Hz, 10 Hz, 50 Hz, 100 Hz, 500 Hz, or 1,000 Hz).

In particular embodiments, scanner 120 may be configured to scan the output beam 125 (which may include at least a portion of the light emitted by light source 110) across a field of regard of the lidar system 100. A field of regard (FOR) of a lidar system 100 may refer to an area, region, or angular range over which the lidar system 100 may be configured to scan or capture distance information. As an example, a lidar system 100 with an output beam 125 with a 30-degree scanning range may be referred to as having a 30-degree angular field of regard. As another example, a lidar system 100 with a scanning mirror that rotates over a 30-degree range may produce an output beam 125 that scans across a 60-degree range (e.g., a 60-degree FOR). In particular embodiments, lidar system 100 may have a FOR of approximately 10°, 20°, 40°, 60°, 120°, 360°, or any other suitable FOR.

In particular embodiments, scanner 120 may be configured to scan the output beam 125 horizontally and vertically, and lidar system 100 may have a particular FOR along the horizontal direction and another particular FOR along the vertical direction. As an example, lidar system 100 may have a horizontal FOR of 10° to 120° and a vertical FOR of 2° to 45°. In particular embodiments, scanner 120 may include a first scan mirror and a second scan mirror, where the first scan mirror directs the output beam 125 toward the second scan mirror, and the second scan mirror directs the output beam 125 downrange from the lidar system 100. As an example, the first scan mirror may scan the output beam 125 along a first direction, and the second scan mirror may scan the output beam 125 along a second direction that is substantially orthogonal to the first direction. As another example, the first scan mirror may scan the output beam 125 along a substantially horizontal direction, and the second scan mirror may scan the output beam 125 along a substantially vertical direction (or vice versa). As another example, the first and second scan mirrors may each be driven by galvanometer scanners. As another example, the first or second scan mirror may include a polygon mirror driven by an electric motor. In particular embodiments, scanner 120 may be referred to as a beam scanner, optical scanner, or laser scanner.

In particular embodiments, one or more scanning mirrors may be communicatively coupled to controller 150 which may control the scanning mirror(s) so as to guide the output beam 125 in a desired direction downrange or along a desired scan pattern. In particular embodiments, a scan pattern may refer to a pattern or path along which the output beam 125 is directed. As an example, scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. As an example, the scan path may result in a point cloud with pixels that substantially cover the 60°×20° FOR. The pixels may be approximately evenly distributed across the 60°×20° FOR. Alternatively, the pixels may have a particular non-uniform distribution (e.g., the pixels may be distributed across all or a portion of the 60°×20° FOR, and the pixels may have a higher density in one or more particular regions of the 60°×20° FOR).

In particular embodiments, a lidar system 100 may include a light source 110 configured to emit pulses of light and a scanner 120 configured to scan at least a portion of the emitted pulses of light across a field of regard of the lidar system 100. One or more of the emitted pulses of light may be scattered by a target 130 located downrange from the lidar system 100, and a receiver 140 may detect at least a portion of the pulses of light scattered by the target 130. A receiver 140 may be referred to as a photoreceiver, optical receiver, optical sensor, detector, photodetector, or optical detector. In particular embodiments, lidar system 100 may include a receiver 140 that receives or detects at least a portion of input beam 135 and produces an electrical signal that corresponds to input beam 135. As an example, if input beam 135 includes an optical pulse, then receiver 140 may produce an electrical current or voltage pulse that corresponds to the optical pulse detected by receiver 140. As another example, receiver 140 may include one or more avalanche photodiodes (APDs) or one or more single-photon avalanche diodes (SPADs). As another example, receiver 140 may include one or more PN photodiodes (e.g., a photodiode structure formed by a p-type semiconductor and a n-type semiconductor) or one or more PIN photodiodes (e.g., a photodiode structure formed by an undoped intrinsic semiconductor region located between p-type and n-type regions). An APD, SPAD, PN photodiode, or PIN photodiode may each be referred to as a detector, photodetector, or photodiode. A detector may have an active region or an avalanche-multiplication region that includes silicon, germanium, InGaAs, or AlInAsSb (aluminum indium arsenide antimonide). The active region may refer to an area over which a detector may receive or detect input light. An active region may have any suitable size or diameter, such as for example, a diameter of approximately 10 µm, 25 µm, 50 µm, 80 µm, 100 µm, 200 µm, 500 µm, 1 mm, 2 mm, or 5 mm.

In particular embodiments, receiver 140 may include circuitry that performs signal amplification, sampling, filtering, signal conditioning, analog-to-digital conversion, time-to-digital conversion, pulse detection, threshold detection, rising-edge detection, or falling-edge detection. As an example, receiver 140 may include a transimpedance amplifier that converts a received photocurrent (e.g., a current produced by an APD in response to a received optical signal) into a voltage signal. The voltage signal may be sent to pulse-detection circuitry that produces an analog or digital output signal 145 that corresponds to one or more characteristics (e.g., rising edge, falling edge, amplitude, or duration) of a received optical pulse. As an example, the pulse-detection circuitry may perform a time-to-digital conversion to produce a digital output signal 145. The electrical output signal 145 may be sent to controller 150 for processing or analysis (e.g., to determine a time-of-flight value corresponding to a received optical pulse).

In particular embodiments, controller 150 may be electrically coupled or communicatively coupled to light source 110, scanner 120, or receiver 140. As an example, controller 150 may receive electrical trigger pulses or edges from light source 110, where each pulse or edge corresponds to the emission of an optical pulse by light source 110. As another example, controller 150 may provide instructions, a control signal, or a trigger signal to light source 110 indicating when light source 110 should produce optical pulses. Controller 150 may send an electrical trigger signal that includes electrical pulses, where each electrical pulse results in the emission of an optical pulse by light source 110. In particular embodiments, the frequency, period, duration, pulse energy, peak power, average power, or wavelength of the optical pulses produced by light source 110 may be adjusted based on instructions, a control signal, or trigger pulses provided by controller 150. In particular embodiments, controller 150 may be coupled to light source 110 and receiver 140, and controller 150 may determine a time-of-flight value for an optical pulse based on timing information associated with when the pulse was emitted by light source 110 and when a portion of the pulse (e.g., input beam 135) was detected or received by receiver 140. In particular embodiments, controller 150 may include circuitry that performs signal amplification, sampling, filtering, signal conditioning, analog-to-digital conversion, time-to-digital conversion, pulse detection, threshold detection, rising-edge detection, or falling-edge detection.

In particular embodiments, lidar system 100 may include one or more processors (e.g., a controller 150) configured to determine a distance D from the lidar system 100 to a target 130 based at least in part on a round-trip time of flight for an emitted pulse of light to travel from the lidar system 100 to the target 130 and back to the lidar system 100. The target 130 may be at least partially contained within a field of regard of the lidar system 100 and located a distance D from the lidar system 100 that is less than or equal to a maximum range $R_{MAX}$ of the lidar system 100. In particular embodiments, a maximum range (which may be referred to as a maximum distance) of a lidar system 100 may refer to the maximum distance over which the lidar system 100 is configured to sense or identify targets 130 that appear in a field of regard of the lidar system 100. The maximum range of lidar system 100 may be any suitable distance, such as for example, 25 m, 50 m, 100 m, 200 m, 500 m, or 1 km. As an example, a lidar system 100 with a 200-m maximum range may be configured to sense or identify various targets 130 located up to 200 m away from the lidar system 100. For a lidar system 100 with a 200-m maximum range ($R_{MAX}$=200 m), the time of flight corresponding to the maximum range is approximately $2 \cdot R_{MAX}/c \cong 1.33$ μs.

In particular embodiments, a lidar system 100 may be used to determine the distance to one or more downrange targets 130. By scanning the lidar system 100 across a field of regard, the system can be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. As an example, a point cloud may cover a field of regard that extends 60° horizontally and 15° vertically, and the point cloud may include a frame of 100-2000 pixels in the horizontal direction by 4-400 pixels in the vertical direction.

In particular embodiments, lidar system 100 may be configured to repeatedly capture or generate point clouds of a field of regard at any suitable frame rate between approximately 0.1 frames per second (FPS) and approximately 1,000 FPS. As an example, lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. As another example, lidar system 100 may be configured to produce optical pulses at a rate of $5 \times 10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). In particular embodiments, a point-cloud frame rate may be substantially fixed, or a point-cloud frame rate may be dynamically adjustable. As an example, a lidar system 100 may capture one or more point clouds at a particular frame rate (e.g., 1 Hz) and then switch to capture one or more point clouds at a different frame rate (e.g., 10 Hz). A slower frame rate (e.g., 1 Hz) may be used to capture one or more high-resolution point clouds, and a faster frame rate (e.g., 10 Hz) may be used to rapidly capture multiple lower-resolution point clouds.

In particular embodiments, a lidar system 100 may be configured to sense, identify, or determine distances to one or more targets 130 within a field of regard. As an example, a lidar system 100 may determine a distance to a target 130, where all or part of the target 130 is contained within a field of regard of the lidar system 100. All or part of a target 130 being contained within a FOR of the lidar system 100 may refer to the FOR overlapping, encompassing, or enclosing at least a portion of the target 130. In particular embodiments, target 130 may include all or part of an object that is moving or stationary relative to lidar system 100. As an example, target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects. In particular embodiments, a target may be referred to as an object.

In particular embodiments, light source 110, scanner 120, and receiver 140 may be packaged together within a single housing, where a housing may refer to a box, case, or enclosure that holds or contains all or part of a lidar system 100. As an example, a lidar-system enclosure may contain a light source 110, mirror 115, scanner 120, and receiver 140 of a lidar system 100. Additionally, the lidar-system enclosure may include a controller 150. The lidar-system enclosure may also include one or more electrical connections for conveying electrical power or electrical signals to or from the enclosure. In particular embodiments, one or more components of a lidar system 100 may be located remotely from a lidar-system enclosure. As an example, all or part of light source 110 may be located remotely from a lidar-system enclosure, and pulses of light produced by the light source 110 may be conveyed to the enclosure via optical fiber. As another example, all or part of a controller 150 may be located remotely from a lidar-system enclosure.

In particular embodiments, light source 110 may include an eye-safe laser, or lidar system 100 may be classified as an eye-safe laser system or laser product. An eye-safe laser, laser system, or laser product may refer to a system that includes a laser with an emission wavelength, average power, peak power, peak intensity, pulse energy, beam size, beam divergence, exposure time, or scanned output beam such that emitted light from the system presents little or no possibility of causing damage to a person's eyes. As an example, light source 110 or lidar system 100 may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In particular embodiments, lidar system 100 may be an eye-safe laser product (e.g., with a Class 1 or Class I classification) configured to operate at any suitable wavelength between approximately 900 nm and approximately 2100 nm. As an example, lidar system 100 may include a laser with an operating wavelength between approximately 1200 nm and approximately 1400 nm or between approximately 1400 nm and approximately 1600 nm, and the laser or the lidar system 100 may be operated in an eye-safe manner. As another example, lidar system 100 may be an eye-safe laser product that includes a scanned laser with an operating wavelength between approximately 1300 nm and approximately 1400 nm. As another example, lidar system 100 may be a Class 1 or Class I laser product that includes a laser diode, fiber laser, or solid-state laser with an operating wavelength between approximately 1200 nm and approximately 1600 nm.

In particular embodiments, one or more lidar systems 100 may be integrated into a vehicle. As an example, multiple lidar systems 100 may be integrated into a car to provide a complete 360-degree horizontal FOR around the car. As another example, 4-10 lidar systems 100, each system having a 45-degree to 90-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-15 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, forklift, robot, golf cart, motorhome, taxi, motorcycle, scooter, bicycle, skateboard, train, snowmobile, watercraft (e.g., a ship or boat), aircraft (e.g., a fixed-wing aircraft, unmanned aerial vehicle, drone, helicopter, or dirigible), or spacecraft. In particular embodiments, a vehicle may include an internal combustion engine or an electric motor that provides propulsion for the vehicle.

In particular embodiments, one or more lidar systems 100 may be included in a vehicle as part of an advanced driver assistance system (ADAS) to assist a driver of the vehicle in operating the vehicle. For example, a lidar system 100 may be part of an ADAS that provides information or feedback to a driver (e.g., to alert the driver to potential problems or hazards) or that automatically takes control of part of a vehicle (e.g., a braking system or a steering system) to avoid collisions or accidents. A lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In particular embodiments, one or more lidar systems 100 may be integrated into a vehicle as part of an autonomous-vehicle driving system. As an example, a lidar system 100 may provide information about the surrounding environment to a driving system of an autonomous vehicle. An autonomous-vehicle driving system may be configured to guide the autonomous vehicle through an environment surrounding the vehicle and toward a destination. An autonomous-vehicle driving system may include one or more computing systems that receive information from a lidar system 100 about the surrounding environment, analyze the received information, and provide control signals to the vehicle's driving systems (e.g., steering wheel, accelerator, brake, or turn signal). As an example, a lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if lidar system 100 detects a vehicle ahead that is slowing down or stopping, the autonomous-vehicle driving system may send instructions to release the accelerator and apply the brakes.

In particular embodiments, an autonomous vehicle may be referred to as an autonomous car, driverless car, self-driving car, robotic car, or unmanned vehicle. In particular embodiments, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In particular embodiments, an autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

Although this disclosure describes or illustrates example embodiments of lidar systems 100 or light sources 110 that produce light waveforms that include pulses of light, the embodiments described or illustrated herein may also be applied to other types of light waveforms, including continuous-wave (CW) light or modulated light waveforms. For example, a lidar system 100 as described or illustrated herein may include a light source 110 configured to produce pulses of light. Alternatively, a lidar system 100 may be configured to operate as a frequency-modulated continuous-wave (FMCW) lidar system and may include a light source 110 configured to produce CW light or a frequency-modulated light waveform.

A pulsed lidar system is one type of lidar system 100 in which the light source 110 emits pulses of light, and the distance to a remote target 130 is determined from the time-of-flight for a pulse of light to travel to the target 130 and back. Another type of lidar system 100 is a frequency-modulated lidar system, which may be referred to as a frequency-modulated continuous-wave (FMCW) lidar system. A FMCW lidar system uses frequency-modulated light to determine the distance to a remote target 130 based on a modulation frequency of the received light (which is scattered from a remote target) relative to the modulation frequency of the emitted light. For example, for a linearly chirped light source (e.g., a frequency modulation that produces a linear change in frequency with time), the larger the frequency difference between the emitted light and the received light, the farther away the target 130 is located. The frequency difference can be determined by mixing the received light with a portion of the emitted light (e.g., by coupling the two beams onto a detector, or mixing analog electric signals corresponding to the received light and the emitted light) and determining the resulting beat frequency. For example, the electrical signal from an APD can be analyzed using a fast Fourier transform (FFT) technique to determine the frequency difference between the emitted light and the received light.

If a linear frequency modulation m (e.g., in units of Hz/s) is applied to a CW laser, then the distance D from the target 130 to the lidar system 100 may be expressed as $D=c\cdot\Delta f/(2m)$, where c is the speed of light and $\Delta f$ is the difference in frequency between the transmitted light and the received light. For example, for a linear frequency modulation of $10^{12}$ Hz/s (or, 1 MHz/µs), if a frequency difference of 330 kHz is measured, then the distance to the target is approximately 50 meters. Additionally, a frequency difference of 1.33 MHz corresponds to a target located approximately 200 meters away.

The light source 110 for a FMCW lidar system can be a fiber laser (e.g., a seed laser diode followed by one or more optical amplifiers) or a direct-emitter laser diode. The seed laser diode or the direct-emitter laser diode can be operated in a CW manner (e.g., by driving the laser diode with a substantially constant DC current), and the frequency modulation can be provided by an external modulator (e.g., an electro-optic phase modulator). Alternatively, the frequency modulation can be produced by applying a DC bias current along with a current modulation to the seed laser diode or the direct-emitter laser diode. The current modulation produces a corresponding refractive-index modulation in the laser diode, which results in a frequency modulation of the light emitted by the laser diode. The current-modulation component (and corresponding frequency modulation) can have any suitable frequency or shape (e.g., piecewise linear, sinusoidal, triangle-wave, or sawtooth).

Figure 2:
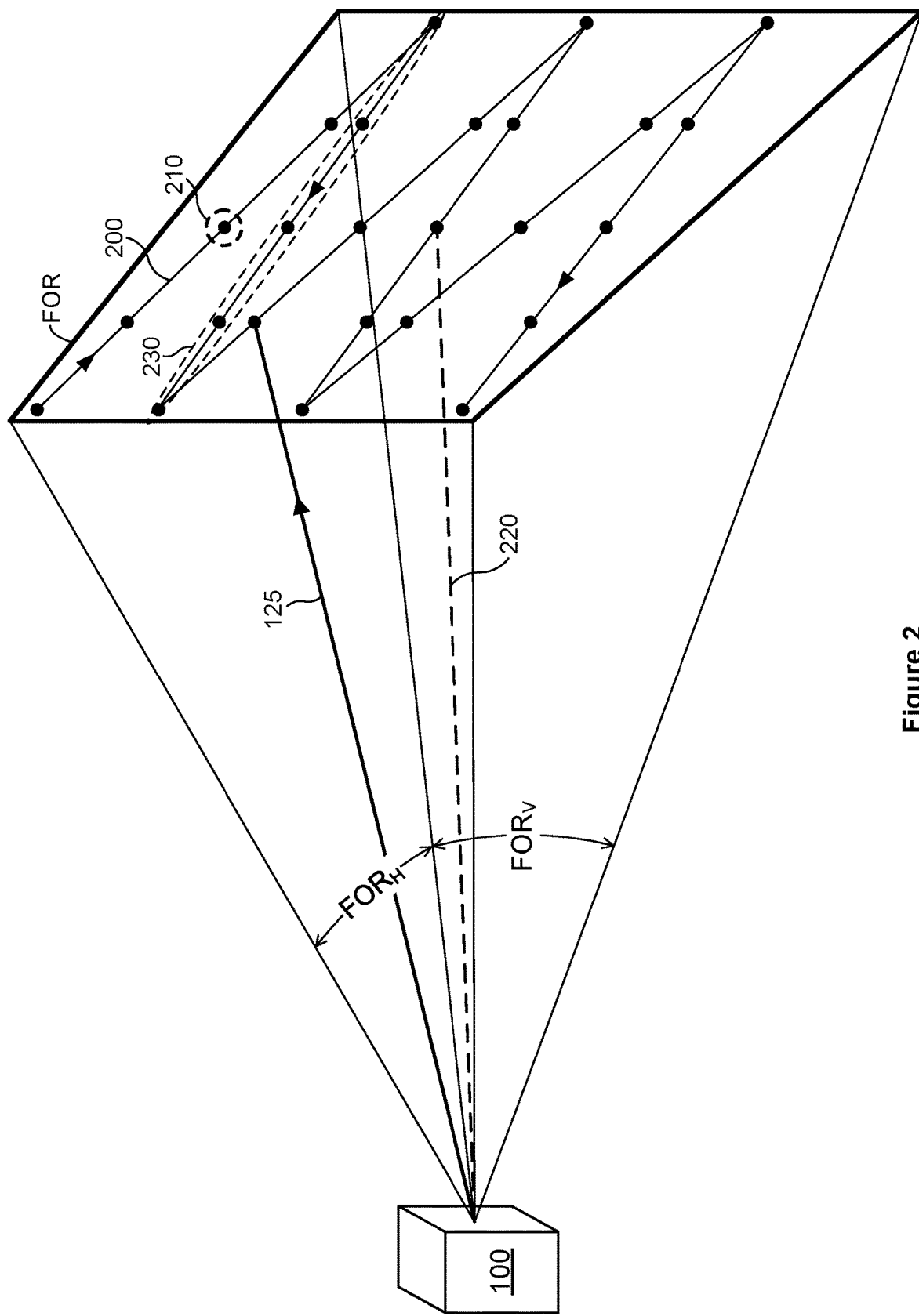
FIG. 2 illustrates an example scan pattern produced by a lidar system.

FIG. 2 illustrates an example scan pattern 200 produced by a lidar system 100. A scan pattern 200 (which may be referred to as an optical scan pattern, optical scan path, scan path, or scan) may represent a path or course followed by output beam 125 as it is scanned across all or part of a FOR. Each traversal of a scan pattern 200 may correspond to the capture of a single frame or a single point cloud. In particular embodiments, a lidar system 100 may be configured to scan output optical beam 125 along one or more particular scan patterns 200. In particular embodiments, a scan pattern 200 may scan across any suitable field of regard (FOR) having any suitable horizontal FOR ($FOR_H$) and any suitable vertical FOR ($FOR_V$). For example, a scan pattern 200 may have a field of regard represented by angular dimensions (e.g., $FOR_H \times FOR_V$) 40°×30°, 90°×40°, or 60°×15°. As another example, a scan pattern 200 may have a $FOR_H$ greater than or equal to 10°, 25°, 30°, 40°, 60°, 90°, or 120°. As another example, a scan pattern 200 may have a $FOR_V$ greater than or equal to 2°, 5°, 10°, 15°, 20°, 30°, or 45°.

In the example of FIG. 2, reference line 220 represents a center of the field of regard of scan pattern 200. In particular embodiments, reference line 220 may have any suitable orientation, such as for example, a horizontal angle of 0° (e.g., reference line 220 may be oriented straight ahead) and a vertical angle of 0° (e.g., reference line 220 may have an inclination of 0°), or reference line 220 may have a nonzero horizontal angle or a nonzero inclination (e.g., a vertical angle of +10° or −10°). In FIG. 2, if the scan pattern 200 has a 60°×15° field of regard, then scan pattern 200 covers a ±30° horizontal range with respect to reference line 220 and a ±7.5° vertical range with respect to reference line 220. Additionally, optical beam 125 in FIG. 2 has an orientation of approximately −15° horizontal and +3° vertical with respect to reference line 220. Optical beam 125 may be referred to as having an azimuth of −15° and an altitude of +3° relative to reference line 220. In particular embodiments, an azimuth (which may be referred to as an azimuth angle) may represent a horizontal angle with respect to reference line 220, and an altitude (which may be referred to as an altitude angle, elevation, or elevation angle) may represent a vertical angle with respect to reference line 220.

In particular embodiments, a scan pattern 200 may include multiple pixels 210, and each pixel 210 may be associated with one or more laser pulses or one or more distance measurements. Additionally, a scan pattern 200 may include multiple scan lines 230, where each scan line represents one scan across at least part of a field of regard, and each scan line 230 may include multiple pixels 210. In FIG. 2, scan line 230 includes five pixels 210 and corresponds to an approximately horizontal scan across the FOR from right to left, as viewed from the lidar system 100. In particular embodiments, a cycle of scan pattern 200 may include a total of $P_x \times P_y$ pixels 210 (e.g., a two-dimensional distribution of $P_x$ by $P_y$ pixels). As an example, scan pattern 200 may include a distribution with dimensions of approximately 100-2,000 pixels 210 along a horizontal direction and approximately 4-400 pixels 210 along a vertical direction. As another example, scan pattern 200 may include a distribution of 1,000 pixels 210 along the horizontal direction by 64 pixels 210 along the vertical direction (e.g., the frame size is 1000×64 pixels) for a total of 64,000 pixels per cycle of scan pattern 200. In particular embodiments, the number of pixels 210 along a horizontal direction may be referred to as a horizontal resolution of scan pattern 200, and the number of pixels 210 along a vertical direction may be referred to as a vertical resolution. As an example, scan pattern 200 may have a horizontal resolution of greater than or equal to 100 pixels 210 and a vertical resolution of greater than or equal to 4 pixels 210. As another example, scan pattern 200 may have a horizontal resolution of 100-2,000 pixels 210 and a vertical resolution of 4-400 pixels 210.

In particular embodiments, each pixel 210 may be associated with a distance (e.g., a distance to a portion of a target 130 from which an associated laser pulse was scattered) or one or more angular values. As an example, a pixel 210 may be associated with a distance value and two angular values (e.g., an azimuth and altitude) that represent the angular location of the pixel 210 with respect to the lidar system 100. A distance to a portion of target 130 may be determined based at least in part on a time-of-flight measurement for a corresponding pulse. An angular value (e.g., an azimuth or altitude) may correspond to an angle (e.g., relative to reference line 220) of output beam 125 (e.g., when a corresponding pulse is emitted from lidar system 100) or an angle of input beam 135 (e.g., when an input signal is received by lidar system 100). In particular embodiments, an angular value may be determined based at least in part on a position of a component of scanner 120. As an example, an azimuth or altitude value associated with a pixel 210 may be determined from an angular position of one or more corresponding scanning mirrors of scanner 120.

Figure 3:
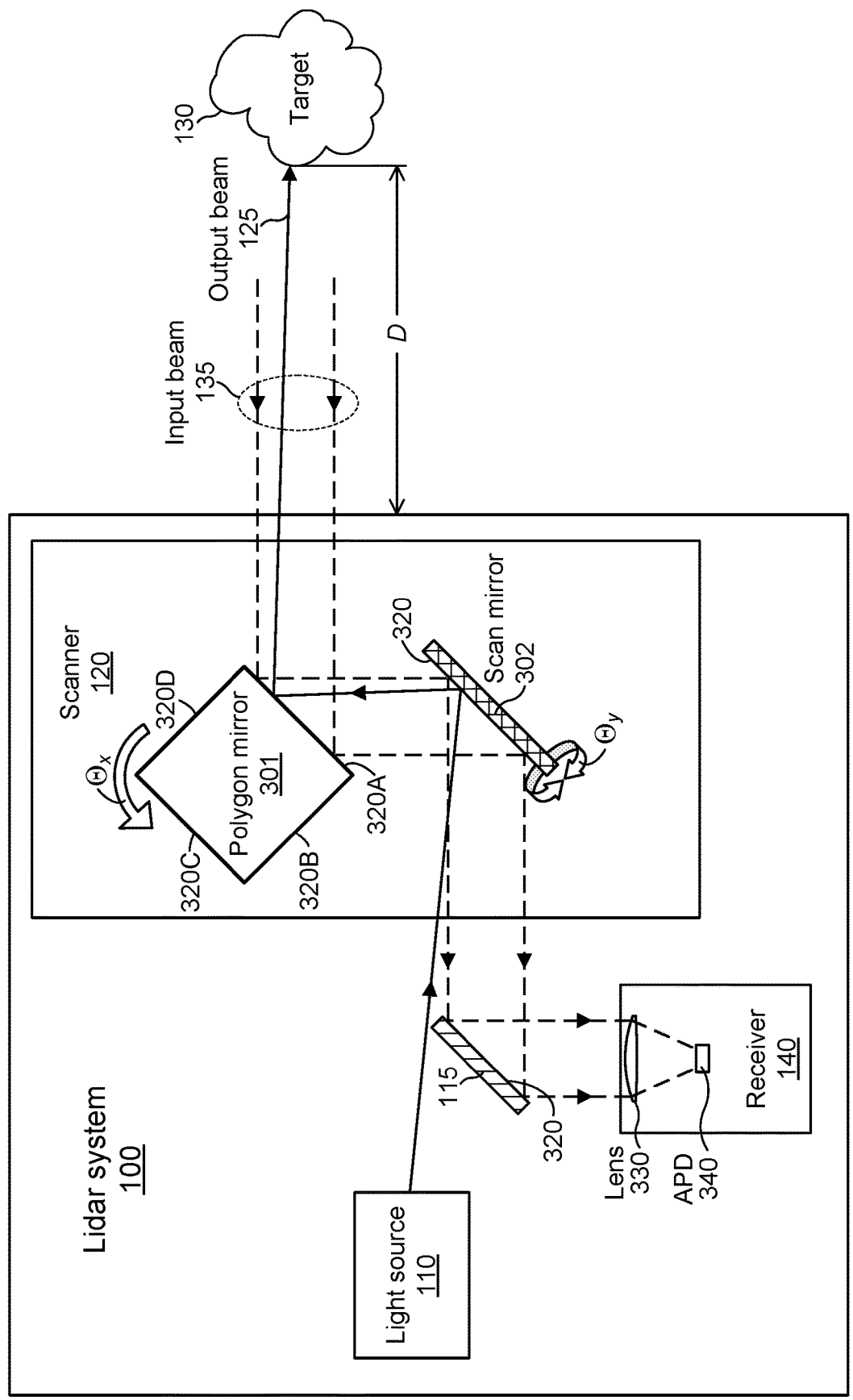
FIG. 3 illustrates an example lidar system with an example rotating polygon mirror.

FIG. 3 illustrates an example lidar system 100 with an example rotating polygon mirror 301. In particular embodiments, a scanner 120 may include a polygon mirror 301 configured to scan output beam 125 along a particular direction. In the example of FIG. 3, scanner 120 includes two scanning mirrors: (1) a polygon mirror 301 that rotates along the $\Theta_x$ direction and (2) a scanning mirror 302 that oscillates back and forth along the $\Theta_y$ direction. The output beam 125 from light source 110, which passes alongside mirror 115, is reflected by reflecting surface 320 of scan mirror 302 and is then reflected by a reflecting surface (e.g., surface 320A, 320B, 320C, or 320D) of polygon mirror 301.

Scattered light from a target 130 returns to the lidar system 100 as input beam 135. The input beam 135 reflects from polygon mirror 301, scan mirror 302, and mirror 115, which directs input beam 135 through focusing lens 330 and to the APD 340 of receiver 140. A reflecting surface 320 (which may be referred to as a reflective surface) may include a reflective metallic coating (e.g., gold, silver, or aluminum) or a reflective dielectric coating, and the reflecting surface 320 may have any suitable reflectivity R at an operating wavelength of the light source 110 (e.g., R greater than or equal to 70%, 80%, 90%, 95%, 98%, or 99%).

In particular embodiments, a polygon mirror 301 may be configured to rotate along a $\Theta_x$ or $\Theta_y$ direction and scan output beam 125 along a substantially horizontal or vertical direction, respectively. A rotation along a $\Theta_x$ direction may refer to a rotational motion of mirror 301 that results in output beam 125 scanning along a substantially horizontal direction. Similarly, a rotation along a $\Theta_y$ direction may refer to a rotational motion that results in output beam 125 scanning along a substantially vertical direction. In FIG. 3, mirror 301 is a polygon mirror that rotates along the $\Theta_x$ direction and scans output beam 125 along a substantially horizontal direction, and mirror 302 pivots along the $\Theta_y$ direction and scans output beam 125 along a substantially vertical direction. In particular embodiments, a polygon mirror 301 may be configured to scan output beam 125 along any suitable direction. As an example, a polygon mirror 301 may scan output beam 125 at any suitable angle with respect to a horizontal or vertical direction, such as for example, at an angle of approximately 0°, 10°, 20°, 30°, 45°, 60°, 70°, 80°, or 90° with respect to a horizontal or vertical direction.

In particular embodiments, a polygon mirror 301 may refer to a multi-sided object having reflective surfaces 320 on two or more of its sides or faces. As an example, a polygon mirror may include any suitable number of reflective faces (e.g., 2, 3, 4, 5, 6, 7, 8, or 10 faces), where each face includes a reflective surface 320. A polygon mirror 301 may have a cross-sectional shape of any suitable polygon, such as for example, a triangle (with three reflecting surfaces 320), square (with four reflecting surfaces 320), pentagon (with five reflecting surfaces 320), hexagon (with six reflecting surfaces 320), heptagon (with seven reflecting surfaces 320), or octagon (with eight reflecting surfaces 320). In FIG. 3, the polygon mirror 301 has a substantially square cross-sectional shape and four reflecting surfaces (320A, 320B, 320C, and 320D). The polygon mirror 301 in FIG. 3 may be referred to as a square mirror, a cube mirror, or a four-sided polygon mirror. In FIG. 3, the polygon mirror 301 may have a shape similar to a cube, cuboid, or rectangular prism. Additionally, the polygon mirror 301 may have a total of six sides, where four of the sides include faces with reflective surfaces (320A, 320B, 320C, and 320D).

In particular embodiments, a polygon mirror 301 may be continuously rotated in a clockwise or counter-clockwise rotation direction about a rotation axis of the polygon mirror 301. The rotation axis may correspond to a line that is perpendicular to the plane of rotation of the polygon mirror 301 and that passes through the center of mass of the polygon mirror 301. In FIG. 3, the polygon mirror 301 rotates in the plane of the drawing, and the rotation axis of the polygon mirror 301 is perpendicular to the plane of the drawing. An electric motor may be configured to rotate a polygon mirror 301 at a substantially fixed frequency (e.g., a rotational frequency of approximately 1 Hz (or 1 revolution per second), 10 Hz, 50 Hz, 100 Hz, 500 Hz, or 1,000 Hz). As an example, a polygon mirror 301 may be mechanically coupled to an electric motor (e.g., a synchronous electric motor) which is configured to spin the polygon mirror 301 at a rotational speed of approximately 160 Hz (or, 9600 revolutions per minute (RPM)).

In particular embodiments, output beam 125 may be reflected sequentially from the reflective surfaces 320A, 320B, 320C, and 320D as the polygon mirror 301 is rotated. This results in the output beam 125 being scanned along a particular scan axis (e.g., a horizontal or vertical scan axis) to produce a sequence of scan lines, where each scan line corresponds to a reflection of the output beam 125 from one of the reflective surfaces of the polygon mirror 301. In FIG. 3, the output beam 125 reflects off of reflective surface 320A to produce one scan line. Then, as the polygon mirror 301 rotates, the output beam 125 reflects off of reflective surfaces 320B, 320C, and 320D to produce a second, third, and fourth respective scan line. In particular embodiments, a lidar system 100 may be configured so that the output beam 125 is first reflected from polygon mirror 301 and then from scan mirror 302 (or vice versa). As an example, an output beam 125 from light source 110 may first be directed to polygon mirror 301, where it is reflected by a reflective surface of the polygon mirror 301, and then the output beam 125 may be directed to scan mirror 302, where it is reflected by reflective surface 320 of the scan mirror 302. In the example of FIG. 3, the output beam 125 is reflected from the polygon mirror 301 and the scan mirror 302 in the reverse order. In FIG. 3, the output beam 125 from light source 110 is first directed to the scan mirror 302, where it is reflected by reflective surface 320, and then the output beam 125 is directed to the polygon mirror 301, where it is reflected by reflective surface 320A.

Figure 4:
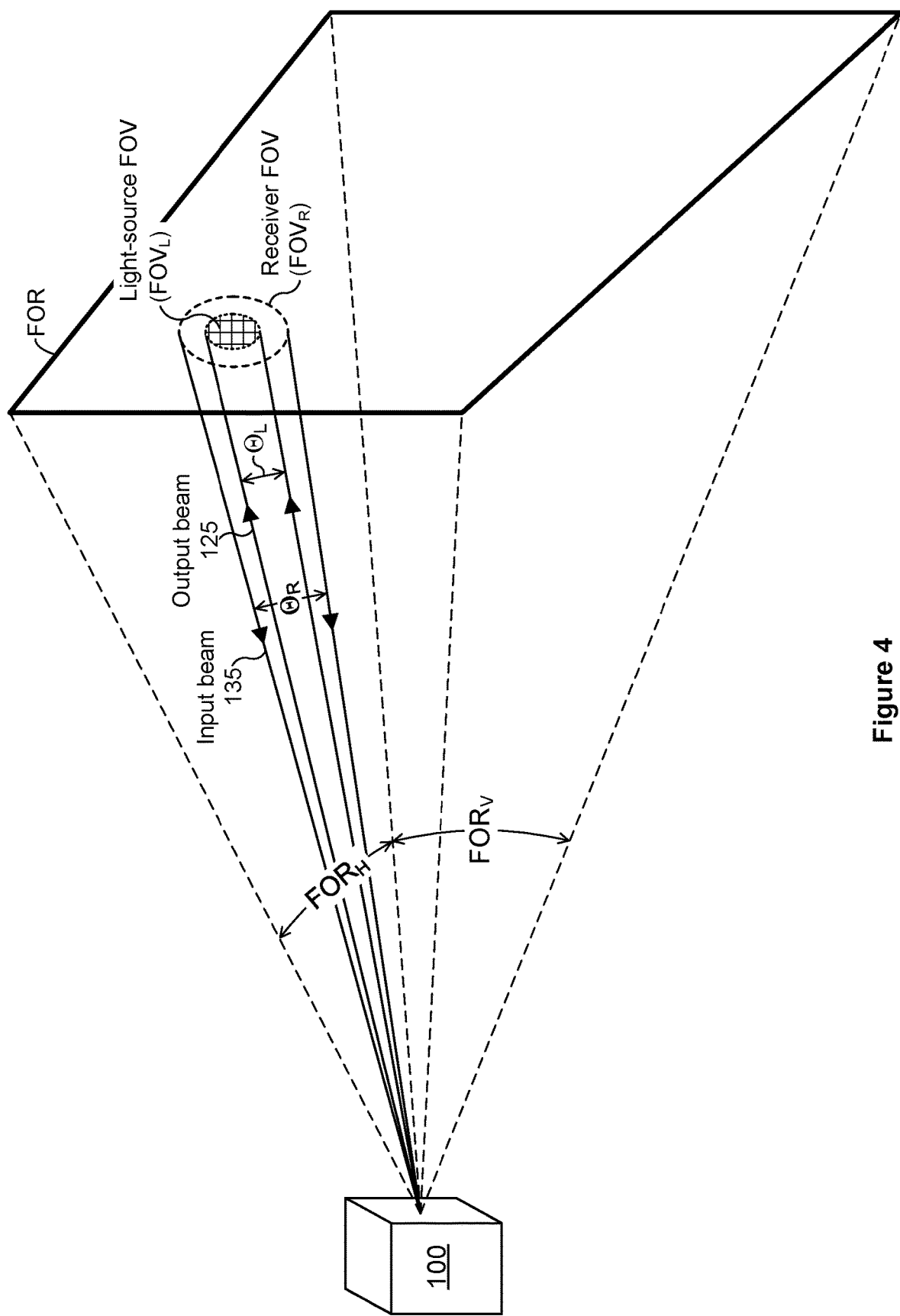
FIG. 4 illustrates an example light-source field of view ($FOV_L$) and receiver field of view ($FOV_R$) for a lidar system.

FIG. 4 illustrates an example light-source field of view ($FOV_L$) and receiver field of view ($FOV_R$) for a lidar system 100. A light source 110 of lidar system 100 may emit pulses of light as the $FOV_L$ and $FOV_R$ are scanned by scanner 120 across a field of regard (FOR). In particular embodiments, a light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. As an example, as the light-source field of view is scanned across a field of regard, a portion of a pulse of light emitted by the light source 110 may be sent downrange from lidar system 100, and the pulse of light may be sent in the direction that the $FOV_L$ is pointing at the time the pulse is emitted. The pulse of light may scatter off a target 130, and the receiver 140 may receive and detect a portion of the scattered light that is directed along or contained within the $FOV_R$.

In particular embodiments, scanner 120 may be configured to scan both a light-source field of view and a receiver field of view across a field of regard of the lidar system 100. Multiple pulses of light may be emitted and detected as the scanner 120 scans the $FOV_L$ and $FOV_R$ across the field of regard of the lidar system 100 while tracing out a scan pattern 200. In particular embodiments, the light-source field of view and the receiver field of view may be scanned synchronously with respect to one another, so that as the $FOV_L$ is scanned across a scan pattern 200, the $FOV_R$ follows substantially the same path at the same scanning speed. Additionally, the $FOV_L$ and $FOV_R$ may maintain the same relative position to one another as they are scanned across the field of regard. As an example, the $FOV_L$ may be substantially overlapped with or centered inside the $FOV_R$ (as illustrated in FIG. 4), and this relative positioning between $FOV_L$ and $FOV_R$ may be maintained throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

In particular embodiments, the $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. In particular embodiments, the receiver field of view may be any suitable size relative to the light-source field of view. As an example, the receiver field of view may be smaller than, substantially the same size as, or larger than the angular extent of the light-source field of view. In particular embodiments, the light-source field of view may have an angular extent of less than or equal to 50 milliradians, and the receiver field of view may have an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. In particular embodiments, the light-source field of view and the receiver field of view may have approximately equal angular extents. As an example, $\Theta_L$ and $\Theta_R$ may both be approximately equal to 1 mrad, 2 mrad, or 4 mrad. In particular embodiments, the receiver field of view may be larger than the light-source field of view, or the light-source field of view may be larger than the receiver field of view. As an example, $\Theta_L$ may be approximately equal to 3 mrad, and $\Theta_R$ may be approximately equal to 4 mrad. As another example, $\Theta_R$ may be approximately L times larger than $\Theta_L$, where L is any suitable factor, such as for example, 1.1, 1.2, 1.5, 2, 3, 5, or 10.

In particular embodiments, a pixel 210 may represent or may correspond to a light-source field of view or a receiver field of view. As the output beam 125 propagates from the light source 110, the diameter of the output beam 125 (as well as the size of the corresponding pixel 210) may increase according to the beam divergence $\theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 210 may also have a corresponding size or diameter of approximately 20 cm. At a distance of 200 m from the lidar system 100, the output beam 125 and the corresponding pixel 210 may each have a diameter of approximately 40 cm.

Figure 5:
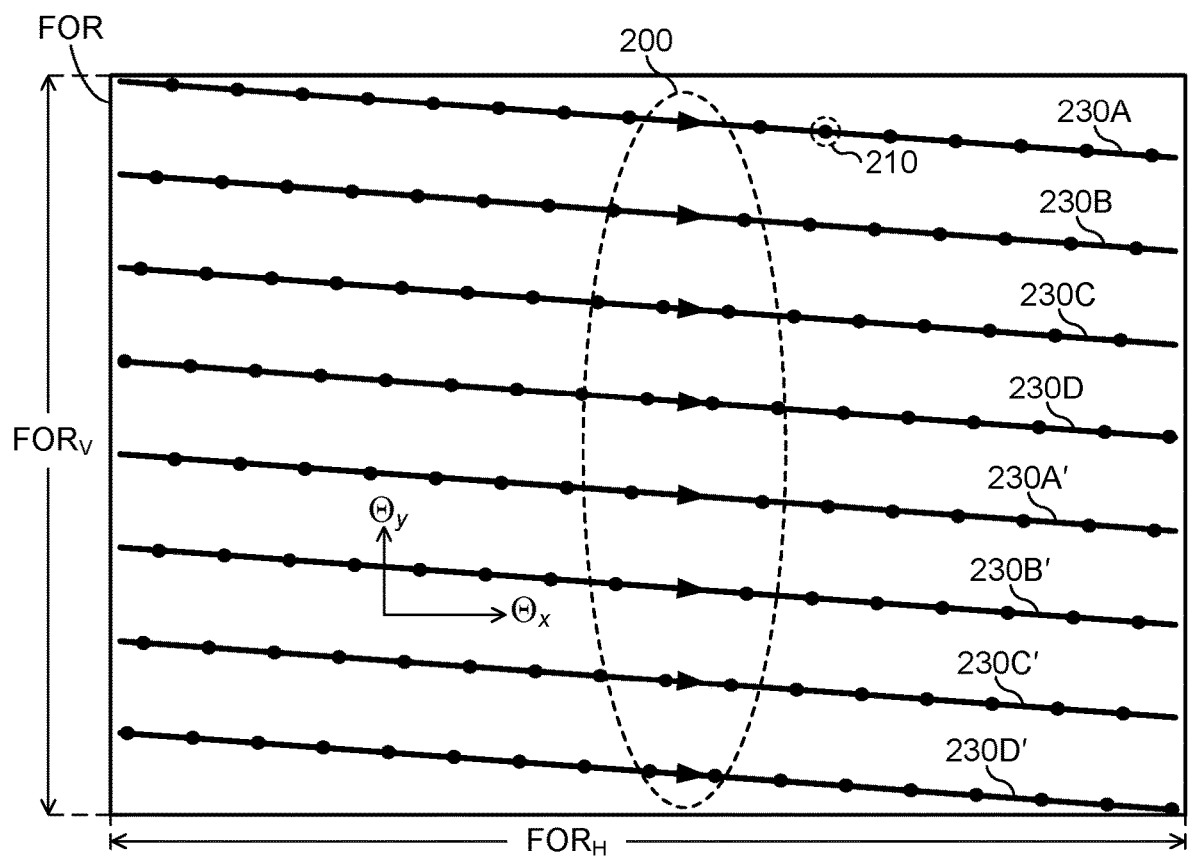
FIG. 5 illustrates an example unidirectional scan pattern that includes multiple pixels and multiple scan lines.

FIG. 5 illustrates an example unidirectional scan pattern 200 that includes multiple pixels 210 and multiple scan lines 230. In particular embodiments, scan pattern 200 may include any suitable number of scan lines 230 (e.g., approximately 1, 2, 5, 10, 20, 50, 100, 500, or 1,000 scan lines), and each scan line 230 of a scan pattern 200 may include any suitable number of pixels 210 (e.g., 1, 2, 5, 10, 20, 50, 100, 200, 500, 1,000, 2,000, or 5,000 pixels). The scan pattern 200 illustrated in FIG. 5 includes eight scan lines 230, and each scan line 230 includes approximately 16 pixels 210. In particular embodiments, a scan pattern 200 where the scan lines 230 are scanned in two directions (e.g., alternately scanning from right to left and then from left to right) may be referred to as a bidirectional scan pattern 200, and a scan pattern 200 where the scan lines 230 are scanned in the same direction may be referred to as a unidirectional scan pattern 200. The scan pattern 200 in FIG. 5 may be referred to as a unidirectional scan pattern 200 where each scan line 230 travels across the FOR in substantially the same direction (e.g., approximately from left to right as viewed from the lidar system 100). In particular embodiments, scan lines 230 of a unidirectional scan pattern 200 may be directed across of a FOR in any suitable direction, such as for example, from left to right, from right to left, from top to bottom, from bottom to top, or at any suitable angle (e.g., at a 0°, 5°, 10°, 30°, or 45° angle) with respect to a horizontal or vertical axis. In particular embodiments, each scan line 230 in a unidirectional scan pattern 200 may be a separate line that is not directly connected to a previous or subsequent scan line 230.

In particular embodiments, a unidirectional scan pattern 200 may be produced by a scanner 120 that includes a polygon mirror (e.g., polygon mirror 301 of FIG. 3), where each scan line 230 is associated with a particular reflective surface 320 of the polygon mirror. As an example, reflective surface 320A of polygon mirror 301 in FIG. 3 may produce scan line 230A in FIG. 5. Similarly, as the polygon mirror 301 rotates, reflective surfaces 320B, 320C, and 320D may successively produce scan lines 230B, 230C, and 230D, respectively. Additionally, for a subsequent revolution of the polygon mirror 301, the scan lines 230A', 230B', 230C', and 230D' may be successively produced by reflections of the output beam 125 from reflective surfaces 320A, 320B, 320C, and 320D, respectively. In particular embodiments, N successive scan lines 230 of a unidirectional scan pattern 200 may correspond to one full revolution of a N-sided polygon mirror. As an example, the four scan lines 230A, 230B, 230C, and 230D in FIG. 5 may correspond to one full revolution of the four-sided polygon mirror 301 in FIG. 3. Additionally, a subsequent revolution of the polygon mirror 301 may produce the next four scan lines 230A', 230B', 230C', and 230D' in FIG. 5.

Figure 6:
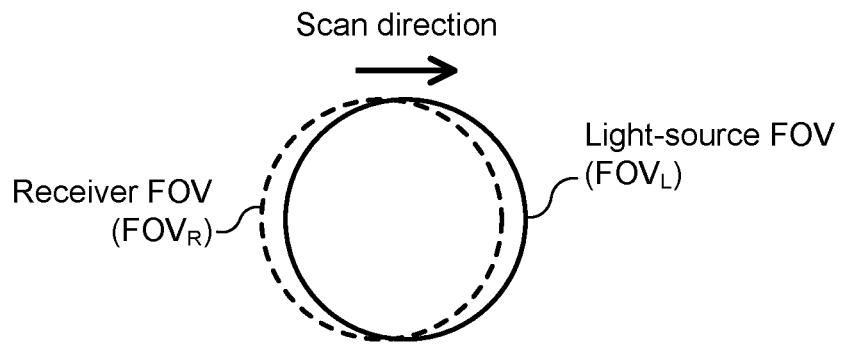
FIG. 6 illustrates an example light-source field of view and receiver field of view with a corresponding scan direction.

FIG. 6 illustrates an example light-source field of view and receiver field of view with a corresponding scan direction. In particular embodiments, scanner 120 may scan the $FOV_L$ and $FOV_R$ along any suitable scan direction or combination of scan directions, such as for example, left to right, right to left, upward, downward, or any suitable combination thereof. As an example, the $FOV_L$ and $FOV_R$ may follow a left-to-right scan direction (as illustrated in FIG. 6) across a field of regard, and then the $FOV_L$ and $FOV_R$ may travel back across the field of regard in a right-to-left scan direction. As another example, the $FOV_L$ and $FOV_R$ may trace out one scan line (e.g., scan line 230A in FIG. 5) in a left-to-right scan direction, and then the $FOV_L$ and $FOV_R$ may trace out the next scan line (e.g., scan line 230B in FIG. 5) in the same left-to-right scan direction.

Figure 7:
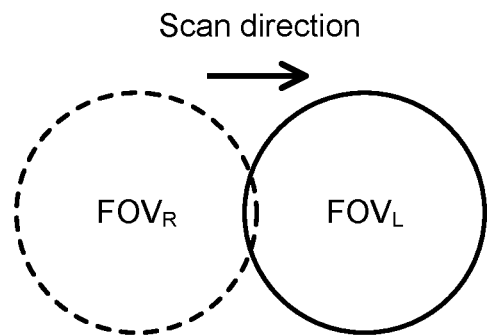
FIG. 7 illustrates an example receiver field of view that is offset from a light-source field of view.

FIG. 7 illustrates an example receiver field of view that is offset from a light-source field of view. In particular embodiments, a $FOV_L$ and $FOV_R$ may be scanned along a particular scan direction, and the $FOV_R$ may be offset from the $FOV_L$ in a direction opposite the scan direction. A lidar system with a polygon mirror (e.g., similar to that illustrated in FIG. 3) may have its $FOV_L$ and $FOV_R$ arranged as illustrated in FIG. 7 where the $FOV_R$ lags behind the $FOV_L$. Each reflection of the output beam 125 from a reflective surface of polygon mirror 301 may correspond to a single scan line, and each scan line may scan across a FOR in the same direction (e.g., from left to right).

In particular embodiments, a light-source field of view and a receiver field of view may be non-overlapped during scanning or may be at least partially overlapped during scanning. As an example, the $FOV_L$ and $FOV_R$ may have any suitable amount of angular overlap, such as for example, approximately 0%, 1%, 2%, 5%, 10%, 25%, 50%, 75%, 90%, or 100% of angular overlap. As another example, if the angular extents $\Theta_L$ and $\Theta_R$ are each 2 mrad, and $FOV_L$ and $FOV_R$ are offset from one another by 1 mrad, then $FOV_L$ and $FOV_R$ may be referred to as having a 50% angular overlap. As another example, if $\Theta_L$ and $\Theta_R$ are each 2 mrad, and $FOV_L$ and $FOV_R$ are offset from one another by 2 mrad, then $FOV_L$ and $FOV_R$ may be referred to as having a 0% angular overlap. As another example, the $FOV_L$ and $FOV_R$ may be substantially coincident with one another and may have an angular overlap of approximately 100%. In the example of FIG. 6, the $FOV_L$ and $FOV_R$ are approximately the same size and have an angular overlap of approximately 90%.

In particular embodiments, the $FOV_R$ may be configured to lag behind the $FOV_L$ to produce any suitable angular overlap, such as for example, an angular overlap of less than or equal to 50%, 25%, 5%, 1%, or 0%. In the example of FIG. 7, the $FOV_L$ and $FOV_R$ are approximately the same size, and the $FOV_R$ lags behind the $FOV_L$ so that the $FOV_L$ and $FOV_R$ have an angular overlap of approximately 5%. After a pulse of light is emitted by light source 110, the pulse may scatter from a target 130, and some of the scattered light may propagate back to the lidar system 100 along a path that corresponds to the orientation of the light-source field of view at the time the pulse was emitted. As the pulse of light propagates to and from the target 130, the receiver field of view moves in the scan direction and increases its overlap with the previous location of the light-source field of view (e.g., the location of the light-source field of view when the pulse was emitted).

In FIG. 7, for a close-range target (e.g., a target 130 located within 20% of the maximum range of the lidar system), when the receiver 140 detects scattered light from the emitted pulse, the receiver field of view may overlap less than or equal to 20% of the previous location of the light-source field of view. The receiver 140 may receive less than or equal to 20% of the scattered light that propagates back to the lidar system 100 along the path that corresponds to the orientation of the light-source field of view at the time the pulse was emitted. However, since the target 130 is located relatively close to the lidar system 100, the receiver 140 may still receive a sufficient amount of light to produce a signal indicating that a pulse has been detected. For a midrange target (e.g., a target 130 located between 20% and 80% of the maximum range of the lidar system 100), when the receiver 140 detects the scattered light, the receiver field of view may overlap between 20% and 80% of the previous location of the light-source field of view. For a target 130 located a distance greater than or equal to 80% of the maximum range of the lidar system 100, when the receiver 140 detects the scattered light, the receiver field of view may overlap greater than or equal to 80% of the previous location of the light-source field of view. For a target 130 located at the maximum range from the lidar system 100, when the receiver 140 detects the scattered light, the receiver field of view may be substantially overlapped with the previous location of the light-source field of view, and the receiver 140 may receive substantially all of the scattered light that propagates back to the lidar system 100.

Figure 8:
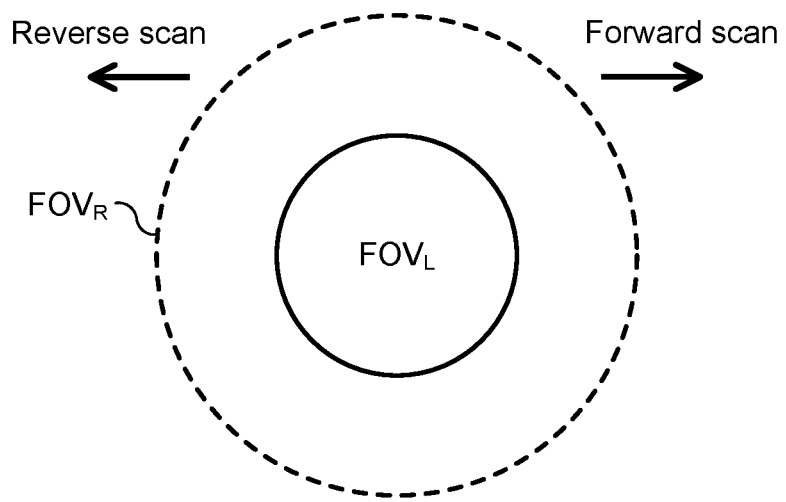
FIG. 8 illustrates an example forward-scan direction and reverse-scan direction for a light-source field of view and a receiver field of view.

FIG. 8 illustrates an example forward-scan direction and reverse-scan direction for a light-source field of view and a receiver field of view. A lidar system 100 may be configured to scan the light source and receiver $FOV_S$ in a forward-scan direction (e.g., as illustrated in FIG. 5), in a reverse-scan direction, or in both a forward- and reverse-scan direction (e.g., as illustrated in FIG. 2).

In particular embodiments, a lidar system 100 may be configured so that the $FOV_R$ is approximately the same size as the $FOV_L$. In FIGS. 6 and 7, the light source and receiver $FOV_S$ are approximately the same size. In particular embodiments, a lidar system 100 may be configured so that the $FOV_R$ is larger than the $FOV_L$. As an example, the $FOV_R$ may have a diameter or angular extent $\Theta_R$, that is approximately 1.5×, 2×, 3×, 4×, 5×, or 10× larger than the diameter or angular extent $\Theta_L$ of the $FOV_L$. In the example of FIG. 8, the diameter of the receiver field of view is approximately 2 times larger than the diameter of the light-source field of view. In particular embodiments, the receiver and light-source $FOV_S$ may be substantially coincident, overlapped, or centered with respect to one another. In FIG. 8, the two $FOV_S$ are overlapped and centered with respect to one another. The receiver field of view being larger than the light-source field of view may allow the receiver 140 to receive scattered light from emitted pulses in both scan directions (forward scan or reverse scan). In the forward-scan direction illustrated in FIG. 8, scattered light may be received primarily by the left side of the $FOV_R$, and in the reverse-scan direction, scattered light may be received primarily by the right side of the $FOV_R$. For example, as a pulse of light propagates to and from a target 130 during a forward scan, the $FOV_R$ scans to the right, and scattered light that returns to the lidar system 100 may be received primarily by the left portion of the $FOV_R$.

In each of FIGS. 6-8, the light-source FOV and the receiver FOV may be scanned synchronously with respect to one another. In particular embodiments, a light-source FOV and a receiver FOV being scanned synchronously with respect to one another may refer to (1) the $FOV_L$ and $FOV_R$ having approximately the same scanning speed, (2) the $FOV_L$ and $FOV_R$ following substantially the same scan path, or (3) the $FOV_L$ and $FOV_R$ maintaining the same relative position with respect to one another as they are scanned across a field of regard. Since the output beam 125 and the input beam 135 may be reflected from the same scanning mirrors (e.g., polygon mirror 301 and scan mirror 302 in FIG. 3), the corresponding light-source and receiver $FOV_S$ may be scanned synchronously as the scanning mirrors scan across the field of regard. In FIGS. 6-8, the light-source FOV and the receiver FOV may be scanned synchronously so that the $FOV_L$ and $FOV_R$ have approximately the same scanning speed. Additionally, the $FOV_L$ and $FOV_R$ may follow substantially the same scan path and may maintain the same relative position with respect to one another as they are scanned. As an example, in FIG. 6, the scanning speed of the light-source field of view and the scanning speed of the receiver field of view may be approximately equal. As another example, in FIG. 7, the $FOV_L$ and $FOV_R$ may be scanned across a FOR at the same scanning speed of approximately 40,000 degrees per second (e.g., a scan line extending across a 60-degree field of regard may be scanned in approximately 1.5 milliseconds). Additionally, the relative positioning between the $FOV_L$ and $FOV_R$ (e.g., the $FOV_R$ lags behind the $FOV_L$) may be maintained throughout a scan. As another example, in FIG. 8, the $FOV_L$ and $FOV_R$ may be scanned at approximately equal scanning speeds of $10^3$ degrees/s, $10^4$ degrees/s, $10^5$ degrees/s, or any other suitable scanning speed. Additionally, the $FOV_L$ may remaining substantially centered inside the $FOV_R$ throughout a scan.

In particular embodiments, a lidar system 100 may include a light source 110 configured to emit light at one or more wavelengths between approximately 1200 nm and approximately 1400 nm. As an example, a light source 110 may emit light at a wavelength of approximately 1260 nm, 1310 nm, 1319 nm, 1342 nm, 1380 nm, or any other suitable wavelength or combination of wavelengths in the 1200-1400 nanometer wavelength range. The emitted light may be directed to a scanner 120 which scans the emitted light (e.g., output beam 125 in FIG. 1 or FIG. 3) across a FOR of the lidar system 100. A portion of the emitted light may be scattered by a target 130 located a distance D from the lidar system 100, and the lidar system 100 may include a receiver 140 configured to detect a portion of the emitted light that is scattered by the target 130. The receiver may include an APD 340 configured to detect the scattered light (e.g., input beam 135 in FIG. 1 or FIG. 3), and the APD may include an InGaAs or AlInAsSb active region configured to detect light at one or more wavelengths in the 1200-1400 nm wavelength range. The lidar system 100 may include a processor (e.g., controller 150 in FIG. 1) configured to determine the distance D based on a round-trip time for the emitted light to travel to the target 130 and back to the lidar system 100.

In particular embodiments, a lidar system 100 may be a pulsed lidar system where the emitted light from light source 110 (e.g., output beam 125 in FIG. 1 or FIG. 3) includes pulses of light. In a pulsed lidar system, the round-trip time may correspond to a time of flight for a pulse of light to travel from the lidar system 100, to the target 130, and back to the lidar system 100. A controller 150 may determine the round-trip time using one or more timer circuits configured to determine a difference in time between when a pulse of light is emitted and when scattered light from the emitted pulse is received. For example, one or more time-to-digital converters (TDCs) may be included in or coupled to the receiver 140, and the TDCs may be used to precisely time how long it takes for an emitted pulse of light to travel to and from a remote target 130. In particular embodiments, the output beam 125 of a pulsed lidar system may include pulses of light having one or more of the following optical characteristics: (1) a pulse energy between approximately 0.1 µJ and approximately 100 µJ; (2) a pulse repetition frequency between approximately 80 kHz and approximately 10 MHz; or (3) a pulse duration between approximately 0.1 ns and approximately 500 ns. As an example, a light source 110 may emit pulses of light having a pulse energy of approximately 0.5-1 µJ, a pulse repetition frequency of approximately 500-800 kHz, and a pulse duration of approximately 2-5 ns.

In particular embodiments, a lidar system 100 may be a FMCW lidar system where the emitted light from the light source 110 (e.g., output beam 125 in FIG. 1 or FIG. 3) includes frequency-modulated light. In a FMCW lidar system, a round-trip time for the emitted light to travel to a target 130 and back to the lidar system may correspond to a frequency difference between the received scattered light and a portion of the emitted light. The round-trip time T may be related to the frequency difference $\Delta f$ by the expression $T=\Delta f/m$, where m is the frequency modulation applied to the emitted light. For example, for a frequency modulation of $10^{12}$ Hz/s and a measured frequency difference of 330 kHz between the received scattered light and the emitted light, the corresponding round-trip time is approximately 330 ns (which corresponds to a distance to the target of approximately 50 m). As another example, a frequency difference of 1.33 MHz corresponds to a round-trip time of approximately 1.33 µs and a distance to the target of approximately 199.5 m.

In particular embodiments, a lidar system 100 operating at one or more wavelengths between approximately 1200 nm and approximately 1400 nm may be configured to operate in an eye-safe manner. For other lidar systems, a wavelength outside the 1200-1400 nm range may be selected as an operating wavelength (e.g., a wavelength in the 1400-1600 nm wavelength range). However, with respect to eye safety, the 1200-1400 nm wavelength range may offer some advantages over the 1400-1600 nm wavelength range. For example, the IEC 60825-1 standard for the safety of laser products may allow a Class 1 1200-1400 nm light source to emit a larger amount of average power than a 1400-1600 nm light source. In the 1200-1400 nm wavelength range, a Class 1 lidar system may be allowed to emit between approximately 15 mW and approximately 500 mW of average optical power, whereas the average optical power in the 1400-1600 nm wavelength range may be limited to a maximum of 10 mW. Depending on the operating wavelength of a 1200-1400 nm lidar system 100, the output beam 125 may include optical pulses or CW light having an average power that is limited to less than or equal to 15 mW, 50 mW, 100 mW, 200 mW, or 500 mW. For example, at 1250 nm, a Class 1 lidar system may be allowed to emit up to 15 mW of average optical power, and at 1310-1350 nm, a Class 1 lidar system may be allowed to emit up to 500 mW of average optical power.

In particular embodiments, a lidar system 100 that operates in an eye-safe manner may refer to a lidar system 100 that meets the Class 1 requirements of the IEC 60825-1 standard based at least in part on (1) the amount of average optical power in the output beam 125 and (2) the output beam 125 being scanned across a FOR of the lidar system 100. A static or non-scanned output beam 125 may exceed the Class 1 requirements, but by scanning the output beam 125 across the FOR, the Class 1 requirements may be met. For example, the average optical power requirements of the IEC 60825-1 standard may refer to a maximum average optical power as measured through a stationary 7-mm diameter aperture located a distance of 100 mm from the lidar system 100. As discussed above, a lidar system operating at 1250 nm may be limited to a maximum of 15 mW average optical power, where the average optical power is measured through a 7-mm diameter aperture located 100 mm from the lidar system. Similarly, a lidar system operating at 1310-1350 nm may be limited to a maximum of 500 mW average optical power, as measured through a 7-mm diameter aperture at a 100-mm distance. For example, a lidar system operating at 1250 nm may emit an output beam 125 with an average optical power of 300 mW. The 300-mW average power exceeds the 15-mW maximum power requirement, but since the output beam 125 is scanned across a FOR, the optical power measured through a 7-mm diameter aperture at a 100-mm distance may be significantly less than the 300-mW output power. If the 7-mm diameter aperture subtends 5% of the area of the FOR, then the average optical power measured through the aperture may be approximately 15 mW (e.g., 5% of 300 mW), and the lidar system may be referred to as an eye-safe lidar system or may be classified as a Class 1 laser product. As another example, a lidar system operating at 1342 nm may emit an output beam 125 with an average optical power of 500 mW to 2 W. By scanning the output beam 125 across a FOR, the average optical power measured through a 7-mm diameter aperture may be approximately 25 mW to approximately 100 mW, and the lidar system may be referred to as an eye-safe lidar system or may be classified as a Class 1 laser product.

In particular embodiments, a lidar system 100 may be configured to operate at a wavelength in the 1200-1400 nm wavelength range that coincides with or is located near an atmospheric absorption line. As an example, a light source 110 may be configured to emit light at a wavelength that coincides with or is located near an absorption line of water vapor, oxygen, carbon dioxide, or any other suitable atmospheric molecule. Although the emitted light may be attenuated as it travels to and from the target 130, the amount of background optical noise detected by the receiver 140 may be reduced by a larger amount. For example, if the operating wavelength of the lidar system 100 overlaps a water-vapor absorption line having an absorption coefficient of $10^{-5}$ $cm^{-1}$, then approximately 18% of the emitted light will be absorbed by water vapor when traveling to and from a target 130 located 100 m from the lidar system 100. The background optical noise from sunlight, which may travel through several kilometers of atmosphere, may be attenuated by 60% to 99% due to absorption by water vapor in the atmosphere. Although the amount of light received from the light source 110 may be reduced by 18%, the larger reduction in background optical noise may result in an overall improvement in the signal-to-noise ration of the received light.

In particular embodiments, an operating wavelength of a lidar system 100 may be selected based at least in part on an associated amount of atmospheric optical absorption. As an example, a light source 110 may be configured to operate at a wavelength in the 1200-1400 nm wavelength range having a particular amount of atmospheric optical absorption, such as for example, an absorption coefficient of approximately $10^{-4}$ $cm^{-1}$, $10^{-5}$ $cm^{-1}$, $10^{-6}$ $cm^{-1}$, or $10^{-7}$ $cm^{-1}$. As another example, the operating wavelength may be selected to avoid a particular range of wavelengths having excessive optical absorption (e.g., an absorption coefficient greater than $10^{-4}$ $cm^{-1}$) to avoid excessive attenuation of the emitted light. The operating wavelength may be selected to coincide with a wavelength having an atmospheric absorption coefficient less than a particular threshold value (e.g., an absorption coefficient less than or equal to $10^{-5}$ $cm^{-}$) to provide enough absorption to significantly attenuate background optical noise (e.g., sunlight) but also to avoid excessive attenuation of the light from the lidar system.

In particular embodiments, a lidar system 100 may include an optical filter having an optical bandpass corresponding to a wavelength of light emitted by the light source 110. An optical bandpass (which may be referred to as a pass-band) may include a range of wavelengths over which an optical filter transmits light. The optical filter may be configured to transmit light at one or more operating wavelengths of the lidar system 100 and block (e.g., reflect or absorb) light at one or more wavelengths outside of the optical bandpass. For example, a lidar system 100 may include a light source 110 that emits light at approximately 1319 nm, and the lidar system may include an optical bandpass filter with an optical transmission of greater than 80% from approximately 1317 nm to approximately 1321 nm (corresponding to a 4-nm pass-band width). Additionally, the optical filter may reflect or absorb greater than 80% of incident light in the wavelength ranges of 1000-1310 nm and 1330-1600 nm. The optical filter may prevent most background light (e.g., sunlight, light from other lidar systems, light from vehicle headlights, or other ambient sources of light) from reaching the receiver 140, which may result in a reduction of noise in the electrical signal produced by the receiver 140.

In particular embodiments, an optical filter may be included in or attached to a window of a lidar system 100 or a receiver 140 of a lidar system 100. As an example, a lidar system 100 may include a window that output beam 125 and input beam 135 pass through, and the window may include a dielectric coating that acts as an optical filter. The optical filter may transmit light at the operating wavelength of the lidar system 100 and block light at other wavelengths. As another example, the receiver 140 may include an optical filter configured to transmit the input beam 135 and prevent most background optical noise from reaching the APD 340. The optical filter may be a discrete optical element located at an input aperture of the receiver 140 or located near or attached to the APD 340. Alternatively, the optical filter may be a dielectric coating deposited onto an optical surface of the receiver 140 (e.g., deposited onto a surface of lens 330 or a surface of APD 340).

An optical filter may be substantially transmissive to light over a particular range of wavelengths (e.g., a pass-band) and may substantially block (e.g., through absorption or reflection) the transmission of light outside of the pass-band range. An optical filter may include a dichroic filter (which may be referred to as a reflective filter, thin-film filter, or interference filter) that includes a substantially transparent optical substrate (e.g., glass or fused silica) with a series of thin-film dielectric layers deposited onto a surface of the substrate. The dielectric coating may be configured to transmit light over a particular wavelength range and reflect other wavelengths of light. In particular embodiments, the pass-band of an optical filter may be matched to the operating wavelength of a light source 110. As an example, if a light source 110 emits light in a 1310-1320 nm wavelength range (e.g., the operating wavelength may change as the ambient temperature changes or as the light source ages), then the receiver 140 may include an optical filter that transmits greater than 90% of light in the 1310-1320 nm wavelength range. Additionally, the optical filter may reflect greater than 90% of light in one or more wavelength ranges outside the 1310-1320 nm pass-band range (e.g., in the 1000-1300 nm and 1330-1600 nm wavelength ranges). As another example, if a light source 110 has an emission wavelength of 1342 nm±0.4 nm, then the lidar system 100 may include an optical filter with a 2-nm pass-band centered at 1342 nm. The optical filter may transmit greater than 80% of light in the 1342 nm±1 nm wavelength range and may reflect greater than 80% of light in the 1000-1338 nm and 1346-1600 nm wavelength ranges. Additionally, in each of the wavelength regions 1338-1341 nm and 1343-1346 nm, the optical-filter transmission may transition from greater than 80% transmission to less than 20% transmission.

Figure 9:
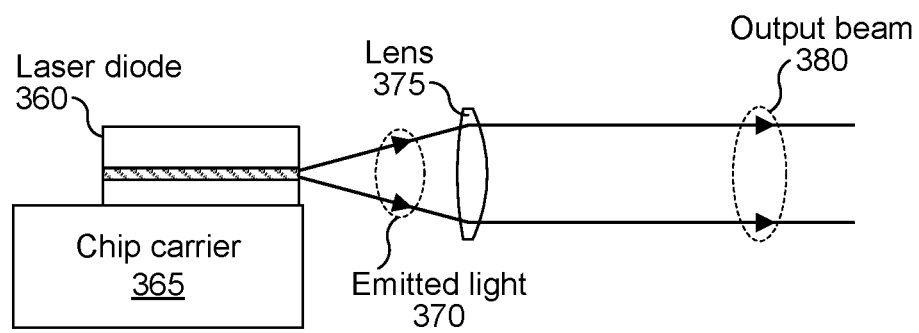
FIG. 9 illustrates an example laser diode.

FIG. 9 illustrates an example laser diode 360. The laser diode 360 illustrated in FIG. 9 produces a free-space output beam 380 and may be referred to as a free-space laser diode or a direct-emitter laser diode. The laser diode 360 is mounted on a chip carrier 365, and the emitted light 370 from the laser diode is collected by lens 375 to produce a free-space output beam 380. The chip carrier 365 may be a thermally or electrically conductive mount to which the laser diode 360 is affixed (e.g., with thermally or electrically conductive solder or epoxy). Pulsed or direct-current (DC) electrical current may be supplied to the laser diode 360 to produce pulsed or CW output light, respectively. Alternatively, a DC bias current along with a current modulation may be applied to a laser diode 360 to produce frequency-modulated light for a FMCW lidar system. In particular embodiments, the emitted light 370 from a laser diode 360 may be coupled into an optical fiber, and the laser-diode and associated optical-fiber assembly may be referred to as a fiber-coupled laser diode. For example, lens 375 may collimate the emitted light 370, and another lens (not illustrated in FIG. 9) may focus the output beam 380 into an optical fiber.

In particular embodiments, laser diode 360 or chip carrier 365 may be mounted on or thermally coupled to a heat sink or a temperature-control device. As an example, the chip carrier 365 may be thermally coupled to a heat sink, and excess heat produced in the laser diode 360 may flow to the heat sink via the chip carrier. As another example, the chip carrier 365 may be thermally coupled to a heater (e.g., to heat the laser diode 360 or to maintain the laser diode 360 at an elevated temperature) or a thermoelectric cooler (e.g., to stabilize the laser diode 360 to a particular operating temperature). A laser diode 360 may exhibit a drift in wavelength with temperature (e.g., the wavelength of the light produced by the laser diode 360 may vary with temperature by approximately +0.3 nm/° C.), and a thermoelectric cooler (TEC) may be used to maintain the laser diode 360 at a substantially constant operating temperature to reduce the amount of wavelength drift.

In particular embodiments, the emitted light 370 from a laser diode 360 may be transmitted through a beam-shaping optic configured to convert the emitted light 370 into an output optical beam 380 having a particular shape or divergence. For example, the output beam 380 may have a substantially circular, elliptical, square, or rectangular shape. As another example, the receiver FOV may have a substantially square shape, and the output beam 380 may have a corresponding light-source FOV that is also substantially square shaped. In particular embodiments, the output optical beam 380 may have a beam divergence of less than 10 mrad. As an example, the output optical beam 380 may be a collimated beam with a substantially circular cross-sectional shape and a beam divergence of approximately 3 mrad. As another example, the output optical beam 380 may have a substantially elliptical shape with a slow-axis beam divergence of approximately 2 mrad and a fast-axis beam divergence of approximately 4 mrad. In particular embodiments, a beam-shaping optic may include one or more lenses or one or more prisms. As an example, lens 375 in FIG. 9 may be referred to as a beam-shaping optic. As another example, the emitted light 370 may be transmitted through a beam-shaping optic that includes a collimating lens (e.g., lens 375) and an anamorphic prism pair (not illustrated in FIG. 9). An anamorphic prism pair may include two prisms arranged to expand or contract an optical beam along one transverse axis and leave the beam substantially unchanged along the orthogonal axis. The collimating lens may be configured to receive the emitted light 370 and produce a collimated elliptical beam, and the anamorphic prism pair may be configured to convert the elliptical beam into a substantially circular output beam 380.

In particular embodiments, the emitted light 370 from a laser diode 360 may be collected, collimated, or focused by a beam-shaping optic that includes a lens 375. The lens 375 may include any suitable type of lens, such as for example, a spherical lens (e.g., a lens having one or more concave, convex, or planar surfaces), a cylindrical lens, an aspheric lens, a gradient-index (GRIN) lens (which may be referred to as a graded-index lens), or any suitable combination thereof. As an example, lens 375 may include a spherical lens or an aspheric lens configured to produce a collimated output beam 380 having a substantially circular or elliptical shape.

In particular embodiments, due to the rectangular shape of the active area from which light is emitted from the laser diode 360, the emitted light 370 may have a substantially elliptical shape with different divergence angles along two transverse directions. For example, the emitted light 370 may have a 5°-10° divergence along a horizontal axis and a 20°-40° divergence along a vertical axis. The axis with the larger divergence may be referred to as the "fast axis," and the axis with the smaller divergence may be referred to as the "slow axis." In particular embodiments, a lens 375 may be referred to as a lens assembly and may include one, two, three, or any other suitable number of lenses configured to produce a collimated output beam 380 with a substantially elliptical or circular shape. As an example, lens 375 may include a cylindrical lens to collimate the emitted light 370 along the fast axis and a spherical lens to produce a collimated output beam 380. As another example, lens 375 may include a first cylindrical lens that collimates the emitted light 370 along the fast axis followed by a second cylindrical lens that collimates the emitted light 370 along the slow axis, and the resulting output beam 380 may have a substantially circular shape. The first cylindrical lens may be referred to as a fast-axis collimating lens, and the second cylindrical lens may be referred to as a slow-axis collimating lens.

In particular embodiments, emitted light 370 or output beam 380 may be directed through an optical isolator that transmits light in one direction and blocks light propagating in the reverse direction. The optical isolator may reduce the amount of unwanted optical feedback (e.g., reflected light from output beam 380 or back-propagating light from other light sources) that propagates back to the laser diode 360. An optical isolator may include a Faraday rotator, and the operation of the optical isolator may be based on the Faraday effect where the polarization of light traveling through the isolator is rotated in the same angular direction (e.g., clockwise or counterclockwise) regardless of the direction of travel of the light through the isolator. Back-reflected or back-propagating light that is coupled into a laser diode 360 may result in damage to the laser diode 360 or may destabilize the laser diode 360 (e.g., cause unwanted amplitude or wavelength fluctuations in the light emitted by the laser diode 360). An optical isolator may be used to reduce the amount of back-reflected or back-propagating light that is coupled into the laser diode 360 so the laser diode 360 is not damaged or destabilized. The output beam 380 may be transmitted through an optical isolator, and light propagating in the reverse direction (e.g., light from other sources, or reflected light from output beam 380) may be substantially attenuated by the isolator.

Figure 10:
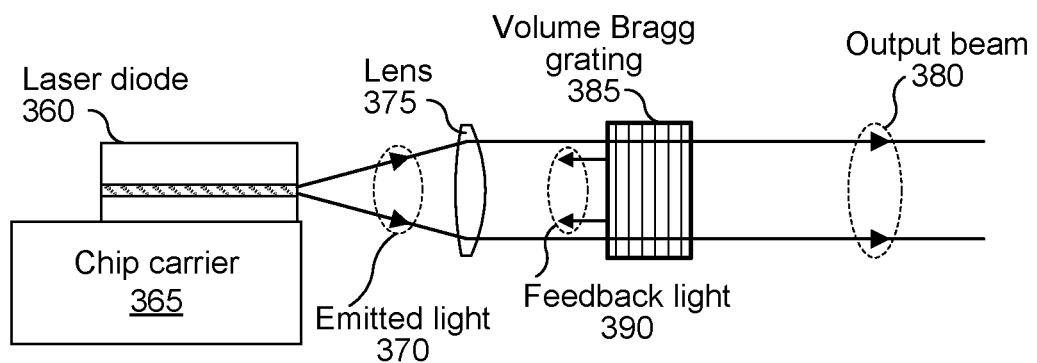
FIG. 10 illustrates an example laser diode along with an example volume Bragg grating (VBG).

FIG. 10 illustrates an example laser diode 360 along with an example volume Bragg grating (VBG) 385. In particular embodiments, a wavelength-selective optical element (e.g., a VBG, an optical filter, a diffraction grating, or a fiber Bragg grating) may be used to stabilize the operating wavelength of a laser diode 360. A VBG 385 may include a grating (e.g., a periodic refractive index variation) written into the bulk or "volume" of a transparent substrate (rather than on a surface of the substrate), and a VBG may be configured to diffract or reflect a particular narrow range of wavelengths back to the laser diode 360. An optical element (e.g., a window or lens) that reflects some percentage (e.g., 1%, 2%, or 4%) of a broad range of incident wavelengths back to the laser diode 360 may cause the laser diode 360 to become destabilized, and this unwanted destabilization may be prevented with an optical isolator. In contrast, a VBG 385 may reflect a narrow portion of the spectrum of emitted light 370 back to the laser diode 360 as feedback light 390. For example, a laser diode 360 may emit light over a 5-nm wavelength range, and a VBG 385 may be configured to send back light within an optical bandwidth of approximately 0.01 nm, 0.05 nm, 0.1 nm, or 0.5 nm. The VBG 385 may diffract back any suitable percentage of incident light (e.g., approximately 0.5%, 1%, 2%, 5%, 10%, 20%, or 50%) within the optical bandwidth of the VBG, and light at wavelengths outside the optical bandwidth of the VBG may be substantially transmitted through the VBG. The returned feedback light 390 in the narrow wavelength range may act as optical-seed light that causes the laser diode 360 to lase and emit light in the same narrow wavelength range.

In particular embodiments, a VBG 385 may be used to stabilize the wavelength of light emitted by laser diode 360 to a particular wavelength (e.g., 808 nm, 880 nm, 1310 nm, 1350 nm, or 1400 nm), and a VBG may narrow the optical bandwidth of the light emitted by the laser diode 360. In addition, a VBG 385 may reduce the temperature drift of the operating wavelength to approximately 0.1 nm/° C., 0.05 nm/° C., 0.01 nm/° C., or 0.002 nm/° C. By returning feedback light 390 in a narrow wavelength range to the laser diode 360, the laser diode 360 may be stabilized to emit light only within that narrow wavelength range. As an example, the laser-diode assembly in FIG. 9 (which does not include a VBG) may produce an output beam 380 having a central wavelength of approximately 1310 nm and an optical bandwidth of approximately 4 nm (e.g., the optical spectrum of output beam 380 may extend from approximately 1308 nm to approximately 1312 nm). Additionally, the central wavelength may drift with temperature by approximately 0.3 nm/° C. (e.g., a 10-degree increase in temperature may cause the central wavelength to shift to approximately 1313 nm). For the laser-diode assembly illustrated in FIG. 10 (which includes a VBG 385), the output beam 380 may have a central wavelength of approximately 1310 nm and an optical bandwidth of less than 0.5 nm. Additionally, the central wavelength may drift with temperature by approximately 0.01 nm/° C. (e.g., a 10-degree increase in temperature may cause the wavelength to shift by 0.1 nm to approximately 1310.1 nm).

In particular embodiments, a light source 110 of a lidar system 100 may include a direct-emitter laser diode 360 configured to emit pulses of light, CW light, or FMCW light. As an example, a direct-emitter laser diode 360 may emit optical pulses having a pulse energy of less than or equal to 0.1 µJ, 0.2 µJ, 0.5 µJ, 1 µJ, 2 µJ, 5 µJ, or 10 µJ. As another example, a direct-emitter laser diode 360 may emit light having a wavelength of approximately 1260 nm, 1310 nm, 1350 nm, 1360 nm, 1375 nm, 1380 nm, 1383 nm, or 1390 nm. The output beam 380 emitted by the laser diode 360 may be directed to a scanner 120 that scans the emitted light as output beam 125 across a FOR of the lidar system 100.

In particular embodiments, laser diode 360 may include any suitable type of laser diode configured to emit light between approximately 1200 nm and approximately 1400 nm. As an example, laser diode 360 may include a Fabry-Perot laser diode, a quantum well laser, a DBR laser, a DFB laser, a VCSEL, a quantum dot laser diode, a grating-coupled surface-emitting laser (GCSEL), a slab-coupled optical waveguide laser (SCOWL), a single-transverse-mode laser diode, a multi-mode broad area laser diode, a laser-diode bar, a laser-diode stack, or a tapered-stripe laser diode. For example, laser diode 360 may include an InGaAs or InGaAsP Fabry-Perot laser with a semiconductor waveguide structure that has two cleaved end facets forming a resonant Fabry-Perot laser cavity. A Fabry-Perot laser diode, which may be referred to as an edge-emitter laser diode, may emit light from one or both of its end facets (a facet may be referred to as an edge). As another example, laser diode 360 may include a broad area laser diode with an edge-emitting region at the front facet that has the shape of a broad, narrow stripe (e.g., the stripe may have a height of approximately 1 µm and a width of approximately 50 µm, 100 µm, 200 µm, or 400 µm). The light emitted by a broad area laser diode may be emitted as a multi-mode beam (e.g., an output beam with multiple transverse modes). As another example, laser diode 360 may include a laser-diode bar with an array of laser-diode emitters located adjacent to one another (e.g., an array of 10-50 emitters, where each emitter has a stripe width of 10-200 µm). As another example, laser diode 360 may include a laser-diode stack with two or more layers of broad area laser diodes or laser-diode bars stacked vertically on one another. As another example, laser diode 360 may include a tapered-stripe InGaAs or InGaAsP laser diode having a waveguide at one end that seeds a gain region with a tapered width that increases along the length of the device. A tapered-stripe laser diode may emit single-transverse-mode light from the end of the tapered-stripe region.

In particular embodiments, a light source 110 of a lidar system 100 may include a direct-emitter laser diode 360 and a semiconductor optical amplifier (SOA). The SOA may be configured to receive light from the laser diode 360 and amplify the received light through stimulated emission as the light propagates through the SOA waveguide. As an example, laser diode 360 may produce optical pulses with a pulse energy of approximately 0.5 nJ, and a SOA may amplify the optical pulses to a pulse energy of approximately 200 nJ, corresponding to an optical gain of approximately 26 dB. The SOA may be a separate device that receives the emitted light 370 or the output beam 380. For example, a lens may be used to focus the output beam 380 into a waveguide of the SOA. Alternatively, a SOA may be integrated with or located adjacent to the laser diode 360 so that emitted light from the laser diode is directly coupled into and through the SOA. In particular embodiments, the laser diode 360 and SOA may each be operated in pulsed or CW mode. As an example, the laser diode 360 may be pulsed (e.g., pulses of current may be applied to the laser diode to produce corresponding optical pulses), and the SOA may be operated in CW mode with a substantially constant electrical current applied to the SOA As another example, the laser diode 360 may be pulsed to produce relatively low-energy optical pulses, and current pulses may be applied to the SOA synchronously with the laser diode 360 (e.g. the two devices may be pulsed in phase and at the same repetition rate) to amplify the optical pulses. As another example, the laser diode 360 may be operated in CW mode, and the SOA may be pulsed to produce amplified optical pulses. When the SOA is off (e.g., little or no current is applied to the SOA), the CW light from the laser diode may be absorbed by the SOA, and when a current pulse is applied to the SOA, a portion of the CW light is amplified to produce an amplified optical pulse.

In particular embodiments, a lidar system 100 may include a light source 110 with a laser diode 360 and a VBG 385. The VBG 385 may ensure that the wavelength of the output beam 380 is stabilized to a particular wavelength range (e.g., 1350 nm±0.2 nm) and exhibits minimal drift with temperature (e.g., wavelength drift of less than 0.02 nm/° C.). The lidar system 100 may also include an optical filter having a pass-band corresponding to the stabilized wavelength of the output beam 380 produced by the laser diode 360. For example, the pass-band of the optical filter may be approximately equal to the wavelength range of the laser diode 360, or the pass-band of the optical filter may exceed the wavelength range of the laser diode 360 by approximately 0.1 nm, 0.2 nm, 0.5 nm, 1 nm, 2 nm, 5 nm, or 10 nm. As another example, if the wavelength of a laser diode 360 extends over a range of ±0.5 nm (e.g., due at least in part to wavelength drift or the bandwidth of light emitted by the laser diode 360), then the optical filter may have a corresponding pass-band of approximately ±0.5 nm, ±1 nm, ±2 nm, or ±4 nm.

The pass-band of an optical filter may be matched to the wavelength of the output beam 380 so that the optical filter transmits light at the stabilized wavelength of the laser diode 360 and blocks light at one or more wavelengths outside of the optical bandpass. For example, the wavelength of the output beam 380 may be stabilized to approximately 1350 nm±0.3 nm, and the optical filter may have a corresponding pass-band centered at 1350 nm (e.g., a pass-band with a width of ±0.3 nm, ±0.5 nm, ±1 nm, or ±2 nm). Additionally, the optical filter may reflect greater than 80% of light in the 1000-1348 nm and 1352-1600 nm wavelength ranges. Since the VBG 385 causes the laser diode 360 to emit light in a relatively narrow wavelength range, the pass-band of the optical filter may be correspondingly narrow. As a result, the amount of background optical noise detected by the receiver 140 may be substantially reduced compared to a lidar system having a light source without a VBG to stabilize the wavelength or without a narrowband optical filter.

In particular embodiments, laser diode 360 may be thermally coupled to a temperature-control device (e.g., a heater or a TEC). For example, a heater may be used to maintain the temperature of a laser diode 360 at or above a minimum operating temperature (e.g., 20° C., 30° C., or 40° C.). As another example, a TEC may be used to stabilize the temperature of a laser diode 360 to reduce the amount of wavelength drift of the output beam 380 as the ambient temperature varies (e.g., a TEC may be used to keep the laser-diode wavelength matched to the passband of an optical filter). In FIG. 9, the laser diode 360 may be coupled to a TEC to reduce wavelength drift with temperature by maintaining the laser-diode temperature to a particular setpoint temperature (e.g., 20° C., ° 30 C, or ° 40 C) with a particular maximum temperature variation (e.g., a temperature variation of less than ±5° C., ±1° C., ±0.5° C., or ±0.1° C.). In FIG. 10, in addition to the VBG 385 which provides wavelength stabilization, the laser diode 360 may be coupled to a TEC to provide additional reduction in wavelength drift with temperature.

In particular embodiments, a temperature-control device may be activated when an ambient temperature or a temperature of laser diode 360 increases above or decreases below a particular threshold temperature. As an example, a laser diode 360 may be coupled to a heater that is turned on when an ambient temperature or the laser-diode temperature approaches or decreases below a threshold minimum temperature (e.g., 0° C., −10° C., −20° C., −30° C., or −40° C.). The heater may heat the laser diode 360 above the threshold temperature to prevent damage to the laser diode, prevent water-vapor condensation on the laser diode, or prevent excessive wavelength drift of the output beam 380. As another example, a laser diode 360 may be coupled to a TEC that is activated when an ambient temperature or the laser-diode temperature approaches or increases above a threshold maximum temperature (e.g., 40° C., 50° C., 60° C., 70° C., or 80° C.) or approaches or decreases below a threshold minimum temperature. As another example, a laser diode 360 with a VBG 385 (e.g., as illustrated in FIG. 10) may exhibit an unwanted mode hop (e.g., a discrete change in wavelength) if an ambient temperature or the laser-diode temperature changes by a particular amount. A mode hop may cause the laser-diode wavelength to jump to a new wavelength (which may be outside the pass-band of an optical filter), or a mode hop may add unwanted optical noise to the output beam 380. To prevent the occurrence of mode hops, a laser diode 360 may be thermally coupled to a temperature-control device, and the temperature-control device may be activated if a particular temperature change occurs. For example, the laser diode 360 in FIG. 10 may operate at 1380 nm±0.5 nm when the laser-diode temperature is between 0° C. and 40° C. If the temperature decreases below 0° C. or increases above 40° C., a mode hop may occur. The laser diode 360 may be coupled to a TEC that is activated if the temperature approaches or goes beyond the 0° C. and 40° C. temperature limits. When the temperature approaches or goes beyond either temperature limit, the TEC may be activated to maintain the diode temperature within the limits and prevent a mode hop from occurring.

Figure 11:
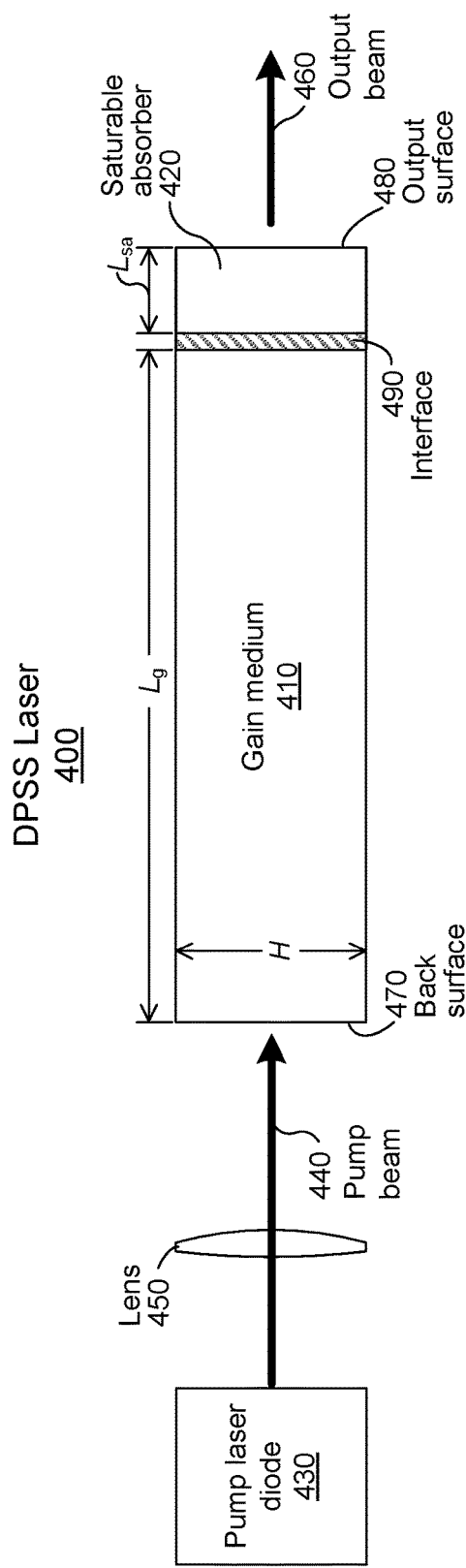
FIG. 11 illustrates an example diode-pumped solid-state (DPSS) laser that includes a gain medium and a saturable absorber.

FIG. 11 illustrates an example diode-pumped solid-state (DPSS) laser 400 that includes a gain medium 410 and a saturable absorber 420. In particular embodiments, a DPSS laser 400 may be referred to as a solid-state laser, a passively Q-switched (PQSW) laser, or a Q-switched laser. A DPSS laser 400 may include a gain medium 410 and a saturable absorber 420 and may be configured to produce pulses of light with wavelength between approximately 1200 nm and approximately 1400 nm. A DPSS laser that includes a gain medium and an active Q-switch (and does not include a saturable absorber) may be referred to as an actively Q-switched laser. An actively Q-switched laser may be configured to produce pulses of light between approximately 1200 nm and approximately 1400 nm.

In particular embodiments, a light source 110 of a lidar system 100 may include a DPSS laser 400 configured to produce a free-space output beam 460 that includes pulses of light. At least part of the output beam 460 may be directed to a scanner 120 of the lidar system 100 that scans the pulses of light as an output beam 125 across a FOR of the lidar system 100. A DPSS laser 400 may include a gain medium 410 and one or more pump laser diodes 430 configured to optically pump the gain medium 410. In particular embodiments, optical pumping (or, pumping) may refer to providing energy in the form of light to a gain medium 410. In FIG. 11, the pump laser diode 430 emits pump beam 440 which provides energy to the gain-material dopants in gain medium 410. Some or all of the dopants in the gain medium 410 may absorb light from the pump beam 440 to be "pumped" or promoted into excited energy states, and the dopants in excited states may provide optical amplification (through stimulated emission) to particular wavelengths of light propagating through the gain medium 410.

In the example of FIG. 11, the gain medium 410 is pumped by a pump laser diode 430 that produces a free-space pump beam 440. The pump beam 440 passes through a lens 450 to collimate or focus the pump-beam light, which then propagates to the gain medium 410. In particular embodiments, lens 450 may be referred to as an imaging optic and may include one or more concave, convex, or cylindrical lenses configured to collimate or focus the pump beam 440. As an example, lens 450 may focus pump beam 440 to a $1/e^2$ beam diameter of approximately 100-300 μm in gain medium 410. Light from the pump beam 440 may be absorbed by optical gain material (e.g., rare-earth ions) contained within the gain medium 410, and the excited gain material may produce optical gain (through stimulated emission) for particular wavelengths of light circulating within the optical cavity of the DPSS laser 400. The ends of the optical cavity of the DPSS laser 400 may be formed by back surface 470 and output surface 480.

In particular embodiments, a DPSS laser or a solid-state laser may refer to a laser that includes a solid-state, glass, ceramic, or crystal-based gain medium 410. As an example, the gain medium 410 of a solid-state laser may include rare-earth ions in a glass, ceramic, or crystal host material that are optically pumped to provide optical gain. In particular embodiments, the gain medium 410 may be a glass, ceramic, or crystal host material doped with rare-earth ions, such as for example, neodymium (Nd), erbium (Er), ytterbium (Yb), praseodymium (Pr), holmium (Ho), thulium (Tm), dysprosium (Dy), any other suitable rare-earth element, or any suitable combination of rare-earth elements. The rare-earth dopants (which may be referred to as gain material or as gain-material dopants) may absorb light from the pump beam 440 and provide optical gain to particular wavelengths of light that circulate within a DPSS laser cavity. Herein, reference to a rare-earth element (e.g., neodymium or erbium) may refer to an ion of that rare-earth element (e.g., trivalent neodymium ($Nd^{3+}$) or trivalent erbium ($Er^{3+}$)). As an example, a solid-state laser with a Nd:YAG gain medium may refer to a solid-state laser with a YAG host crystal that is doped with $Nd^{3+}$ ions.

In particular embodiments, a glass host material for a gain medium 410 may include any suitable glass material, such as for example, a silicate glass (e.g., fused silica or borosilicate glass) or a phosphate glass. As an example, a neodymium-doped glass gain medium 410 of a DPSS laser 400 may include a silicate or phosphate glass doped with neodymium, and the gain medium 410 may be referred to as Nd-doped glass or Nd:glass.

In particular embodiments, a crystalline host material for a gain medium 410 may include any suitable member of the garnet, perovskite, vanadate, tungstate, borate, phosphate, or fluoride crystal families. For example, a crystalline host material for a gain medium 410 may include: yttrium aluminum garnet ($Y_3Al_5O_{12}$, which may be referred to as YAG); gadolinium gallium garnet ($Gd_3Ga_5O_{12}$, which may be referred to as GGG); yttrium scandium gallium garnet ($Y_3Sc_2Ga_3O_{12}$, which may be referred to as YSGG); gadolinium scandium gallium garnet ($Gd_{3-x}Sc_{2-y}Ga_{3+x+y}O_{12}$, which may be referred to as GSGG); gadolinium yttrium scandium gallium garnet (which may be referred to as GYSGG); yttrium aluminum perovskite ($YAlO_3$, which may be referred to as YAP); yttrium orthovanadate ($YVO_4$, which may be referred to as yttrium vanadate); gadolinium orthovanadate ($GdVO_4$, which may be referred to as gadolinium vanadate); potassium gadolinium tungstate ($KGd(WO_4)_2$, which may be referred to as KGW); potassium yttrium tungstate ($KY(WO_4)_2$, which may be referred to as KYW); lanthanum scandium borate ($LaSc_3(BO_3)_4$, which may be referred to as LSB); yttrium aluminum borate ($YAl_3(BO_3)_4$, which may be referred to as YAB); yttrium calcium oxyborate ($YCa_4O(BO_3)_3$, which may be referred to as YCOB); gadolinium calcium oxyborate ($GdCa_4O(BO_3)_3$, which may be referred to as GdCOB); strontium fluoride phosphate ($Sr_5(PO_4)_3F$); or yttrium lithium fluoride ($LiYF_4$, which may be referred to as YLF).

In particular embodiments, a gain medium 410 of a DPSS laser 400 may include a crystalline host material doped with 0.1% to 5% neodymium (e.g., the gain medium 410 has a 0.1% to 5% dopant density). As an example, a Nd:YAG gain medium 410 of a DPSS laser 400 may include a YAG crystal doped with approximately 1.5% Nd, which may be referred to as 1.5 atomic-percent doping (e.g., approximately 1.5% of the yttrium ions in the YAG crystal are replaced with neodymium ions). In particular embodiments, a DPSS laser 400 with a neodymium-doped gain medium 410 may be configured to emit pulses of light at any suitable wavelength between approximately 1200 nm and approximately 1400 nm. As an example, a Nd:YAG DPSS laser 400 may be configured to emit light at approximately 1319 nm, 1320 nm, 1333 nm, 1335 nm, 1338 nm, or 1339 nm. A DPSS laser 400 that emits light at approximately 1319 nm may refer to a DPSS laser 400 that emits light at one or more wavelengths between 1318.5 nm and 1319.5 nm or between 1318 nm and 1320 nm. As another example, a gain medium 410 of a DPSS laser 400 may include a Nd-doped $YVO_4$ crystal, and the Nd:$YVO_4$ DPSS laser 400 may be configured to emit light at approximately 1342 nm. A DPSS laser 400 that emits light at approximately 1342 nm may refer to a DPSS laser 400 that emits light at one or more wavelengths between 1341.5 nm and 1342.5 nm or between 1341 nm and 1343 nm. As another example, a DPSS laser 400 with a Nd:$GdVO_4$ gain medium 410 may be configured to emit light at approximately 1341 nm. As another example, a DPSS laser 400 with a Nd:YAP gain medium 410 may be configured to emit light at approximately 1340 nm. As another example, a DPSS laser 400 with a Nd:LSB gain medium 410 may be configured to emit light at approximately 1348 nm. As another example, a DPSS laser 400 with a Nd:$Sr_5(PO_4)_3F$ gain medium 410 may be configured to emit light at approximately 1328 nm. As another example, a DPSS laser 400 with a Nd:GYSGG gain medium 410 may be configured to emit light at approximately 1324 nm, 1331 nm, or 1337 nm. As another example, the gain medium 410 of a DPSS laser 400 may include: neodymium-doped GGG (Nd:GGG); neodymium-doped YSGG (Nd:YSGG); neodymium-doped GSGG (Nd:GSGG); neodymium-doped KGW (Nd:KGW); neodymium-doped KYW (Nd:KYW); neodymium-doped YAB (Nd:YAB); neodymium-doped YCOB (Nd:YCOB); neodymium-doped GdCOB (Nd:GdCOB); or neodymium-doped YLF (Nd:YLF).

A gain medium 410 of a DPSS laser 400 may have any suitable length $L_g$, any suitable height H, and any suitable width. As an example, a gain medium 410 may have a length $L_g$ of between approximately 1 mm and approximately 30 mm, and a gain medium 410 may have a height H or a width of between approximately 0.5 mm and approximately 10 mm. As another example, a gain medium 410 may include a Nd-doped YAG crystal, and the YAG crystal may have a length $L_g$ of approximately 3.0 mm, a height H of approximately 2.0 mm, and a width of approximately 1.5 mm. A saturable absorber 420 may have any suitable length $L_{sa}$, such as for example, a length of approximately 0.05 mm, 0.1 mm, 0.2 mm, 0.3 mm, 0.5 mm, 1 mm, 2 mm, 5 mm, or 10 mm. As an example, a Nd:YAG gain medium 410 may have a length $L_g$ of approximately 2-6 mm, and a V:YAG saturable absorber 420 may have a length $L_{sa}$ of approximately 0.1-1 mm. A gain medium 410 or a saturable absorber 420 may have any suitable cross-sectional shape, such as for example, a square, rectangular, or circular cross-sectional shape. As an example, a gain medium may have a substantially circular cross-sectional shape with a diameter of approximately 2-5 mm.

In particular embodiments, a gain medium 410 of a DPSS laser 400 may include a single-crystal fiber (SCF). A SCF may refer to a rod of a crystalline material that is doped with a gain material. A SCF may include any suitable member of the garnet, perovskite, vanadate, tungstate, borate, phosphate, or fluoride crystal families doped with any suitable rare-earth ions. For example, a SCF may include a rod of YAG crystal doped with neodymium (e.g., a Nd:YAG SCF), a rod of yttrium vanadate doped with neodymium (e.g., a Nd:YVO$_4$ SCF), or any other suitable crystalline material doped with neodymium. A SCF may have a substantially circular cross section with a diameter between approximately 25 µm and approximately 1.5 mm and a length between approximately 1 mm and approximately 1 m. For example, the gain medium 410 of a DPSS laser 400 may include a Nd:YAG SCF with a 25-100 µm diameter and a 5-20 mm length. A DPSS laser 400 with a Nd:YAG SCF gain medium 410 may be configured to emit an output beam 460 that includes pulses of light with a wavelength of approximately 1319 nm. A DPSS laser 400 with a Nd:YVO$_4$ SCF gain medium 410 may be configured to emit an output beam 460 that includes pulses of light with a wavelength of approximately 1342 nm.

In particular embodiments, a SCF may provide for confinement or guiding of pump light or light emitted by the gain material. For example, a pump beam 440 coupled into a 25-100 µm diameter SCF may be confined by total internal reflection to propagate within the SCF. Additionally, thermal lensing in the SCF or a gradient refractive index profile of the SCF may also provide for confinement or guiding of the pump light or the light emitted by the gain material. Confining the pump beam 440 so that it propagates within the SCF may reduce the divergence of the pump beam 440, and the brightness of the pump beam 440 may be effectively increased relative to a pump beam 440 that propagates without confinement. Additionally, confining the pump beam 440 may allow the length of a SCF to be longer than the length $L_g$ of a corresponding bulk gain medium 410. For example, due to the divergence of the pump beam 440 in a bulk gain medium 410, the length of a bulk gain medium may be limited to approximately 3-5 mm, while the length of a SCF may be approximately 8-20 mm since the SCF effectively reduces the divergence of the pump beam. In particular embodiments, a SCF may include dopants that are distributed substantially uniformly across a cross section of the SCF, or a SCF may have a dopant density concentrated near the center of the SCF (e.g., the dopant density may be relatively high near the center and may taper off toward the outer edge).

In particular embodiments, a lidar system 100 may include a DPSS laser 400 configured to emit an output beam 460 that includes pulses of light. As an example, a DPSS laser 400 may generate optical pulses at a wavelength between approximately 1200 nm and approximately 1400 nm, and the DPSS laser 400 may be part of a light source 110 of a lidar system 100 that performs pulsed lidar measurements. In particular embodiments, the optical pulses produced by a DPSS laser 400 may have optical characteristics that include one or more of the following: a pulse energy between approximately 0.1 µJ and approximately 100 µJ (e.g., approximately 0.1 µJ, 0.2 µJ, 0.5 µJ, 1 µJ, 2 µJ, 5 µJ, 10 µJ, 20 µJ, 50 µJ, or 100 µJ); a pulse repetition frequency between approximately 80 kHz and approximately 10 MHz (e.g., approximately 80 kHz, 100 kHz, 200 kHz, 500 kHz, 750 kHz, 1 MHz, 2 MHz, 5 MHz, or 10 MHz); a pulse duration between approximately 0.1 ns and approximately 500 ns (e.g., approximately 0.1 ns, 0.2 ns, 0.5 ns, 1 ns, 2 ns, 5 ns, 10 ns, 20 ns, 50 ns, 100 ns, 200 ns, or 500 ns); a duty cycle less than or equal to 5% (e.g., approximately 0.001%, 0.005%, 0.01%, 0.02%, 0.05%, 0.1%, 0.2%, 0.5%, 1%, or 5%); a peak pulse power greater than or equal to 1 watt (e.g., approximately 1 W, 10 W, 50 W, 100 W, 200 W, 500 W, 1 kW, 2 kW, 10 kW, 50 kW, or 100 kW); an average power less than or equal to 10 mW, 20 mW, 50 mW, 100 mW, 200 mW, or 500 mW; or an operating wavelength of between approximately 1200 nm and approximately 1400 nm. As an example, a DPSS laser 400 may produce an output beam 460 with a pulse repetition frequency between approximately 200 kHz and approximately 800 kHz, and the pulses may have a pulse duration between approximately 1 ns and approximately 5 ns. As another example, a DPSS laser 400 may produce pulses with a pulse repetition frequency of approximately 100 kHz and a pulse duration of approximately 2 ns, corresponding to a duty cycle of approximately 0.02%. (A duty cycle may be determined from a ratio of pulse duration to pulse period or from a product of pulse duration and pulse repetition frequency.) As another example, a DPSS laser 400 may produce pulses with a pulse repetition frequency of approximately 500 kHz and a pulse duration of approximately 4 ns, corresponding to a duty cycle of approximately 0.2%. As another example, a DPSS laser 400 may produce pulses with a pulse duration of approximately 1 ns and a pulse energy of approximately 1 µJ, which corresponds to pulses with a peak power of approximately 1 kW. (A peak power of a pulse may be determined from a ratio of pulse energy to pulse duration.) As another example, a DPSS laser 400 may produce pulses with a pulse energy of approximately 0.5 µJ and a pulse repetition frequency of approximately 400 kHz, corresponding to an average power of approximately 200 mW. (An average power may be determined from a product of pulse energy and pulse repetition frequency.) As another example, a DPSS laser 400 may produce pulses with a wavelength of approximately 1319 nm, 1320 nm, 1324 nm, 1331 nm, 1328 nm, 1340 nm, 1341 nm, 1342 nm, or 1348 nm. As another example, a DPSS laser 400 may produce pulses within a wavelength range of approximately 1200-1400 nm, 1300-1400 nm, 1300-1350 nm, or 1310-1350 nm.

In particular embodiments, gain medium 410 may be doped with neodymium, and a DPSS laser 400 may include one or more pump lasers 430 configured to produce pump light to optically pump the neodymium dopants. The wavelength of the pump light may coincide with an absorption line or absorption feature of the neodymium dopants in the gain medium so that the pump light is efficiently absorbed by the neodymium dopants. In particular embodiments, each pump laser 430 used to pump a gain medium 410 may have an operating wavelength between approximately 730 nm and approximately 900 nm. As an example, a neodymium-doped gain medium 410 may be pumped by one or more laser diodes operating at one or more respective pump-laser wavelengths between approximately 730 nm and approximately 900 nm. As another example, a pump laser 430 may produce a pump beam 440 having one or more wavelengths of approximately 735 nm, 750 nm, 796 nm, 805 nm, 808 nm, 810 nm, 820 nm, 840 nm, 860 nm, 870 nm, 880 nm, 890 nm, or any other suitable pump-laser wavelength that coincides with an absorption line or absorption feature of neodymium dopants in a gain medium 410. As another example, a pump laser 430 operating at approximately 808 nm or 869 nm may be used to pump a Nd:YAG crystal, and the DPSS laser 400 may produce an output beam 460 with a wavelength of approximately 1319 nm. As another example, a pump laser 430 operating between approximately 805 nm and approximately 811 nm may be used to pump a Nd:YVO$_4$ crystal, and the DPSS laser 400 may produce an output beam 460 with a wavelength of approximately 1342 nm.

In particular embodiments, pump laser 430 may include a temperature-control device to stabilize the temperature of the pump laser, which in turn may stabilize the wavelength of pump beam 440. As an example, a temperature-stabilized pump laser 430 with an 808-nm output wavelength may be used to pump a Nd:YAG gain medium 410. Since the Nd dopants in a Nd:YAG gain medium 410 have a relatively narrow absorption band near 808 nm, the 808-nm pump laser 430 may be temperature stabilized to ensure that the 808-nm output wavelength is maintained. For example, the pump laser 430 may be temperature stabilized so the output wavelength varies by less than or equal to ±2 nm, ±1 nm, ±0.5 nm, or ±0.1 nm. In particular embodiments, a pump laser 430 may be temperature stabilized using a heater or a thermoelectric cooler (TEC). As an example, a heater may be used to maintain the pump laser 430 at an elevated temperature or to prevent the pump laser temperature from decreasing below a threshold minimum temperature. As another example, a pump laser 430 may be temperature stabilized using a TEC, a temperature sensor, and a temperature-stabilization circuit, and the pump-laser temperature may be stabilized to within any suitable value of a set-point temperature (e.g., within ±10° C., ±5° C., ±1° C., ±0.5° C., or ±0.1° C. of a set-point temperature). The temperature-stabilization circuit may monitor the temperature sensor and adjust the current supplied to the TEC to maintain the pump laser 430 at the set-point temperature.

In particular embodiments, pump laser 430 may include one or more laser diodes with one or more corresponding VBGs configured to stabilize the wavelength of light produced by each of the laser diodes. In FIG. 11, the pump laser diode 430 may include a laser diode and a VBG configured to stabilize the wavelength of the emitted pump beam 440. For example, pump laser diode 430 may include a VBG that stabilizes the wavelength of pump beam 440 to approximately 808 nm, and the wavelength of pump beam 440 may vary with temperature by less than approximately 0.1 nm/° C., 0.05 nm/° C., 0.01 nm/° C., or 0.002 nm/° C.

In particular embodiments, a pump laser diode 430 with a VBG may include a temperature-control device. The temperature-control device may include a TEC configured to maintain the pump-laser temperature at a particular set-point temperature. Alternatively, a temperature-control device may be activated if an ambient temperature or a temperature of the pump laser diode 430 increases above or decreases below a particular threshold temperature. For example, a pump laser diode 430 may be coupled to a heater that is turned on when a temperature of the pump laser diode 430 approaches or decreases below a threshold minimum temperature. As another example, a pump laser diode 430 may be coupled to a TEC that is activated when an ambient temperature or the laser-diode temperature approaches or increases above a threshold maximum temperature or approaches or decreases below a threshold minimum temperature. In particular embodiments, a temperature-control device may be activated to maintain a pump laser diode 430 within particular temperature limits to prevent the pump laser from exhibiting a mode hop. For example, a pump laser diode 430 with a VBG may operate at 808.5 nm±0.2 nm when the laser-diode temperature is between 10° C. and 40° C. If the temperature decreases below 10° C. or increases above 40° C., a mode hop may occur. To prevent a mode hop from occurring, the pump laser diode 430 may be coupled to a TEC that is activated if the temperature approaches or goes beyond the 10° C. and 40° C. temperature limits.

In particular embodiments, one or more pump lasers 430 may be configured to produce a pump beam 440 having any suitable optical power, such as for example, an average optical power of greater than or equal to 1 W, 2 W, 5 W, 10 W, 15 W, or 20 W. Additionally, the optical gain material in the gain medium 410 may absorb any suitable amount of light from the pump beam 440, such as for example, greater than or equal to 50%, 60%, 70%, 80%, 90%, or 95% of the pump-beam light. As an example, the pump beam 440 may have a power of 5 watts, and greater than 80% of the pump beam 440 (e.g., greater than 4 W) may be absorbed by the gain material while making a single pass through the gain medium 410, and less than 20% (e.g., less than 1 W) of the incident pump beam may reach the interface 490. In particular embodiments, pump laser 430 may be operated in CW or pulsed mode. For example, a pump laser diode 430 may be supplied with a substantially fixed bias current so that the pump laser 430 produces a CW pump beam 440, and the DPSS laser 400 may emit an output beam 460 that includes optical pulses. As another example, a pump laser diode 430 may be pulsed at a particular repetition rate (e.g., 400 kHz), and the DPSS laser 400 may emit optical pulses at substantially the same repetition rate.

In particular embodiments, pump laser 430 may include any suitable type of laser diode, such as for example, a Fabry-Perot laser diode, a single-transverse-mode laser diode (e.g., a Fabry-Perot laser diode that emits light into a single transverse mode), a broad area laser diode, a laser-diode bar, a laser-diode stack, a grating-coupled surface-emitting laser (GCSEL), a slab-coupled optical waveguide laser (SCOWL), a tapered-stripe laser diode, a vertical-cavity surface-emitting laser (VCSEL), or a vertical-external-cavity surface-emitting laser (VECSEL). A GCSEL device may include a semiconductor laser in which light oscillates in the horizontal plane of the device, and a grating scatters some of the light vertically to emit an output beam from a top or bottom surface of the GCSEL. A SCOWL device may include a ridge gain region located above a slab waveguide. The SCOWL may emit a substantially single-mode output beam, since the higher-order transverse modes in a SCOWL may be prevented from oscillating by being coupled to the slab waveguide.

A VCSEL may refer to a semiconductor laser diode where light is emitted perpendicular to the semiconductor substrate surface. A VCSEL may include two mirrors (e.g., Bragg reflectors) incorporated into the VCSEL structure, where the two mirrors are located on either side of the VCSEL gain region and form a resonant optical cavity of the VCSEL. Each of the mirrors may be a dielectric mirror (e.g., a mirror formed by thin films of dielectric material deposited onto a surface of the VCSEL) or a semiconductor-based mirror formed by layers of semiconductor material having alternating refractive indices. A VECSEL (which may be referred to as an extended-cavity vertical-cavity surface-emitting laser, or EC-VCSEL) may refer to a VCSEL-type semiconductor laser diode with the resonant cavity formed by one mirror incorporated into a VCSEL structure and a second mirror located external to the VCSEL structure. The external mirror may be configured to reflect light at an operating wavelength of the VECSEL, and the external mirror may act as an output coupler from which the pump beam 440 is emitted. The spacing between the VCSEL structure and the external mirror may be any suitable distance, such as for example, approximately 0.01 mm, 0.1 mm, 1 mm, 2 mm, 5 mm, 10 mm, 20 mm, or 50 mm. The external mirror of a VECSEL may be a dielectric mirror or a VBG. In particular embodiments, a VCSEL or a VECSEL device may exhibit a wavelength drift with temperature of less than approximately 0.1 nm/° C., 0.05 nm/° C., or 0.01 nm/° C. As an example, a VECSEL device operating at approximately 808 nm may exhibit a temperature drift of approximately 0.065 nm/° C. so that over a 30-degree temperature change, the wavelength may change by less than 2 nm.

In particular embodiments, pump laser 430 may be a VECSEL, and the external mirror of the VECSEL may be formed by the back surface 470 of gain medium 410. As an example, back surface 470 may act as a cavity mirror of the pump laser 430 and as a cavity mirror of the DPSS laser 400. For example, back surface 470 may have a dielectric coating with a high reflectivity at an operating wavelength of the DPSS laser 400 and a partial reflectivity or high reflectivity at an operating wavelength of the pump laser 430. Light emitted by the VECSEL may be directly coupled from the VECSEL into the gain medium 410 of the DPSS laser 400. In particular embodiments, pump laser 430 may be a VECSEL, and the external mirror of the VECSEL may be bonded to the back surface 470 of the gain medium 410. As an example, the external mirror may be attached or coupled to the back surface 470 by adhesive or epoxy bonding, optical contacting, diffusion bonding, chemically activated direct bonding, or any other suitable bonding technique.

In particular embodiments, a pump laser 430 may include a seed laser diode followed by a SOA. The SOA may be configured to receive pulsed or CW seed light from the laser diode and amplify the seed light as it propagates through the SOA waveguide. For example, a pump laser 430 may include a seed laser diode that operates at approximately 808 nm, and the 808-nm seed light may be amplified by a SOA. A seed laser diode may be configured to emit pulses of light or CW light. A seed laser diode may include a VBG to stabilize its operating wavelength, or a seed laser diode may include a temperature-control device to stabilize the temperature of the seed laser diode (which in turn may stabilize the operating wavelength).

In particular embodiments, pump laser 430 may be a free-space laser (e.g., a laser that directly produces a free-space pump beam 440) or a fiber-coupled laser. A fiber-coupled pump laser 430 may produce light that is coupled or directed to an optical fiber, and the optical fiber may be terminated by a collimator or lens assembly that produces a free-space pump beam 440 which is directed to gain medium 410. In particular embodiments, the gain medium 410 may be side-pumped or end-pumped by the pump laser 430. As an example, for a side-pumping arrangement, the pump beam 440 may enter the gain medium 410 through a side surface of the gain medium 410 and may be directed substantially orthogonal to the axis along which light propagates within the DPSS laser cavity. In the example of FIG. 11, the pump laser 430 is configured in an end-pumping arrangement where the pump beam 440 enters the gain medium 410 through an end surface (e.g., back surface 470) of the gain medium 410, and the pump beam 440 propagates along a direction that is substantially parallel to the propagation axis of light within the DPSS laser cavity.

In particular embodiments, a DPSS laser 400 may be a passively Q-switched laser that includes a saturable absorber 420. In particular embodiments, saturable absorber 420 of a DPSS laser 400 may include a vanadium-doped crystal. A vanadium-doped crystal may refer to a crystal host material that is doped with vanadium ions (e.g., $V^{3+}$). For example, saturable absorber 420 may include any suitable member of the garnet, perovskite, vanadate, tungstate, borate, phosphate, or fluoride crystal families doped with vanadium. As another example, saturable absorber 420 may include vanadium-doped YAG ($V^{3+}$:YAG, which may be referred to as V:YAG), vanadium-doped GGG (V:GGG), vanadium-doped YSGG (V:YSGG), vanadium-doped GSGG (V:GSGG), vanadium-doped GYSGG (V:GYSGG), vanadium-doped YAP (V:YAP), vanadium-doped yttrium orthovanadate (V:YVO$_4$), vanadium-doped gadolinium orthovanadate (V:GdVO$_4$), vanadium-doped KGW (V:KGW), vanadium-doped KYW (V:KYW), vanadium-doped LSB (V:LSB), vanadium-doped YAB (V:YAB), vanadium-doped YCOB (V:YCOB), vanadium-doped GdCOB (V:GdCOB), vanadium-doped strontium fluoride phosphate (V: $Sr_5(PO_4)_3F$), or vanadium-doped YLF (V:YLF).

In particular embodiments, saturable absorber 420 of a DPSS laser 400 may include chromium-doped YAG ($Cr^{4+}$:YAG, which may be referred to as Cr:YAG), cobalt-doped zinc selenide ($Co^{2+}$:ZnSe, which may be referred to as Co:ZnSe), cobalt-doped MgAl$_2$O$_4$ ($Co^{2+}$:spinel, which may be referred to as Co:spinel), neodymium-doped strontium fluoride ($Nd^{2+}$:SrF$_2$, which may be referred to as Nd:SrF$_2$), lithium fluoride with $F_2^-$ color centers (LiF:F$_2^-$), glass doped with lead-sulfide (PbS) quantum dots, or a semiconductor saturable absorber mirror (SESAM). A SESAM (which may be referred to as a saturable absorber mirror, or SAM) may include a semiconductor mirror structure (e.g., a Bragg reflector) located under a semiconductor absorber layer that acts as a saturable absorber.

In the example of FIG. 11, gain medium 410 is located on the pump side of the DPSS laser 400 (e.g., the gain medium 410 is configured to receive the pump beam 440), and saturable absorber 420 is located on the output side of the DPSS laser 400 (e.g., the output beam 460 exits the DPSS laser 400 from output surface 480 of the saturable absorber 420). In particular embodiments, a DPSS laser 400 may produce optical pulses through a passive Q-switching process provided by an optical interaction between gain medium 410 and saturable absorber 420. A saturable absorber 420 may include an optical material that becomes more optically transparent as the intensity of light incident on the saturable absorber 420 increases (e.g., the optical loss of the saturable absorber 420 decreases as incident light intensity increases). As an example, the dopant vanadium ions in a V:YAG saturable absorber 420 may absorb at least a portion of the light emitted by the gain material of gain medium 410. This absorption process promotes vanadium ions into excited states and depletes the number of ground-state vanadium ions available to absorb additional light emitted by gain medium 410. As the number of available vanadium ions in a ground state is depleted, the optical loss of the V:YAG saturable absorber 420 decreases, which corresponds to an increase in optical transmission. This process in which a saturable absorber 420 absorbs light and becomes more optically transparent may be referred to as bleaching or saturation of the saturable absorber.

In particular embodiments, for relatively low optical intensities, a saturable absorber 420 may be relatively absorbing or opaque (e.g., the saturable absorber 420 may have a relatively high optical loss), and for relatively high optical intensities, a saturable absorber 420 may be relatively transparent (e.g., the saturable absorber 420 may have a relatively low optical loss). As an example, when a saturable absorber 420 is exposed to an optical intensity of less than or equal to a particular saturation intensity (e.g., the saturable absorber 420 is in a substantially unbleached or unsaturated state), the saturable absorber 420 may absorb greater than or equal to 50%, 70%, 80%, or 90% of incident light emitted by the gain material of gain medium 410 (e.g., the saturable absorber 420 may have a transmission of less than or equal to 50%, 30%, 20%, or 10%). When exposed to an optical intensity of greater than or equal to the saturation intensity (e.g., the saturable absorber 420 is substantially bleached or saturated), a saturable absorber 420 may absorb less than or equal to 50%, 25%, 10%, 5%, or 1% of the incident light (e.g., the saturable absorber 420 may have a transmission of greater than or equal to 50%, 75%, 90%, 95%, or 99%).

In particular embodiments, the energy required to bleach a saturable absorber 420 may depend on the thickness $L_{sa}$ or the dopant density of the saturable-absorber material. A saturable absorber 420 may have any suitable saturation intensity, such as for example, a saturation intensity of approximately 1 kW/cm$^2$, 10 kW/cm$^2$, 100 kW/cm$^2$, 1 MW/cm$^2$, 10 MW/cm$^2$, or 100 MW/cm$^2$. As an example, a V:YAG saturable absorber 420 may have a saturation intensity of 3-4 MW/cm$^2$. In particular embodiments, a saturable absorber 420 of a DPSS laser 400 may absorb light at a wavelength corresponding to an operating wavelength of the DPSS laser 400. As an example, a V:YAG saturable absorber 420 may absorb light from approximately 1000 nm to approximately 1450 nm, which covers the 1200-1400 nm wavelength range of the DPSS laser 400. A V:YAG saturable absorber 420 may have an unbleached absorption coefficient (e.g., an absorption coefficient when operating in an unbleached state) of between approximately 5 cm$^{-1}$ and approximately 10 cm$^{-1}$ for one or more wavelengths between approximately 1200 nm and approximately 1400 nm.

In particular embodiments, a saturable absorber 420 may be referred to as a Q-switch or a passive Q-switch, and the saturable absorber may allow a DPSS laser 400 to produce optical pulses through a Q-switching process. Q-switching refers to a technique for producing optical pulses by changing the optical loss (and thus the Q factor, or quality factor) of a laser cavity. The unbleached optical loss introduced by a saturable absorber 420 corresponds to a reduction in the Q factor of the laser cavity (e.g., an increase in optical loss). As the saturable absorber 420 is bleached, the Q factor increases (corresponding to a reduction in optical loss). The saturable absorber 420 acts as a variable attenuator that prevents the DPSS laser 400 from lasing when the optical intensity in the laser cavity is relatively low. As the optical intensity in the laser cavity increases (as a result of the pump beam 440 exciting the gain material of gain medium 410), the saturable absorber 420 becomes more transparent and is bleached (e.g., the optical-cavity loss decreases), and at a particular point after the optical-cavity gain exceeds the loss, the DPSS laser 400 may emit an optical pulse. After the pulse is emitted, the saturable absorber 420 returns to an unbleached state (with relatively high optical loss), and the Q-switching process repeats periodically, resulting in the DPSS laser 400 emitting an output beam 460 that includes a series of Q-switched optical pulses.

In particular embodiments, a saturable absorber 420 may have a recovery time (which may be referred to as a relaxation time) that represents a time constant for the saturable absorber to recover from a bleached state to an unbleached state. After a pulse is emitted, the optical transmission of a saturable absorber 420 may recover or relax back to an unbleached state in a duration of time based on the characteristic recovery time. As an example, a DPSS laser 400 may include a saturable absorber 420 with a recovery time of less than 100 ns. Approximately 100 ns after a pulse is emitted, less than 37% of the absorbers (e.g., vanadium ions) in a saturable absorber may remain in a saturated state, and greater than 63% of the absorbers may have returned to an unbleached state. A saturable absorber 420 that includes a vanadium-doped crystal may have a recovery time of less than 100 ns. For example, a V:YAG saturable absorber may have a recovery time of approximately 22 ns (e.g., approximately 100 ns after a pulse is emitted, greater than 98.9% of the vanadium ions may have returned to an unbleached state). The relatively fast recovery time of a vanadium-doped saturable absorber 420 may allow a DPSS laser 400 to emit pulses at a relatively high pulse repetition frequency (e.g., greater than 80 kHz). For example, a passively Q-switched DPSS laser 400 with a vanadium-doped saturable absorber may emit optical pulses at a repetition rate of approximately 400 kHz. Additionally, a vanadium-doped saturable absorber, which may act as a saturable absorber over a wavelength range of approximately 1000-1450 nm, may be suited for use in a DPSS laser 400 configured to operate between approximately 1200 nm and approximately 1400 nm.

For a DPSS laser 400 operating in the 1200-1400 nm wavelength range at a relatively high repetition rate, a vanadium-doped saturable absorber may be selected (rather than some other saturable absorber, such as for example Cr:YAG or Co:spinel) based on the wavelength range over which the vanadium-doped material acts as a saturable absorber (e.g., approximately 1000-1450 nm) and based on its relatively fast recovery time (e.g., less than 100 ns). Other DPSS lasers may use saturable absorbers that do not include vanadium, however, these non-vanadium-based saturable absorbers may not provide operation at a desired repetition rate or at a desired wavelength range. For example, a Co:spinel saturable absorber may have a relatively long recovery time of 10-50 μs. As a result of the longer recovery time, a DPSS laser with a Co:spinel saturable absorber may exhibit a lower repetition rate (e.g., a repetition rate of less than 80 kHz) than a DPSS laser with a vanadium-doped saturable absorber (e.g., V:YAG). As another example, a Cr:YAG saturable absorber may operate as a saturable absorber around 900-1100 nm, but a Cr:YAG saturable absorber may not act as a saturable absorber in the 1200-1400 nm wavelength range.

In particular embodiments, a Q-switched laser may be passively Q-switched or actively Q-switched. A passively Q-switched laser may include a passive Q-switch (e.g., saturable absorber 420), and an actively Q-switched laser may include an active Q-switch, such as for example, an acousto-optic modulator (AOM) or an electro-optic modulator (EOM). An actively Q-switched DPSS laser may include an active Q-switch and may not include a saturable absorber. An active Q-switch, which may take the place of a saturable absorber, may refer to an electrically driven device that provides controllable optical loss in a laser cavity. As an example, an actively Q-switched laser may include a gain medium 410 (e.g., Nd:YAG) pumped by a pump laser 430 and an AOM or EOM that acts as an active Q-switch.

In particular embodiments, a DPSS laser 400 may include a neodymium-doped gain medium 410 and a vanadium-doped saturable absorber 420, and the DPSS laser may be configured to generate optical pulses at any suitable wavelength between approximately 1200 nm and approximately 1400 nm. As an example, gain medium 410 may include Nd:YAG, Nd:YVO$_4$, Nd:YSGG, Nd:GSGG, Nd:YAP, Nd:YAB, Nd:YLF, or Nd:glass, and saturable absorber 420 may include V:YAG. A neodymium-doped gain medium 410 may be a bulk crystal (e.g., a substantially cylindrical or rectangular crystal having sides with lengths between approximately 0.5 mm and approximately 10 mm) or a SCF. As another example, a DPSS laser 400 may include a Nd:YAG gain medium 410 and a V:YAG saturable absorber 420, and the DPSS laser may emit pulses of light at a wavelength between approximately 1200 nm and approximately 1400 nm (e.g., approximately 1319 nm). As another example, a DPSS laser 400 may include a Nd:YVO$_4$ gain medium 410 and a V:YAG saturable absorber, and the DPSS laser may emit pulses of light at a wavelength between approximately 1200 nm and approximately 1400 nm (e.g., approximately 1342 nm). As another example, a DPSS laser 400 with a Nd:YAG gain medium 410 and a V:YAG saturable absorber 420 may produce an output beam 460 with optical pulses having a wavelength of approximately 1319 nm (e.g., the operating wavelength of the DPSS laser 400 is approximately 1319 nm), a pulse energy of greater than or equal to 0.1 μJ, a pulse repetition frequency of greater than or equal to 80 kHz, or a pulse duration of greater than or equal to 1 ns. A DPSS laser with a neodymium-doped gain medium 410 may be pumped by one or more pump laser diodes 430 with an operating wavelength of 800-900 nm (e.g., approximately 808 nm) and an output power of 1-10W.

In particular embodiments, the wavelength of light emitted by a DPSS laser 400 may exhibit a relatively low variation with temperature. As an example, the pulses of light in output beam 460 may exhibit a wavelength variation with temperature of less than or equal to 0.05 nm/° C., 0.01 nm/° C., 0.005 nm/° C., 0.003 nm/° C., or 0.001 nm/° C. As another example, a DPSS laser 400 with a Nd:YAG gain medium 410 may emit pulses of light with a wavelength of approximately 1319 nm and a wavelength variation of less than or equal to 0.005 nm/° C. If the wavelength of the DPSS laser 400 changes by 80° C., then the wavelength of output beam 460 may change by less than or equal to 0.4 nm. In particular embodiments, a lidar system 100 may include a light source 110 with a DPSS laser 400 and an optical filter configured to transmit the light emitted by the DPSS laser. The optical filter may be located in the lidar system 100 so that unwanted wavelengths of light are removed from the input beam 135. The optical filter may have a pass-band that corresponds to the wavelength of light emitted by the DPSS laser. Since a DPSS laser 400 may exhibit a relatively low wavelength variation with temperature, the filter pass-band may be relatively narrow. For example, if a DPSS laser 400 emits light at 1342 nm±0.2 nm, then the optical filter may be centered at approximately 1342 nm with a pass-band width of approximately ±0.2 nm, ±0.5 nm, ±1 nm, or ±2 nm.

In particular embodiments, saturable absorber 420 may be bonded to gain medium 410. As an example, DPSS laser 400 may include a Nd:YAG gain medium 410 bonded to a vanadium-doped saturable absorber 420. As another example, DPSS laser 400 may include a Nd:YVO$_4$ gain medium 410 bonded to a V:YAG saturable absorber 420. Saturable absorber 420 and gain medium 410 being bonded together may refer to saturable absorber 420 and gain medium 410 being mechanically attached or coupled together by adhesive or epoxy bonding, by a direct-bonding technique (e.g., optical contacting, diffusion bonding, or chemically activated direct bonding), or by any other suitable bonding technique. Adhesive or epoxy bonding may include attachment using a substantially transparent adhesive or epoxy, such as for example, an optically clear adhesive or an ultraviolet (UV) light-curing adhesive. Optical contacting may include joining together two optical-quality surfaces (e.g., two polished surfaces substantially free of contaminants) so that the surfaces are held together by intermolecular forces. Diffusion bonding may include applying heat or pressure to the saturable absorber 420 and gain medium 410 to allow elements to diffuse between the two parts and form a bond at the atomic level. In chemically activated direct bonding, two surfaces are chemically activated to create dangling bonds. The activated surfaces are pre-bonded together through hydrogen bonds, and the two pre-bonded parts are then annealed to form covalent bonds.

In particular embodiments, a DPSS laser 400 may include an interface 490 located between the gain medium 410 and saturable absorber 420. An interface 490 may represent a bond, border, or coating located between gain medium 410 and saturable absorber 420. The thickness of interface 490 may be any suitable value between zero thickness and approximately 1-mm thickness. As an example, an optical or diffusion bond may have a thickness close to or approximately equal to zero (e.g., the thickness may be less than or equal to 1 μm, 100 nm, 10 nm, or 1 nm). As another example, interface 490 may include adhesive or epoxy material and may have a thickness of approximately 0.1-100 μm.

In particular embodiments, gain medium 410 and saturable absorber 420 may each be part of a monolithic structure in a single host crystal. Rather than having one crystal for the gain medium and another crystal for the saturable absorber, a DPSS laser 400 may include one host crystal with different dopants in different regions. As an example, DPSS laser 400 may include a single YAG crystal with part of the crystal doped with neodymium (to form gain medium 410) and another part of the crystal doped with vanadium (to form saturable absorber 420). As another example, DPSS laser 400 may include a single YVO$_4$ crystal with part of the crystal doped with neodymium and another part of the crystal doped with vanadium. The interface 490 may represent a border or transition region between the gain medium 410 and the saturable absorber 420.

In particular embodiments, interface 490 may include a thin-film dielectric coating configured to block or reflect light from the pump beam 440. As an example, interface 490 may include a dielectric coating with a high reflectivity at an operating wavelength of the pump laser 430 (e.g., a reflectivity of greater than or equal to 70%, 80%, 90%, 95%, or 99% at the pump-laser wavelength). Additionally, the dielectric coating may have a low reflectivity at an operating wavelength of the DPSS laser 400 (e.g., a reflectivity of less than or equal to 20%, 10%, 5%, 1%, or 0.1% at the DPSS-laser wavelength). When light from the pump beam 440 enters the gain medium 410, the light is absorbed by the gain material. After propagating through the gain medium 410, any residual, unabsorbed pump light may enter the saturable absorber 420 and may cause unwanted bleaching or saturation of the saturable absorber 420. Having a high-reflectivity coating at the pump-laser wavelength may prevent most of the residual pump-beam light from entering the saturable absorber 420. Most of the pump-beam light may be reflected by the dielectric coating located at the interface 490, and the reflected pump-beam light may propagate back through the gain medium 410.

In particular embodiments, the length $L_g$ or the dopant density of gain medium 410 may be configured so that only a fraction of light from pump beam 440 reaches interface 490 (e.g., most of the pump beam 440 is absorbed by the gain material of gain medium 410 during the first pass of pump beam 440 through gain medium 410). As an example, less than or equal to 40%, 20%, 10%, 5%, or 1% of pump beam 440 that is incident on back surface 470 of gain medium 410 may reach the interface 490. In particular embodiments, a dielectric coating located at interface 490 to block or reflect light from the pump beam 440 may not be necessary if the absorption of the pump beam 440 in gain medium 410 is greater than a particular amount (e.g., if greater than or equal to 60%, 80%, 90%, 95%, or 99% of the pump beam 440 is absorbed in the gain medium 410 during its first pass through the gain medium 410). In particular embodiments, a dielectric coating located at interface 490 to block or reflect light from the pump beam 440 may not be necessary if the saturation intensity of the saturable absorber 420 is greater than the intensity of the residual pump-beam light that reaches the saturable absorber 420. As an example, a V:YAG saturable absorber 420 with a 3.8 MW/cm$^2$ saturation intensity may not require a dielectric coating at interface 490 to block or reflect residual light from the pump beam 440.

In particular embodiments, back surface 470 and output surface 480 of DPSS laser 400 may form two ends of a laser cavity of the DPSS laser 400. The gain medium 410 and saturable absorber 420 may be located between the back surface 470 and output surface 480 so that the gain medium 410 and saturable absorber 420 are contained within the laser cavity. In particular embodiments, a laser cavity may be referred to as a resonant cavity, resonator cavity, optical resonator, optical cavity, or cavity. In particular embodiments, a back surface 470 may form one end of a laser cavity and may be referred to as an input surface, an input coupler, an end surface, a cavity surface, a laser-cavity surface, or a laser-cavity mirror. A back surface 470 may refer to a surface through which pump beam 440 is received or a surface which has a high reflectivity for an operating wavelength of the DPSS laser 400. In particular embodiments, an output surface 480 may form another end of a laser cavity and may be referred to as an output coupler, an end surface, a cavity surface, a laser-cavity surface, or a laser-cavity mirror. An output surface 480 may refer to a surface from which the output beam 460 is emitted.

In particular embodiments, gain medium 410 may include a back surface 470 with a dielectric coating. As an example, back surface 470 may have a coating with a low reflectivity (e.g., R<10%) at a pump-laser wavelength and a high reflectivity (e.g., R>90%) at an operating wavelength of the DPSS laser 400. In particular embodiments, saturable absorber 420 may include an output surface 480 with a dielectric coating. In particular embodiments, a dielectric coating (which may be referred to as a thin-film coating, interference coating, or coating) may include one or more layers of dielectric materials (e.g., $SiO_2$, $TiO_2$, $Al_2O_3$, $Ta_2O_5$, $MgF_2$, $LaF_3$, or $AlF_3$) having particular thicknesses (e.g., thickness less than 1 μm) and particular refractive indices. A dielectric coating may be deposited onto a surface (e.g., a surface of gain medium 410 or saturable absorber 420) using any suitable deposition technique, such as for example, sputtering or electron-beam deposition.

In particular embodiments, a high-reflectivity dielectric coating may be referred to as an HR coating and may have any suitable reflectivity (e.g., a reflectivity R greater than or equal to 80%, 90%, 95%, 99%, 99.5%, or 99.9%) at any suitable wavelength or combination of wavelengths. As an example, back surface 470 have may an HR coating at an operating wavelength of a DPSS laser 400 (e.g., R>99.8% at 1319 nm or 1342 nm). As another example, interface 490 may have an HR coating at a pump-laser wavelength (e.g., R>99% at 800-820 nm).

In particular embodiments, a low-reflectivity dielectric coating may be referred to as a high-transmission (HT) coating or an anti-reflection (AR) coating and may have any suitable reflectivity (e.g., R less than or equal to 10%, 5%, 2%, 1%, 0.5%, or 0.2%) at any suitable wavelength or combination of wavelengths. As an example, back surface 470 may have an HT coating at a pump-laser wavelength (e.g., R<5% at 800-820 nm). As another example, output surface 480 may have an HT coating at a pump-laser wavelength (e.g., R<5% at 800-820 nm). As another example, interface 490 may have an AR coating at an operating wavelength of a DPSS laser 400 (e.g., R<0.5% at 1319 nm or 1342 nm).

In particular embodiments, a dielectric coating with an intermediate or partial reflectivity may be referred to as a partially reflective (PR) coating and may have any suitable reflectivity (e.g., R between approximately 10% and approximately 90%) at any suitable wavelength. As an example, output surface 480 may have a PR coating at an operating wavelength of a DPSS laser 400 (e.g., R approximately equal to 50% at 1319 nm or 1342 nm).

In particular embodiments, a dielectric coating may be a dichroic coating which has a particular type of reflectivity (e.g., HR, HT, AR, or PR) at particular wavelengths. As an example, back surface 470 may have a dielectric coating which is HR (e.g., R greater than 99.8%) at an operating wavelength of a DPSS laser 400 (e.g., at 1319 nm or 1342 nm) and HT (e.g., R less than 5%) at a pump-laser wavelength (e.g., at 800-820 nm). As another example, output surface 480 may have a dielectric coating which is PR (e.g., R is approximately equal to 50%) at an operating wavelength of a DPSS laser 400 and HT (e.g., R less than 5%) at a pump-laser wavelength. As another example, interface 490 may have a dielectric coating which is AR (e.g., R<0.5%) at an operating wavelength of a DPSS laser 400 and HR (e.g., R>99%) at a pump-laser wavelength.

Figure 12:
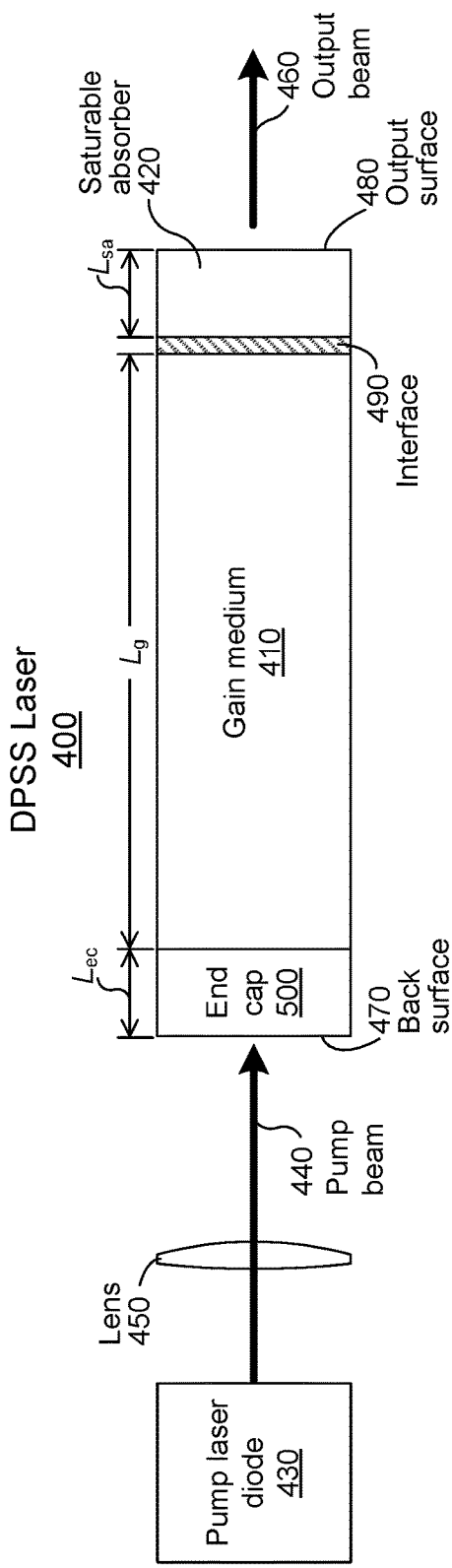
FIG. 12 illustrates an example DPSS laser that includes an end cap coupled.

FIG. 12 illustrates an example DPSS laser 400 that includes an end cap 500. In particular embodiments, a DPSS laser 400 may include an end cap 500 coupled to gain medium 410. The end surfaces of a laser cavity of a DPSS laser 400 may be formed by back surface 470 and output surface 480, and end cap 500, gain medium 410, and saturable absorber 420 may be located within the laser cavity and between the laser-cavity end surfaces. In particular embodiments, end cap 500 may face pump laser 430. In the example of FIG. 12, end cap 500 is positioned to receive pump beam 440 so that pump beam 440 propagates through the end cap 500 before entering gain medium 410. In particular embodiments, end cap 500 may act as a heat spreader that reduces thermally induced stress or thermally induced lensing within gain medium 410. In particular embodiments, an end cap 500 may include back surface 470. A back surface 470 that is part of end cap 500 may be similar to a back surface 470 that is part of gain medium 410 (e.g., back surface 470 of end cap 500 may include a dielectric coating with particular reflectivity at particular wavelengths). In particular embodiments, an end cap 500 may have a length $L_{ec}$ of approximately 0.5-3 mm, and gain medium 410 may have a length $L_g$ of approximately 2-10 mm. As an example, an end cap 500 may have a length $L_{ec}$ of approximately 1 mm, and gain medium 410 may have length $L_g$ of approximately 3-4 mm.

In particular embodiments, an end cap 500 may refer to an undoped host material that is bonded to gain medium 410 (e.g., end cap 500 and gain medium 410 may be bonded together by adhesive or epoxy or by a direct-bonding technique). An end cap 500 may correspond to a gain medium 410 without the presence of gain-material dopants (e.g., the end cap 500 is substantially free of gain-material dopants) or with a low concentration of gain-material dopants. As an example, an end cap 500 may include a separate piece of undoped YAG crystal (e.g., a YAG crystal that is substantially free of gain-material dopants) that is bonded to a Nd:YAG gain medium 410. As another example, an end cap 500 may be an undoped YSGG crystal that is bonded to a Nd:YSGG gain medium 410. In particular embodiments, an end cap 500 being substantially free of gain-material dopants may refer to an end cap 500 with less than a particular amount (e.g., less than approximately 1%, 0.1%, 0.01%, or 0.001%) of the concentration of dopants in a gain medium 410. As an example, if a gain medium 410 is doped with 1.5% Nd and an end cap 500 has less than 1% of the dopant density of the gain medium 410, then the end cap 500 may have a Nd dopant density of less than 0.015%. In particular embodiments, an end cap 500 having a low concentration of gain-material dopants may refer to an end cap 500 with less than a particular amount (e.g., less than approximately 20%, 10%, 5%, or 2%) of the concentration of dopants in a gain medium 410.

In particular embodiments, an end cap 500 may be integrated into or may be part of a host crystal of gain medium 410. As an example, a single host crystal (e.g., YAG) may include both a gain medium 410 (e.g., Nd:YAG) and an end cap 500 (e.g., undoped YAG). As another example, a single YAG host crystal with an overall length $L_{ec}+L_g$ may be doped with Nd ions over a length $L_g$, and the remaining Lee portion may be an undoped end cap 500 that is substantially free of Nd dopants. As another example, a single $YVO_4$ host crystal may have a 4-mm overall length where the first 1-mm is an undoped $YVO_4$ end cap 500, and the remaining 3-mm is a Nd-doped $YVO_4$ gain medium 410. In particular embodiments, a single host crystal may include an end cap 500, a gain medium 410, and a saturable absorber 420. As an example, a single YAG host crystal with an overall length $L_{ec}+L_g+L_{sa}$ may include an undoped end cap 500 that is substantially free of Nd dopants, a Nd:YAG gain medium 410, and a V:YAG saturable absorber 420. As another example, a single $YVO_4$ host crystal may include an undoped end cap 500 that is substantially free of Nd dopants, a Nd:$YVO_4$ gain medium 410, and a V:$YVO_4$ saturable absorber 420.

Figure 13:
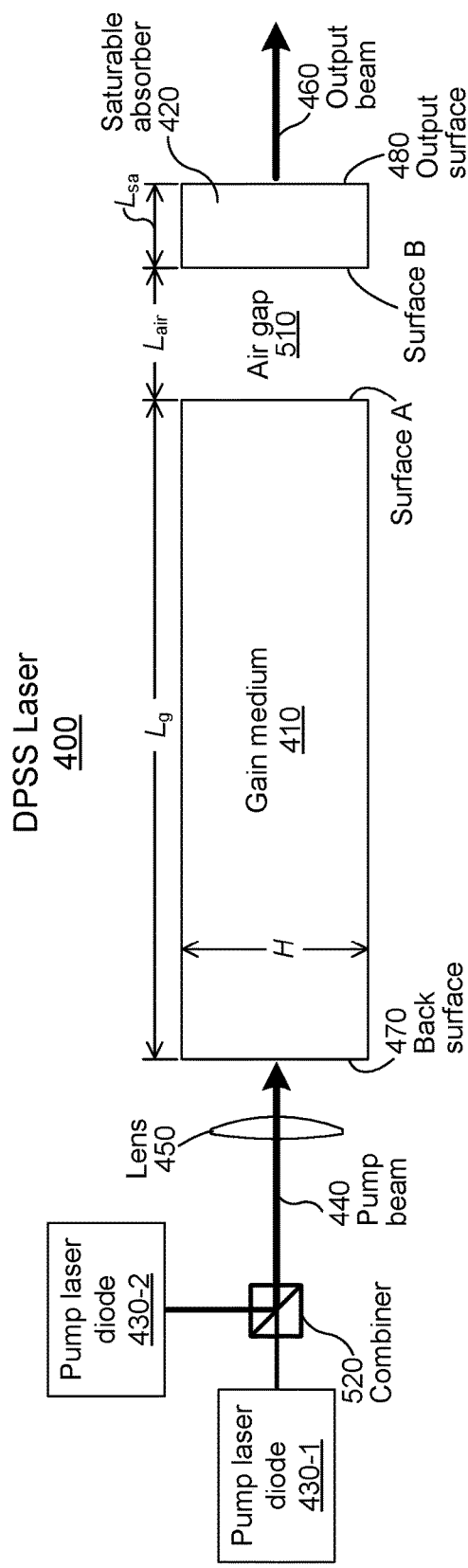
FIG. 13 illustrates an example DPSS laser that includes an air gap between the gain medium and the saturable absorber.

FIG. 13 illustrates an example DPSS laser 400 that includes an air gap 510 between the gain medium 410 and the saturable absorber 420. In particular embodiments, gain medium 410 and saturable absorber 420 may be discrete optical elements which are separated by air gap 510. An air gap 510 may have any suitable length Lair between approximately 0 mm and approximately 50 mm. As an example, air gap 510 may have a length Lair of approximately 0.1 mm, 0.5 mm, 1 mm, 2 mm, 3 mm, 5 mm, 10 mm, 15 mm, 20 mm, or 50 mm. In the example of FIG. 13, the end surfaces of a laser cavity of the DPSS laser 400 are formed by back surface 470 and output surface 480. The gain medium 410, surface A, air gap 510, surface B, and saturable absorber 420 are located within the laser cavity and between the laser-cavity end surfaces 470 and 480. In particular embodiments, surface A and surface B may each include a dielectric coating with a particular reflectivity (e.g., HR, HT, AR, or PR) at particular wavelengths. As an example, surface A may have a coating that is HR (e.g., R>95%) at a pump-laser wavelength and AR (e.g., R<0.5%) at an operating wavelength of the DPSS laser 400. The HR coating may reflect most pump-laser light that is incident on surface A, and the AR coating may allow most of the DPSS laser light to pass through surface A. As another example, surface B may have an AR coating at an operating wavelength of the DPSS laser 400.

In particular embodiments, a DPSS laser 400 may include two or more pump laser diodes 430 and one or more optical-beam combiners 520. In the example of FIG. 13, the DPSS laser 400 includes two pump laser diodes 430-1 and 430-2 and an optical-beam combiner 520. The optical-beam combiner 520 may be configured to combine light from pump laser 430-1 and pump laser 430-2 to form pump beam 440 that is supplied to the gain medium. An optical-beam combiner 520 may include or may be referred to as a beam combiner, a pump combiner, a combiner, a wavelength combiner, a dichroic beam combiner, or a polarization beam combiner. In FIG. 13, the combiner 520 combines or overlaps the beams of light from pump laser diode 430-1 and pump laser diode 430-2 so that the beams are substantially coaxial (e.g., the beams from the two laser diodes propagate together along substantially the same propagation axis) and the pump beam 440 includes the light from the two pump laser diodes. The combiner 520 may have any suitable size or shape, such as for example, a cuboid shape with a side length of approximately 2 mm, 5 mm, 10 mm, or 20 mm. As another example, the combiner 520 may be a rectangular, square, or round plate with a diameter or side length of approximately 2 mm, 5 mm, 10 mm, or 20 mm and a thickness of approximately 0.2 mm, 1 mm, 2 mm, or 5 mm.

In particular embodiments, combiner 520 may be a dichroic beam combiner configured to transmit light at one or more particular wavelengths and reflect light at one or more other wavelengths. In FIG. 13, pump laser diode 430-1 and pump laser diode 430-2 may emit light at two different wavelengths. The combiner 520 may be a dichroic beam combiner configured to combine the two different wavelengths of light by transmitting the light from pump laser 430-1 and reflecting the light from pump laser 430-2. For example, pump laser diode 430-1 may operate at approximately 883-884.5 nm, and pump laser diode 430-2 may operate at approximately 885.5-887 nm. The combiner 520 may be configured to transmit light at approximately 883-884.5 nm and reflect light at approximately 885.5-887 nm to produce the combined pump beam 440. As another example, pump laser diode 430-1 may operate at approximately 807-810 nm, and pump laser diode 430-2 may operate at approximately 868-870 nm. The combiner 520 may be configured to transmit light at approximately 807-810 nm and reflect light at approximately 868-870 nm.

In particular embodiments, combiner 520 may be a polarization beam combiner configured to combine two orthogonally polarized beams into a single pump beam 440. The polarization beam combiner 520 may be configured to combine two orthogonally polarized beams by reflecting vertically polarized light and transmitting horizontally polarized light (or vice versa). In FIG. 13, the two pump laser diodes 430-1 and 430-2 may operate at approximately the same wavelength (e.g., approximately 808 nm±2 nm) or at two different wavelengths. The two pump laser diodes may emit light having the same polarization (e.g., vertical polarization with respect to the plane of the DPSS laser 400), and the DPSS laser 400 may include a half-wave plate configured to rotate the polarization of one of the pump lasers by 90 degrees. The light from pump laser diode 430-1 may be passed through the half-wave plate to rotate the polarization by 90 degrees from vertical to horizontal. The combiner 520 may transmit the horizontally polarized light from pump laser 430-1 and reflect the vertically polarized light from pump laser 430-2 to form the pump beam 440.

In particular embodiments, a DPSS laser 400 may include two or more pump laser diodes 430 configured to produce pump light at two or more different respective wavelengths. As an example, in FIG. 13, pump laser 430-1 may operate at approximately 803-808 nm, and pump laser 430-2 may operate at approximately 808-813 nm. The gain medium 410 may be doped with neodymium that has an absorption line at approximately 808 nm±1 nm. The operating wavelengths of the pump lasers may be selected so that as the temperature of the DPSS laser 400 changes (e.g., due to changes in ambient temperature), at least one of the pump lasers overlaps at least part of the 808-nm neodymium absorption line. As an example, at a lower temperature (e.g., approximately 10° C.), pump laser 430-1 may operate at approximately 803 nm, and pump laser 430-2 may operate at approximately 808 nm (e.g., pump laser 430-2 may be more efficient at pumping the 808-nm absorption line). As the temperature increases, the operating wavelengths of the two pump lasers may shift to longer wavelengths. For example, at a higher temperature (e.g., approximately 30° C.), the wavelength of pump laser 430-1 may shift to approximately 808 nm, and the wavelength of pump laser 430-2 may shift to approximately 813 nm (e.g., pump laser 430-1 may be more efficient at pumping the 808-nm absorption line).

In particular embodiments, lidar system 100 may include a processor (e.g., controller 150 in FIG. 1) configured to adjust the output powers of two or more pump laser diodes 430. As an example, in FIG. 13, the output power of each pump laser diode may be adjusted in response to a temperature change (e.g., a temperature change of the DPSS laser 400, a pump laser diode 430-1 or 430-2, the light source 110, or the lidar system 100). The controller 150 may be configured to adjust the output powers of the pump laser diodes so that the pump laser operating at the most efficient wavelength to pump the gain medium 410 produces the most output power. For example, at a lower temperature (e.g., pump laser 430-1 operates at approximately 803 nm, and pump laser 430-2 operates at approximately 808 nm), the controller 150 may instruct pump laser 430-1 to produce a relatively low output power (e.g., 0 to 0.5 W), and pump laser 430-2 may be instructed to produce a relatively high output power (e.g., greater than 3 W). Similarly, at a higher temperature (e.g., pump laser 430-1 operates at approximately 808 nm, and pump laser 430-2 operates at approximately 813 nm), the controller may instruct pump laser 430-1 to produce a relatively high output power, and the output power of pump laser 430-2 may be decreased to a relatively low value.

In particular embodiments, a DPSS laser 400 may be configured to be deactivated during particular periods of time. When a DPSS laser 400 is deactivated, the DPSS laser may not emit an output beam 460, or the power of the output beam 460 may be reduced to less than 10%, 5%, or 1% of the normal emitted power. Deactivating a DPSS laser 400 may include turning off or reducing the amount of optical power produced by a pump laser diode 430. As an example, a DPSS laser 400 may include one or more pump laser diodes 430 configured to produce a pump beam 440 with approximately 4 W of power. Deactivating the DPSS laser 400 may include reducing the power of the pump beam 440 to below a minimum output power (e.g., 0.5 W) or reducing the pump-laser bias current below a minimum bias current (e.g., 1 amp). For example, a pump laser diode 430 may be turned off completely by reducing a pump-laser bias current to approximately 0 amps so that the power emitted by the pump laser diode 430 is approximately 0 W. Alternatively, the power of the pump beam 440 may be reduced to a nonzero value, such as for example 250 mW. By reducing the power emitted by a pump laser diode 430 (rather than turning off the pump laser), the lifetime or performance of the pump laser 430 may be improved. For example, a pump laser diode that is repeatedly cycled between a particular operating power (e.g., 4 W) and an off state (e.g., 0 W) may experience thermal stresses that may reduce the pump-laser lifetime or output power. Cycling between a full-on state (e.g., 4 W) and a reduced-power partially-on state (e.g., 250 mW) may reduce the thermal stress on the pump laser diode 430. As a result, the lifetime or performance of the pump laser 430 may be extended or improved as compared to a device that is cycled between a full-on state and a full-off state.

In particular embodiments, a DPSS laser 400 may be part of a light source 110 of a lidar system 100, and while the scanner 120 is scanning the emitted light from the DPSS laser 400 across a scan pattern 200, a processor (e.g., controller 150) may instruct the DPSS laser 400 to deactivate at particular times. For example, the scan pattern 200 may include multiple scan lines 230 which are scanned sequentially, and the controller 150 may instruct the DPSS laser 400 to turn off or reduce the amount of optical power produced by the pump laser diode 430 during a period of time between two successive scan lines. Periodically deactivating the DPSS laser 400 may improve the electrical efficiency, thermal efficiency, or lifetime of the DPSS laser 400. For example, the power consumption and the amount of heat produced by the DPSS laser 400 may be reduced.

In the example of FIG. 3, after surface 320A has rotated to scan output beam 125 across a scan line, there may be some delay or dead time before surface 320B has rotated into position to scan the output beam 125 across the next scan line. The light source 110 may include a DPSS laser 400, and during at least a portion of the dead time between scanning the two scan lines, the DPSS laser 400 may be deactivated. In the example of FIG. 5, after scan line 230A has completed its scan across the FOR, the DPSS laser 400 may be deactivated until scan line 230B begins its scan across the FOR. Each scan line 230 be scanned across the FOR in approximately 1 ms, and there may be approximately 600 µs of dead time between each scan line. The DPSS laser 400 may be deactivated during at least a portion of the 600-µs dead time. The DPSS laser 400 may include a neodymium-doped gain medium 410, and the neodymium dopants may have an upper-state lifetime of less than approximately 250 µs, which may allow the DPSS laser 400 to be deactivated and then re-activated during a 600-µs dead time. For example, the neodymium dopants in a Nd:YAG gain medium 410 may have an upper-state lifetime of approximately 230 µs, and the neodymium dopants in a Nd:YVO$_4$ gain medium 410 may have an upper-state lifetime of approximately 90 µs. These upper-state lifetimes may allow a DPSS laser 400 to be deactivated and re-activated within a 600-µs dead time. Other DPSS lasers may use an erbium-doped gain medium which has an upper-state lifetime of approximately 8 ms. As a result of the significantly longer upper-state lifetime, a DPSS laser with an erbium-doped gain medium may not be compatible with a deactivation process where the dead time is less than 8 ms.

In particular embodiments, a DPSS laser 400 may exhibit pulse-to-pulse timing jitter where the emitted pulses of light in output beam 460 may be separated by intervals of time that vary. As an example, a pulsed light source that exhibits minimal timing jitter may produce optical pulses with a pulse period of approximately 2 µs (corresponding to a pulse repetition frequency of approximately 500 kHz) and a peak-to-peak variation in pulse timing of less than 20 ns (corresponding to less than 1% jitter). A 20-ns jitter represents a pulse period that may vary between 1.99 µs and 2.01 µs (corresponding to a repetition rate that varies from approximately 497.5 kHz to 502.5 kHz). In comparison, a DPSS laser 400 with a 500-kHz pulse repetition frequency may exhibit a timing jitter of approximately 300 ns (corresponding to 15% jitter) so that the pulse period varies between approximately 1.85 µs and 2.15 µs.

In particular embodiments, the repetition rate of a DPSS laser 400 may be changed by adjusting the optical power in pump beam 440. Increasing the pump power may cause an increase in the DPSS laser repetition rate, and decreasing the pump power may decrease the repetition rate. In particular embodiments, light source 110 or lidar system 100 may include a processor (e.g., controller 150) configured to adjust the output power provided by one or more pump laser diodes 430 that provide pump beam 440 to gain medium 410. The pump-laser output power may be adjusted to reduce the amount of timing jitter of the pulses of light of output beam 460 produced by the DPSS laser 400. As an example, light source 110 or lidar system 100 may include a detector that monitors the pulses of light in output beam 460, and a processor may determine the DPSS laser 400 repetition rate based on a signal from the detector. The detector may be a separate element (e.g., a photodiode) located within the light source 110 or lidar system 100, or an APD 340 in receiver 140 may be used to monitor the emitted pulses of light. As the repetition rate changes, the optical power in the pump beam 440 may be adjusted (e.g., by adjusting the bias current supplied to the one or more pump laser diodes 430) to compensate for the variation in repetition rate. For example, if the repetition rate decreases, the optical power in pump beam 440 may be increased to restore the repetition rate to its target value (e.g., 500 kHz). Similarly, if the repetition rate increases, the optical power in pump beam 440 may be decreased. Adjusting the optical power in pump beam 440 may allow a DPSS laser 400 to operate with a minimal amount of pulse-to-pulse timing jitter (e.g., less than 5%, 2%, 1%, or 0.2% timing jitter). In a lidar system 100, a light source 110 with a minimal amount of timing jitter may be desirable since the low timing jitter may produce substantially uniform point clouds where each pixel is substantially uniformly separated from adjacent pixels.

Figure 14:
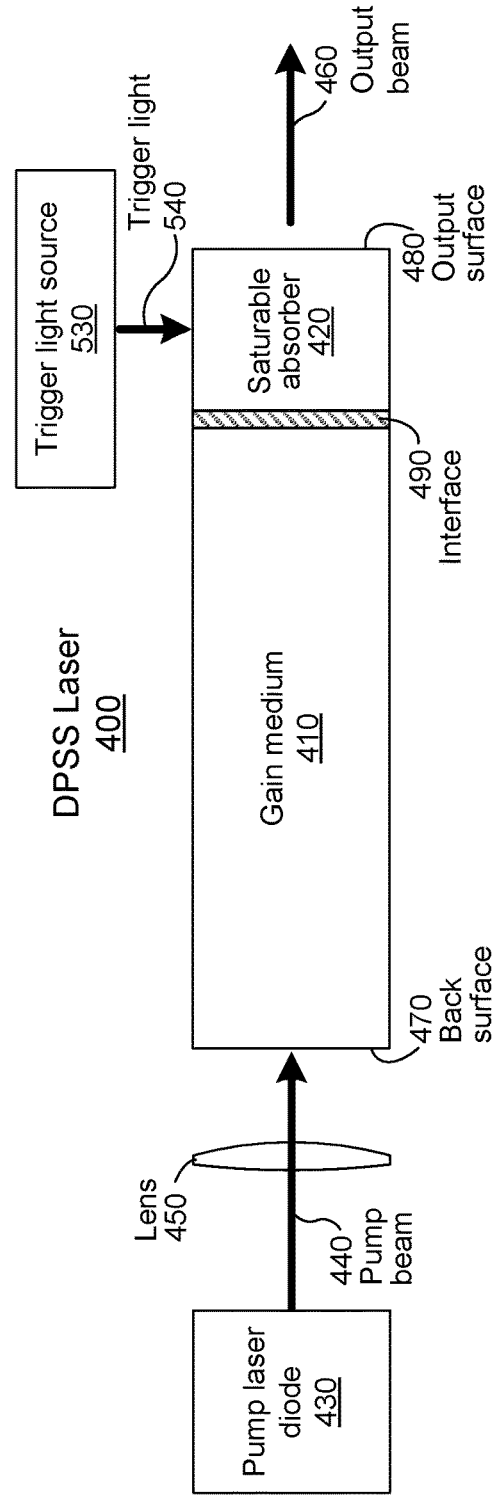
FIG. 14 illustrates an example DPSS laser that includes a trigger light source.

FIG. 14 illustrates an example DPSS laser 400 that includes a trigger light source 530. In particular embodiments, a DPSS laser 400 may include one or more pump laser diodes 430, a gain medium 410, a saturable absorber 420, and a trigger light source 530. The one or more pump laser diodes 430 may produce a pump beam 440 which is supplied to the gain medium 410, and the gain material in the gain medium 410 may absorb at least a portion of the pump beam 440. The excited gain material may emit light at an emission wavelength, where the emission wavelength corresponds to an operating wavelength of the DPSS laser 400. For example, the excited neodymium dopants in a Nd:YVO$_4$ DPSS laser 400 may emit light at approximately 1342 nm, and the wavelength of the pulses of light in output beam 460 emitted by the DPSS laser 400 may be approximately 1342 nm. The saturable absorber 420 may include a vanadium-doped crystal configured to absorb at least a portion of the emitted light produced by the gain medium 410. For example, a V:YVO$_4$ saturable absorber 420 in a Nd:YVO$_4$ DPSS laser 400 may absorb light at 1342 nm, and the absorption of light by the saturable absorber 420 may decrease as the saturable absorber 420 becomes bleached.

In particular embodiments, a trigger light source 530 may supply trigger pulses of light 540 to a saturable absorber 420. A DPSS laser 400 that includes a trigger light source 530 may be referred to as a DPSS laser with an optically triggered saturable absorber. A trigger pulse of light 540 may be referred to as trigger light, an optical trigger pulse, an optical trigger, a trigger pulse, an optical bleaching pulse, or a bleaching pulse. Each trigger pulse of light may bleach the saturable absorber 420 to cause the DPSS laser 400 to emit a corresponding pulse of light. For example, the output beam 460 may include a series of pulses of light, and each emitted pulse of light may be associated with a corresponding trigger pulse supplied by the trigger light source 530. Without a trigger light source 530, a DPSS laser 400 may emit a pulse of light when the emitted light produced by the gain medium 410 bleaches the saturable absorber 420. In a DPSS laser 400 that includes a trigger light source 530, the emitted light from the gain medium 410 may contribute to the bleaching process, but the trigger light source 530 may be configured to supply a pulse of trigger light 540 that finalizes the bleaching process of the saturable absorber 420 and results in the emission of a pulse of light in the output beam 460.

In particular embodiments, a DPSS laser 400 that includes a trigger light source 530 and a saturable absorber 420 may be configured to emit an output beam 460 that includes multiple pulses of light. Each emitted pulse of light may be associated with a bleaching of the saturable absorber 420 by a corresponding trigger pulse of light 540 provided by the trigger light source 530. Additionally, the output beam 460 emitted by the DPSS laser 400 may form an eye-safe output beam (e.g., the DPSS laser 400 may be a Class 1 laser or the DPSS laser 400 may be part of a Class 1 lidar system 100). The output beam 460 may include pulses of light at any suitable wavelength or range of wavelengths, such as for example, approximately 1319 nm, 1320 nm, 1324 nm, 1331 nm, 1328 nm, 1340 nm, 1341 nm, 1342 nm, 1348 nm, 1200-1400 nm, 1300-1400 nm, 1300-1350 nm, or 1310-1350 nm.

In particular embodiments, a DPSS laser 400 that includes a trigger light source 530 may exhibit a minimal amount of pulse-to-pulse timing jitter as compared to a DPSS laser 400 without a trigger light source 530. In a DPSS laser 400 without a trigger light source 530, the emitted light from the gain medium provides for the bleaching of the saturable absorber 420. However, this bleaching process may exhibit variations in timing which results in pulse-to-pulse timing jitter. Rather than relying solely on the emitted light from the gain medium 410 to bleach the saturable absorber 420, a trigger light source 530 may provide an electrically controllable technique for bleaching the saturable absorber 420 (and triggering the emission of an optical pulse). The trigger light source 530 may be driven at a controllable and substantially uniform pulse rate so that the pulses of light emitted by the DPSS laser 400 are also emitted at a correspondingly controllable and low-jitter repetition rate. For example, a DPSS laser 400 that includes a trigger light source may exhibit a pulse-to-pulse timing jitter of less than 2%, 1%, 0.5%, or 0.1%.

In particular embodiments, a DPSS laser 400 may include a trigger light source 530 and a vanadium-doped saturable absorber 420, and each trigger pulse of light 540 supplied by the trigger light source 530 may bleach the saturable absorber 420. Bleaching the saturable absorber 420 may refer to the vanadium dopants absorbing at least a portion of a trigger pulse of light so that greater than a particular percentage of the vanadium dopants are promoted into an excited state. For example, greater than 50%, 60%, 70%, 80%, or 90% of the vanadium dopants may be promoted into excited states so that the saturable absorber 420 is substantially transparent to light emitted by the gain material in the gain medium 410 (e.g., the bleached saturable absorber 420 may absorb less than or equal to 50%, 25%, 10%, 5%, or 1% of incident light emitted by the gain material). After each pulse of light is emitted by the DPSS laser 400, the saturable absorber 420 may recover to a substantially unbleached state so that greater than a particular percentage of the vanadium dopants relax to a ground state. For example, greater than 50%, 60%, 70%, 80%, or 90% of the vanadium dopants may relax to a ground state where the saturable absorber 420 is substantially opaque to light emitted by the gain material in the gain medium 410 (e.g., the unbleached saturable absorber 420 may absorb greater than or equal to 50%, 60%, 70%, 80%, or 90% of incident light emitted by the gain material).

In particular embodiments, a trigger light source 530 may include a laser diode configured to emit light at an absorption wavelength of a saturable absorber 420 (e.g., at a wavelength where the saturable absorber 420 absorbs light and may become bleached). As an example, a vanadium-doped saturable absorber (e.g., V:YAG or V:YVO$_4$) may absorb light from approximately 1000 nm to approximately 1450 nm, and the trigger light source 530 may emit light at one or more wavelengths between approximately 1000 nm and approximately 1450 nm. As another example, a DPSS laser 400 may include a vanadium-doped saturable absorber, and a trigger laser diode 530 may supply pulses of trigger light 540 at any suitable wavelength between 1000 nm and 1450 nm (e.g., approximately 1050 nm, 1064 nm, 1200 nm, 1300 nm, 1310 nm, 1350 nm, 1380 nm, 1400 nm, or 1450 nm). As another example, a DPSS laser 400 with a Nd:YAG gain medium 410 that produces pulses of light at approximately 1319 nm may include a trigger laser diode 530 that supplies pulses of trigger light 540 at a different wavelength from the DPSS laser operating wavelength (e.g., at a wavelength in the 1330-1380 nm range). As another example, a DPSS laser 400 with a Nd:YVO$_4$ gain medium 410 that produces pulses of light at approximately 1342 nm may include a trigger laser diode 530 that supplies pulses of trigger light 540 at a different wavelength from the DPSS laser operating wavelength (e.g., at a wavelength in the 1300-1330 nm or 1350-1400 nm range).

In particular embodiments, pulses of trigger light 540 may be supplied to a saturable absorber 420 via a side face or an end face of the saturable absorber. As an example, a saturable absorber 420 may have a polished side face through which the trigger light 540 is coupled into the saturable absorber 420. In FIG. 14, the trigger light 540 is coupled into the saturable absorber 420 via a side face. As another example, the trigger light 540 may be coupled into a saturable absorber 420 via an end face (e.g., via output surface 480 in FIG. 14). The output surface 480 may have a dielectric coating that is partially reflective for the output beam 460 and high-transmission for the trigger light 540. In particular embodiments, a dichroic mirror that transmits the output beam 460 and reflects the trigger light 540 (or vice versa) may be used to couple the trigger light 540 into the saturable absorber 420 via an end face. For example, a DPSS laser 400 may operate at approximately 1342 nm, and the dichroic mirror may have a dielectric coating that transmits the 1342-nm light. The trigger light 540 may have a wavelength of approximately 1310 nm, and the dielectric coating may reflect light at 1310 nm to couple the trigger light into the saturable absorber 420 via the output surface 480.

FIG. 15 illustrates an example optical-loss curve 610 for a DPSS laser 400. In FIG. 15, the optical loss 610 decreases over time as dopants in the saturable absorber 420 absorb light emitted by gain-material dopants in the gain medium 410 and the transmission of the saturable absorber 420 increases. When the optical loss has decreased to a particular value (e.g., the saturable absorber 420 is bleached), an optical pulse is emitted, as indicated by the emitted-light curve 600 in FIG. 15. The optical pulse is emitted when the optical loss has decreased to a point where the optical gain of the DPSS laser cavity exceeds the optical loss. After the optical pulse is emitted, the optical loss 610 recovers according to the recovery time of the saturable absorber 420. For example, for a V:YAG saturable absorber 420 with a recovery time of approximately 22 ns, the optical loss may recover back to greater than 98% of its unbleached loss value within approximately 100 ns. After the saturable absorber 420 recovers, the process repeats itself: the optical loss decreases as the saturable absorber 420 absorbs light from the excited gain-material dopants, and another pulse is emitted when the cavity gain exceeds the optical loss. The optical-loss curve 610 in FIG. 15 represents the optical loss for a DPSS laser 400 without a trigger light source 530 where the bleaching of the saturable absorber 420 is provided by light from the excited gain-material dopants.

FIG. 16 illustrates an example optical-loss curve 610 for a DPSS laser 400 that includes a trigger light source 530. In FIG. 16, the optical loss 610 initially decreases relatively gradually as the dopants in the saturable absorber 420 absorb light emitted by the gain-material dopants. At a particular time, a pulse of trigger light 540 is applied to the saturable absorber 420, and the optical loss 610 then decreases rapidly resulting in the emission of an optical pulse. After the optical pulse is emitted and after the pulse of trigger light 540 is turned off, the optical loss 610 recovers according to the recovery time of the saturable absorber 420. In FIG. 16, the time at which a pulse is emitted is determined primarily by the time at which a trigger pulse 540 is applied to the saturable absorber 420. In this way, the trigger light source 530 may control when the DPSS laser 400 emits a pulse.

In particular embodiments, the pulse period $\tau$ for a DPSS laser 400 with a trigger light source 530 may be shorter than that for a corresponding DPSS laser 400 without a trigger light source. For example, the pulse period $\tau$ in FIG. 15 may be approximately 5 µs (corresponding to a 200 kHz repetition rate), and the pulse period $\tau$ in FIG. 16 may be approximately 2.6 µs (corresponding to a 385 kHz repetition rate). Additionally, the pulse period $\tau$ in FIG. 16 (for a DPSS laser 400 with a trigger light source 530) may be controllable or adjustable. For example, the pulse period $\tau$ in FIG. 16 may exhibit a relatively low timing jitter (e.g., a pulse-to-pulse timing jitter of less than 2%, 1%, 0.5%, or 0.1%). As another example, the pulse period for a DPSS laser 400 with a trigger light source 530 may be dynamically adjustable by adjusting the rate at which the trigger light source 530 produces pulses of trigger light 540. A lidar system 100 may dynamically adjust the repetition rate of a DPSS laser 400 as the system scans across a FOR or between subsequent frames. For example, the repetition rate of a DPSS laser 400 may be dynamically varied between a particular minimum repetition rate (e.g., 80 kHz, 100 kHz, or 200 kHz) and a particular maximum repetition rate (e.g., 400 kHz, 600 kHz, or 1 MHz).

Figure 17:
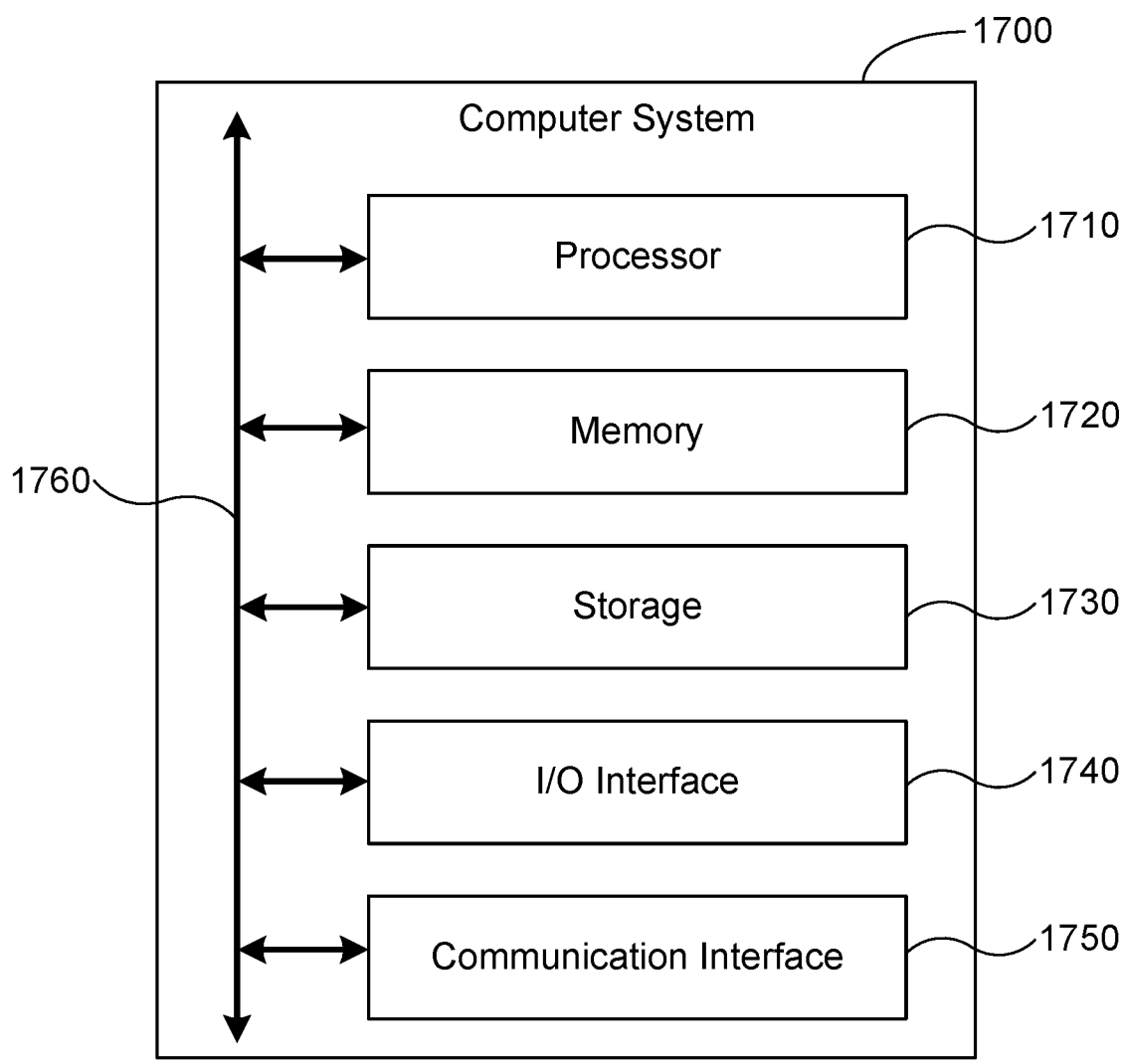
FIG. 17 illustrates an example computer system.

FIG. 17 illustrates an example computer system 1700. In particular embodiments, one or more computer systems 1700 may perform one or more steps of one or more methods described or illustrated herein. In particular embodiments, one or more computer systems 1700 may provide functionality described or illustrated herein. In particular embodiments, software running on one or more computer systems 1700 may perform one or more steps of one or more methods described or illustrated herein or may provide functionality described or illustrated herein. Particular embodiments may include one or more portions of one or more computer systems 1700. In particular embodiments, a computer system may be referred to as a processor, a controller, a computing device, a computing system, a computer, a general-purpose computer, or a data-processing apparatus. Herein, reference to a computer system may encompass one or more computer systems, where appropriate.

Computer system 1700 may take any suitable physical form. As an example, computer system 1700 may be an embedded computer system, a system-on-chip (SOC), a single-board computer system (SBC), a desktop computer system, a laptop or notebook computer system, a mainframe, a mesh of computer systems, a server, a tablet computer system, or any suitable combination of two or more of these. As another example, all or part of computer system 1700 may be combined with, coupled to, or integrated into a variety of devices, including, but not limited to, a camera, camcorder, personal digital assistant (PDA), mobile telephone, smartphone, electronic reading device (e.g., an e-reader), game console, smart watch, clock, calculator, television monitor, flat-panel display, computer monitor, vehicle display (e.g., odometer display or dashboard display), vehicle navigation system, lidar system, ADAS, autonomous vehicle, autonomous-vehicle driving system, cockpit control, camera view display (e.g., display of a rear-view camera in a vehicle), eyewear, or head-mounted display. Where appropriate, computer system 1700 may include one or more computer systems 1700; be unitary or distributed; span multiple locations; span multiple machines; span multiple data centers; or reside in a cloud, which may include one or more cloud components in one or more networks. Where appropriate, one or more computer systems 1700 may perform without substantial spatial or temporal limitation one or more steps of one or more methods described or illustrated herein. As an example, one or more computer systems 1700 may perform in real time or in batch mode one or more steps of one or more methods described or illustrated herein. One or more computer systems 1700 may perform at different times or at different locations one or more steps of one or more methods described or illustrated herein, where appropriate.

As illustrated in the example of FIG. 17, computer system 1700 may include a processor 1710, memory 1720, storage 1730, an input/output (I/O) interface 1740, a communication interface 1750, or a bus 1760. Computer system 1700 may include any suitable number of any suitable components in any suitable arrangement.

In particular embodiments, processor 1710 may include hardware for executing instructions, such as those making up a computer program. As an example, to execute instructions, processor 1710 may retrieve (or fetch) the instructions from an internal register, an internal cache, memory 1720, or storage 1730; decode and execute them; and then write one or more results to an internal register, an internal cache, memory 1720, or storage 1730. In particular embodiments, processor 1710 may include one or more internal caches for data, instructions, or addresses. Processor 1710 may include any suitable number of any suitable internal caches, where appropriate. As an example, processor 1710 may include one or more instruction caches, one or more data caches, or one or more translation lookaside buffers (TLBs). Instructions in the instruction caches may be copies of instructions in memory 1720 or storage 1730, and the instruction caches may speed up retrieval of those instructions by processor 1710. Data in the data caches may be copies of data in memory 1720 or storage 1730 for instructions executing at processor 1710 to operate on; the results of previous instructions executed at processor 1710 for access by subsequent instructions executing at processor 1710 or for writing to memory 1720 or storage 1730; or other suitable data. The data caches may speed up read or write operations by processor 1710. The TLBs may speed up virtual-address translation for processor 1710. In particular embodiments, processor 1710 may include one or more internal registers for data, instructions, or addresses. Processor 1710 may include any suitable number of any suitable internal registers, where appropriate. Where appropriate, processor 1710 may include one or more arithmetic logic units (ALUs); may be a multi-core processor; or may include one or more processors 1710.

In particular embodiments, memory 1720 may include main memory for storing instructions for processor 1710 to execute or data for processor 1710 to operate on. As an example, computer system 1700 may load instructions from storage 1730 or another source (such as, for example, another computer system 1700) to memory 1720. Processor 1710 may then load the instructions from memory 1720 to an internal register or internal cache. To execute the instructions, processor 1710 may retrieve the instructions from the internal register or internal cache and decode them. During or after execution of the instructions, processor 1710 may write one or more results (which may be intermediate or final results) to the internal register or internal cache. Processor 1710 may then write one or more of those results to memory 1720. One or more memory buses (which may each include an address bus and a data bus) may couple processor 1710 to memory 1720. Bus 1760 may include one or more memory buses. In particular embodiments, one or more memory management units (MMUs) may reside between processor 1710 and memory 1720 and facilitate accesses to memory 1720 requested by processor 1710. In particular embodiments, memory 1720 may include random access memory (RAM). This RAM may be volatile memory, where appropriate. Where appropriate, this RAM may be dynamic RAM (DRAM) or static RAM (SRAM). Memory 1720 may include one or more memories 1720, where appropriate.

In particular embodiments, storage 1730 may include mass storage for data or instructions. As an example, storage 1730 may include a hard disk drive (HDD), a floppy disk drive, flash memory, an optical disc, a magneto-optical disc, magnetic tape, or a Universal Serial Bus (USB) drive or a combination of two or more of these. Storage 1730 may include removable or non-removable (or fixed) media, where appropriate. Storage 1730 may be internal or external to computer system 1700, where appropriate. In particular embodiments, storage 1730 may be non-volatile, solid-state memory. In particular embodiments, storage 1730 may include read-only memory (ROM). Where appropriate, this ROM may be mask ROM (MROM), programmable ROM (PROM), erasable PROM (EPROM), electrically erasable PROM (EEPROM), flash memory, or a combination of two or more of these. Storage 1730 may include one or more storage control units facilitating communication between processor 1710 and storage 1730, where appropriate. Where appropriate, storage 1730 may include one or more storages 1730.

In particular embodiments, I/O interface 1740 may include hardware, software, or both, providing one or more interfaces for communication between computer system 1700 and one or more I/O devices. Computer system 1700 may include one or more of these I/O devices, where appropriate. One or more of these I/O devices may enable communication between a person and computer system 1700. As an example, an I/O device may include a keyboard, keypad, microphone, monitor, mouse, printer, scanner, speaker, camera, stylus, tablet, touch screen, trackball, another suitable I/O device, or any suitable combination of two or more of these. An I/O device may include one or more sensors. Where appropriate, I/O interface 1740 may include one or more device or software drivers enabling processor 1710 to drive one or more of these I/O devices. I/O interface 1740 may include one or more I/O interfaces 1740, where appropriate.

In particular embodiments, communication interface 1750 may include hardware, software, or both providing one or more interfaces for communication (such as, for example, packet-based communication) between computer system 1700 and one or more other computer systems 1700 or one or more networks. As an example, communication interface 1750 may include a network interface controller (NIC) or network adapter for communicating with an Ethernet or other wire-based network or a wireless NIC (WNIC); a wireless adapter for communicating with a wireless network, such as a WI-FI network; or an optical transmitter (e.g., a laser or a light-emitting diode) or an optical receiver (e.g., a photodetector) for communicating using fiber-optic communication or free-space optical communication. Computer system 1700 may communicate with an ad hoc network, a personal area network (PAN), an in-vehicle network (IVN), a local area network (LAN), a wide area network (WAN), a metropolitan area network (MAN), or one or more portions of the Internet or a combination of two or more of these. One or more portions of one or more of these networks may be wired or wireless. As an example, computer system 1700 may communicate with a wireless PAN (WPAN) (such as, for example, a BLUETOOTH WPAN), a WI-FI network, a Worldwide Interoperability for Microwave Access (WiMAX) network, a cellular telephone network (such as, for example, a Global System for Mobile Communications (GSM) network), or other suitable wireless network or a combination of two or more of these. As another example, computer system 1700 may communicate using fiber-optic communication based on 100 Gigabit Ethernet (100 GbE), 10 Gigabit Ethernet (10 GbE), or Synchronous Optical Networking (SONET). Computer system 1700 may include any suitable communication interface 1750 for any of these networks, where appropriate. Communication interface 1750 may include one or more communication interfaces 1750, where appropriate.

In particular embodiments, bus 1760 may include hardware, software, or both coupling components of computer system 1700 to each other. As an example, bus 1760 may include an Accelerated Graphics Port (AGP) or other graphics bus, a controller area network (CAN) bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local bus (VLB), or another suitable bus or a combination of two or more of these. Bus 1760 may include one or more buses 1760, where appropriate.

In particular embodiments, various modules, circuits, systems, methods, or algorithm steps described in connection with the implementations disclosed herein may be implemented as electronic hardware, computer software, or any suitable combination of hardware and software. In particular embodiments, computer software (which may be referred to as software, computer-executable code, computer code, a computer program, computer instructions, or instructions) may be used to perform various functions described or illustrated herein, and computer software may be configured to be executed by or to control the operation of computer system 1700. As an example, computer software may include instructions configured to be executed by processor 1710. In particular embodiments, owing to the interchangeability of hardware and software, the various illustrative logical blocks, modules, circuits, or algorithm steps have been described generally in terms of functionality. Whether such functionality is implemented in hardware, software, or a combination of hardware and software may depend upon the particular application or design constraints imposed on the overall system.

In particular embodiments, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blu-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

The following paragraphs describe various specific embodiments of a diode-pumped solid-state (DPSS) laser:

A diode-pumped solid-state (DPSS) laser comprising: a gain medium configured to absorb pump-laser light and emit light at an emission wavelength; one or more pump laser diodes configured to produce the pump-laser light supplied to the gain medium; a saturable absorber comprising a vanadium-doped crystal configured to absorb at least a portion of the emitted light produced by the gain medium; and a trigger light source configured to supply trigger pulses of light to the saturable absorber, wherein each trigger pulse of light is configured to bleach the saturable absorber to cause the DPSS laser to emit a corresponding pulse of light at the emission wavelength.

The DPSS laser, wherein the trigger light source comprises a laser diode configured to emit light at an absorption wavelength of the saturable absorber.

The DPSS laser, wherein the absorption wavelength is between 1000 nm and 1450 nm.

The DPSS laser, wherein the trigger pulses of light are supplied to the saturable absorber via a side face or an end face of the saturable absorber.

The DPSS laser, wherein the saturable absorber has a relaxation time of less than 100 nanoseconds.

The DPSS laser, wherein, for each trigger pulse of light, bleaching the saturable absorber comprises absorbing, by the vanadium dopants, at least a portion of the trigger pulse of light, wherein greater than 60% of the vanadium dopants are promoted to an excited state so that the saturable absorber is substantially transparent to the emitted light at the emission wavelength.

The DPSS laser, wherein, after the pulse of light is emitted, the saturable absorber is further configured to recover to a substantially unbleached state, wherein greater than 60% of the vanadium dopants relax to a ground state so that the saturable absorber is substantially opaque to the emitted light at the emission wavelength.

The DPSS laser, wherein the emission wavelength is between 1300 nm and 1400 nm.

The DPSS laser, wherein the DPSS laser is configured to emit a plurality of pulses of light at the emission wavelength, wherein each emitted pulse of light is associated with a corresponding bleaching of the saturable absorber by one of the trigger pulses of light.

The DPSS laser, wherein the gain medium comprises a single-crystal fiber.

The DPSS laser, wherein the gain medium comprises a neodymium-doped yttrium aluminum garnet (Nd:YAG) crystal, wherein the emission wavelength is approximately 1319 nm.

The DPSS laser, wherein the gain medium comprises a neodymium-doped yttrium orthovanadate (Nd:YVO$_4$) crystal, wherein the emission wavelength is approximately 1342 nm.

The DPSS laser, wherein: the gain medium comprises neodymium dopants; and each of the pump laser diodes is configured to produce light to optically pump the neodymium dopants at a pump-laser wavelength between 730 nm and 900 nm.

The DPSS laser, wherein the gain medium comprises neodymium-doped yttrium aluminum garnet (Nd:YAG), neodymium-doped yttrium orthovanadate (Nd:YVO$_4$), neodymium-doped gadolinium orthovanadate (Nd:GdVO$_4$), neodymium-doped yttrium aluminum perovskite (Nd:YAP), neodymium-doped lanthanum scandium borate (Nd:LSB), neodymium-doped strontium fluoride phosphate (Nd:Sr$_5$(PO$_4$)$_3$F), or neodymium-doped gadolinium yttrium scandium gallium garnet (Nd:GYSGG).

The DPSS laser, wherein the saturable absorber comprises vanadium-doped yttrium aluminum garnet (V:YAG).

The DPSS laser, wherein each of the pump laser diodes comprises a volume Bragg grating configured to stabilize a wavelength of the pump-laser light produced by the pump laser diode.

The DPSS laser, wherein the DPSS laser is configured to be deactivated during particular periods of time, wherein deactivating the DPSS laser comprises turning off or reducing an amount of optical power produced by the pump laser diodes.

The DPSS laser, wherein the pump laser diodes comprise two or more pump laser diodes configured to produce pump light at two or more different respective wavelengths.

The DPSS laser, further comprising a controller configured to adjust an output power of each of the pump laser diodes in response to a temperature change of the DPSS laser.

The DPSS laser, further comprising a controller configured to adjust an amount of optical power of one or more of the pump laser diodes to reduce an amount of timing jitter of pulses of light produced by the DPSS laser.

The DPSS laser, wherein the pump laser diodes comprise two or more pump laser diodes, wherein the DPSS laser further comprises a beam combiner configured to combine light from the pump laser diodes together to form the pump-laser light supplied to the gain medium.

The DPSS laser, wherein the beam combiner comprises a polarization beam combiner or a dichroic beam combiner.

The DPSS laser, wherein the DPSS laser is configured to emit pulses of light having optical characteristics comprising: a pulse energy between 0.1 µJ and 100 µJ; a pulse repetition frequency between 80 kHz and 10 MHz; and a pulse duration between 0.1 ns and 500 ns.

The DPSS laser, wherein the gain medium and the saturable absorber are separated by an air gap.

The DPSS laser, wherein the saturable absorber is bonded to the gain medium.

The DPSS laser, wherein the gain medium comprises a back surface with a dielectric coating having a low reflectivity at a wavelength of the pump-laser light and a high reflectivity at the emission wavelength.

The DPSS laser, further comprising an end cap coupled to the gain medium, wherein: the end cap is substantially free of gain-material dopants; and the end cap is positioned to receive the pump-laser light so that the pump-laser light propagates through the end cap before entering the gain medium.

The DPSS laser, wherein the DPSS laser is part of a lidar system comprising a scanner, a receiver, and a processor, wherein: the scanner is configured to receive emitted pulses of light from the DPSS laser and scan the emitted pulses of light across a field of regard of the lidar system; the receiver is configured to detect a portion of the emitted pulses of light scattered by a target located a distance from the lidar system; and the processor is configured to determine the distance from the lidar system to the target based at least in part on a round-trip time for an emitted pulse of light to travel from the lidar system to the target and back to the lidar system.

The DPSS laser, wherein the lidar system is part of a vehicle comprising an advanced driver assistance system (ADAS) configured to assist a driver of the vehicle in operating the vehicle, wherein the lidar system is configured to provide information about a surrounding environment of the vehicle to the ADAS.

The DPSS laser, wherein the lidar system is part of an autonomous vehicle comprising an autonomous-vehicle driving system configured to guide the autonomous vehicle through a surrounding environment toward a destination, wherein the lidar system is configured to provide information about the surrounding environment to the autonomous-vehicle driving system.

In particular embodiments, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various embodiments have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A lidar system comprising:
   a light source comprising a diode-pumped solid-state (DPSS) laser configured to emit light comprising pulses of light at one or more wavelengths between 1200 nm and 1400 nm, wherein:
      the DPSS laser comprises a gain medium and one or more pump laser diodes configured to optically pump the gain medium; and
      the DPSS laser is configured to be deactivated during particular periods of time, wherein deactivating the DPSS laser comprises turning off or reducing an amount of optical power produced by the one or more pump laser diodes;
   a scanner configured to scan the emitted light across a scan pattern contained within a field of regard of the lidar system, wherein the scan pattern comprises a plurality of scan lines scanned sequentially;
   a receiver configured to detect a portion of the emitted light scattered by a target located a distance from the lidar system; and
   a processor configured to:
      determine the distance from the lidar system to the target based at least in part on a round-trip time for the portion of the emitted light to travel from the lidar system to the target and back to the lidar system; and
      instruct the DPSS laser to deactivate during a period of time between two successive scan lines.

2. The lidar system of claim 1, wherein the gain medium comprises a neodymium-doped yttrium aluminum garnet (Nd:YAG) crystal configured to produce light at approximately 1319 nm.

3. The lidar system of claim 1, wherein the gain medium comprises a neodymium-doped yttrium orthovanadate (Nd:YVO$_4$) crystal configured to produce light at approximately 1342 nm.

4. The lidar system of claim 1, wherein the DPSS laser is a passively Q-switched laser comprising a saturable absorber.

5. The lidar system of claim 4, wherein the saturable absorber comprises vanadium-doped yttrium aluminum garnet (V:YAG).

6. The lidar system of claim 4, wherein the DPSS laser further comprises a trigger light source configured to supply trigger pulses of light to the saturable absorber, wherein each trigger pulse of light is configured to bleach the saturable absorber to cause the DPSS laser to emit one of the pulses of light produced by the DPSS laser.

7. The lidar system of claim 6, wherein the trigger light source comprises a laser diode configured to emit light at an absorption wavelength of the saturable absorber.

8. The lidar system of claim 1, wherein each of the pump laser diodes is configured to produce light to optically pump the gain medium at a pump-laser wavelength between 730 nm and 900 nm.

9. The lidar system of claim 1, wherein each of the pump laser diodes comprises a volume Bragg grating configured to stabilize a wavelength of pump-laser light produced by the pump laser diode.

10. The lidar system of claim 1, wherein the pump laser diodes comprise two or more pump laser diodes configured to produce pump light at two or more different respective wavelengths.

11. The lidar system of claim 10, wherein the processor is further configured to adjust the amount of optical power produced by each of the pump laser diodes in response to a temperature change of the DPSS laser.

12. The lidar system of claim 1, wherein the processor is further configured to adjust the amount of optical power produced by the one or more of the pump laser diodes to reduce an amount of timing jitter of the pulses of light produced by the DPSS laser.

13. The lidar system of claim 1, wherein the lidar system is part of a vehicle comprising an advanced driver assistance system (ADAS) configured to assist a driver of the vehicle in operating the vehicle, wherein the lidar system is configured to provide information about a surrounding environment of the vehicle to the ADAS.

14. The lidar system of claim 1, wherein the lidar system is part of an autonomous vehicle comprising an autonomous-vehicle driving system configured to guide the autonomous vehicle through a surrounding environment toward a destination, wherein the lidar system is configured to provide information about the surrounding environment to the autonomous-vehicle driving system.

15. The lidar system of claim 1, wherein:
the lidar system is a pulsed lidar system; and
the round-trip time corresponds to a time for one of the pulses of light to travel to the target and back to the lidar system.

16. The lidar system of claim 1, wherein:
the emitted light has a wavelength between 1310 nm and 1400 nm; and
the emitted light has an average power of less than 500 milliwatts, the average power being measured through an aperture having a particular diameter and being located a particular distance from the lidar system.

17. The lidar system of claim 1, wherein the lidar system is configured to operate in an eye-safe manner based at least in part on an amount of average power of the emitted light that is scanned across the field of regard, the average power being measured through an aperture having a particular diameter and being located a particular distance from the lidar system.

18. The lidar system of claim 1, wherein the emitted light comprises optical pulses having optical characteristics comprising:
a pulse energy between 0.1 µJ and 100 µJ;
a pulse repetition frequency between 80 kHz and 10 MHz; and
a pulse duration between 0.1 ns and 500 ns.

19. The lidar system of claim 1, further comprising an optical filter having an optical bandpass corresponding to a wavelength of the emitted light, wherein the optical filter is configured to transmit light at the wavelength of the emitted light and block light at one or more wavelengths outside of the optical bandpass.

20. The lidar system of claim 1, wherein the scanner comprises one or more scan mirrors, wherein each scan mirror is mechanically driven by a galvanometer scanner, a synchronous electric motor, a microelectromechanical systems (MEMS) device, a resonant scanner, or a voice coil motor.

21. The lidar system of claim 1, wherein the scanner comprises:
a first mirror configured to scan the emitted light along a first direction; and
a polygon mirror configured to scan the emitted light along a second direction substantially orthogonal to the first direction.

22. The lidar system of claim 1, wherein:
scanning the emitted light across the field of regard comprises scanning a field of view of the light source across the field of regard; and
the scanner is further configured to scan a field of view of the receiver across the field of regard, wherein the light-source field of view and the receiver field of view are scanned synchronously with respect to one another, wherein a scanning speed of the light-source field of view and a scanning speed of the receiver field of view are approximately equal.

23. The lidar system of claim 4, wherein the saturable absorber has a relaxation time of less than 100 nanoseconds.

24. The lidar system of claim 4, wherein the saturable absorber is bonded to the gain medium.

25. The lidar system of claim 6, wherein the trigger pulses of light are supplied to the saturable absorber via a side face or an end face of the saturable absorber.

26. The lidar system of claim 7, wherein the absorption wavelength is between 1000 nm and 1450 nm.

27. The lidar system of claim 1, wherein the gain medium comprises a single-crystal fiber.

28. The lidar system of claim 1, wherein:
the gain medium comprises neodymium dopants; and
each of the pump laser diodes is configured to produce light to optically pump the neodymium dopants at a pump-laser wavelength between 730 nm and 900 nm.

29. The lidar system of claim 1, wherein the gain medium comprises neodymium-doped yttrium aluminum garnet (Nd:YAG), neodymium-doped yttrium orthovanadate (Nd:YVO$_4$), neodymium-doped gadolinium orthovanadate (Nd:GdVO$_4$), neodymium-doped yttrium aluminum perovskite (Nd:YAP), neodymium-doped lanthanum scandium borate (Nd:LSB), neodymium-doped strontium fluoride phosphate (Nd:Sr$_5$(PO$_4$)$_3$F), or neodymium-doped gadolinium yttrium scandium gallium garnet (Nd:GYSGG).

30. The lidar system of claim 1, wherein the gain medium comprises a back surface with a dielectric coating having a low reflectivity at a pump-laser wavelength and a high reflectivity at a wavelength of the emitted light.

31. The lidar system of claim 1, wherein the pump laser diodes comprise two or more pump laser diodes, wherein the DPSS laser further comprises a beam combiner configured to combine light from the pump laser diodes together to form a pump-laser beam that is supplied to the gain medium.

32. The lidar system of claim 1, wherein the DPSS laser further comprises an end cap coupled to the gain medium, wherein:
- the end cap is substantially free of gain-material dopants; and
- the end cap is positioned to receive the pump-laser light so that the pump-laser light propagates through the end cap before entering the gain medium.

\* \* \* \* \*